(12) United States Patent
Muro et al.

(10) Patent No.: US 9,442,231 B2
(45) Date of Patent: Sep. 13, 2016

(54) COLORED COMPOSITION, CURED FILM, COLOR FILTER, METHOD FOR PRODUCING COLOR FILTER, SOLID-STATE IMAGE SENSOR, AND IMAGE DISPLAY DEVICE

(71) Applicant: FUJIFILM Corporation, Tokyo (JP)

(72) Inventors: Naotsugu Muro, Haibara-gun (JP); Kazuya Oota, Haibara-gun (JP); Yoshinori Taguchi, Haibara-gun (JP); Tetsuya Watanabe, Haibara-gun (JP); Yuushi Kaneko, Haibara-gun (JP); Junichi Ito, Haibara-gun (JP); Suguru Samejima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/009,919

(22) Filed: Jan. 29, 2016

(65) Prior Publication Data
US 2016/0146986 A1 May 26, 2016

Related U.S. Application Data

(63) Continuation of application No. PCT/JP2014/070011, filed on Jul. 30, 2014.

(30) Foreign Application Priority Data

Aug. 1, 2013 (JP) ................................ 2013-160686

(51) Int. Cl.
| | |
|---|---|
| *G02B 5/20* | (2006.01) |
| *G03F 7/031* | (2006.01) |
| *G03F 7/00* | (2006.01) |
| *G03F 7/16* | (2006.01) |
| *G03F 7/20* | (2006.01) |
| *G03F 7/32* | (2006.01) |
| *G03F 7/36* | (2006.01) |
| *G02B 5/22* | (2006.01) |

(52) U.S. Cl.
CPC ............ *G02B 5/201* (2013.01); *G02B 5/223* (2013.01); *G03F 7/0007* (2013.01); *G03F 7/031* (2013.01); *G03F 7/16* (2013.01); *G03F 7/20* (2013.01); *G03F 7/32* (2013.01); *G03F 7/36* (2013.01)

(58) Field of Classification Search
CPC ........ G03F 7/0007; G03F 7/031; G03F 7/16; G03F 7/20; G03F 7/32; G03F 7/36; G02B 5/201; G02B 5/223
USPC ....................................... 430/7, 270.1, 281.1
See application file for complete search history.

(56) References Cited

U.S. PATENT DOCUMENTS

| | | | | |
|---|---|---|---|---|
| 2014/0154616 A1* | 6/2014 | Nagata | ................. | C09D 143/04 430/7 |
| 2014/0176653 A1* | 6/2014 | Fujie | .................... | C09D 11/328 347/100 |
| 2015/0322265 A1* | 11/2015 | Park | ........................ | C09B 11/24 252/586 |

FOREIGN PATENT DOCUMENTS

| | | |
|---|---|---|
| JP | 2008-268242 A | 11/2008 |
| JP | 2012-032754 A | 2/2012 |

OTHER PUBLICATIONS

International Search Report for PCT/JP2014/070011 dated Sep. 2, 2014 [PCT/ISA/210].
Written Opinion for PCT/JP2014/070011 dated Sep. 2, 2014 [PCT/ISA/237].
International Preliminary Report on Patentability issued from the International Bureau in counterpart International Application No. PCT/JP2014/070011, mailed Feb. 11, 2016.

* cited by examiner

*Primary Examiner* — John A McPherson
(74) *Attorney, Agent, or Firm* — Sughrue Mion, PLLC

(57) ABSTRACT

Provided are a colored composition which can maintain good light fastness even when placed under an environment having a low oxygen concentration for a long period of time, a cured film, a color filter, a method for producing a color filter, a solid-state image sensor, and an image display device.
The colored composition includes a dye multimer (A) and a solvent (B), in which the dye multimer (A) has a partial structure derived from a xanthene dye having a cationic moiety, and also has an anionic moiety, and the content of water in the colored composition is 0.01% by mass to 3.0% by mass.

14 Claims, No Drawings

COLORED COMPOSITION, CURED FILM, COLOR FILTER, METHOD FOR PRODUCING COLOR FILTER, SOLID-STATE IMAGE SENSOR, AND IMAGE DISPLAY DEVICE

CROSS-REFERENCE TO RELATED APPLICATIONS

This application is a Continuation of PCT International Application No. PCT/JP2014/070011 filed on Jul. 30, 2014, which claims priority under 35 U.S.C §119(a) to Japanese Patent Application No. 2013-160686 filed on Aug. 1, 2013. Each of the above application(s) is hereby expressly incorporated by reference, in its entirety, into the present application.

BACKGROUND OF THE INVENTION

1. Field of the Invention

The present invention relates to a colored composition and a cured film using the same. It further relates to a color filter having a cured film, a method for producing a color filter, and a solid-state image sensor and an image display device, each of which has a color filter.

2. Description of the Related Art

As one of the methods for producing a color filter which is used for a liquid crystal display device, a solid-state image sensor, or the like, there is a pigment dispersion method. As the pigment dispersion method, there is a method for producing a color filter by photolithography by using a colored photosensitive composition which is obtained by dispersing pigments in various photosensitive compositions. That is, a colored composition is applied onto a substrate by using a spin coater, a roll coater, or the like, the substrate is dried to form a coating film, and the coating film is developed by pattern exposure, thereby obtaining colored pixels. This operation is repeated for the number of the desired hues to manufacture a color filter.

The method is stable with respect to light or heat due to a use of pigments, and positional accuracy is sufficiently secured since patterning is performed by photolithography. Accordingly, the method has been widely used as a method suitable for producing a color filter for color display or the like.

JP2008-268242A discloses that a colored photosensitive composition including a dye or a pigment is used to manufacture a color filter. JP2012-32754A discloses that developability is improved by using a dye multimer including a xanthene skeleton as a partial structure of a dye moiety. JP2012-32754A further discloses a combination of a cationic moiety and an anionic moiety in a dye multimer.

SUMMARY OF THE INVENTION

Herein, it could be seen that in the case of manufacturing a color filter using a dye multimer having a partial structure derived from a xanthene dye having a cationic moiety and also having an anionic moiety, there is tendency that light fastness deteriorates when placed under an environment having a low oxygen concentration for a long period of time.

The present invention has been made in order to solve the aforementioned problems, and has an object to provide a colored composition which can maintain good light fastness even when placed under an environment having a low oxygen concentration for a long period of time.

The present inventors have found out that the problems can be solved by adjusting the content of water in a composition including a dye multimer having a partial structure derived from a xanthene dye having a cationic moiety and also having an anionic moiety to a specific range.

Specifically, the problems were solved by the following means <1>, and preferably <2> to <13>.

<1> A colored composition including a dye multimer (A) and a solvent (B), in which the dye multimer (A) has a partial structure derived from a xanthene dye having a cationic moiety and also has an anionic moiety, and the content of water in the colored composition is 0.01% by mass to 3.0% by mass.

<2> The colored composition as described in <1>, in which the concentration of toluene in the colored composition is 0.01 ppm to 13 ppm.

<3> The colored composition as described in <1> or <2>, in which at least one of the concentration of the sodium ion and the concentration of the potassium ion in the colored composition is 0.001 ppm to 11 ppm.

<4> The colored composition as described in any one of <1> to <3>, in which the anionic moiety is a weakly nucleophilic anionic moiety.

<5> The colored composition as described in any one of <1> to <4>, further including a phthalocyanine pigment.

<6> The colored composition as described in any one of <1> to <5>, further including a photopolymerization initiator.

<7> The colored composition as described in any one of <1> to <6>, further including a curable compound.

<8> The colored composition as described in any one of <1> to <7>, which is used for forming a colored layer of a color filter.

<9> A cured film formed by curing the colored composition as described in any one of <1> to <8>.

<10> A method for producing a color filter, including a step of applying the colored composition as described in any one of <1> to <8> onto a support to form a colored composition layer, a step of patternwise exposing the colored composition layer, and a step of removing an unexposed area by development to form a colored pattern.

<11> A method for producing a color filter, including a step of applying the colored composition as described in any one of <1> to <8> onto a support to form a colored composition layer, followed by curing, to form a colored layer, a step of forming a photoresist layer on the colored layer, a step of patterning the photoresist layer by exposure and development to obtain a resist pattern, and a step of dry-etching the colored layer using the resist pattern as an etching mask.

<12> A color filter having the cured film as described in <9> or a color filter produced by the method for producing a color filter as described in <10> or <11>.

<13> A solid-state image sensor or an image display device including the color filter as described in <12>.

According to the present invention, it became possible to provide a colored composition which can maintain good light fastness even when placed under an environment having a low oxygen concentration for a long period of time.

DESCRIPTION OF THE PREFERRED EMBODIMENTS

The explanation of constituents in the present invention described below will be based on typical embodiments of the present invention, but the present invention is not limited to such embodiments.

In citations for a group (atomic group) in the present specification, when the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp and the like, far ultraviolet rays represented by an excimer laser, extreme ultraviolet rays (EUV rays), X-rays, electron beams, or the like. In addition, in the present invention, light means actinic rays or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

In the present specification, a numeral value range represented by "(a value) to (a value)" means a range including the numeral values represented before and after "(a value) to (a value)" as a lower limit value and an upper limit value, respectively.

In the present specification, the total solid content refers to a total mass of the components remaining when a solvent is excluded from the entire composition of a composition.

Furthermore, in the present specification, "(meth)acrylate" represents either or both of an acrylate and a methacrylate, "(meth)acryl" represents either or both of an acryl and a methacryl, and "(meth)acryloyl" represents either or both of an acryloyl and a methacryloyl.

In addition, in the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, in formulae, Me represents a methyl group, Et represents an ethyl group, Pr represents a propyl group, Bu represents a butyl group, and Ph represents a phenyl group.

In the present specification, a term "step" includes not only an independent step, but also steps which are not clearly distinguished from other steps if an intended action of the steps is obtained.

<Colored Composition>

The colored composition of the present invention (hereinafter also referred to as the composition of the present invention) is a colored composition including a dye multimer (A) and a solvent (B), in which the dye multimer (A) has a partial structure derived from a xanthene dye having a cationic moiety (hereinafter referred to as a "dye structure" in some cases), and also has an anionic moiety, and the content of water in the composition of the present invention is 0.01% by mass to 3.0% by mass.

The mechanism thereof is, although it is based on presumption, that it is possible to further inhibit the separation of the cationic moiety and the anionic moiety by setting the content of water of the composition to 3.0% by mass or less. For a film formed in the state where the cationic moiety and the anionic moiety are not separated, a photoexcited dye radical is easily captured (trapped) by oxygen under a low oxygen concentration, and thus, it becomes more difficult for a dye to be degraded.

Furthermore, since the distance between the cationic moiety and the anionic moiety is not too short by setting the content of water of the composition to 0.01% by mass or more, the energy transfer or the electron transfer during photoexcitation hardly occurs, and thus, it becomes more difficult for a dye to be degraded. As a result, the composition of the present invention can maintain good light fastness even when placed under an environment having a low oxygen concentration for a long period of time. In particular, even in the case of irradiating the composition intermittently for 2 months or longer with an illumination of 1,000 lux under a low oxygen concentration, good light fastness can be maintained.

In particular, the content of water is preferably 0.5% by mass to 2.0% by mass, more preferably 1.0% by mass to 2.0% by mass, and still more preferably 1.3% by mass to 1.7% by mass. By adjusting the content of water to these ranges, the effects of the present invention can be more effectively accomplished.

For the composition of the present invention, the concentration of toluene in the composition is preferably 1 ppm to 13 ppm, more preferably 5 ppm to 10 ppm, and still more preferably 6 ppm to 8 ppm. By adjusting the concentration of toluene within these ranges, in the case where the colored pattern formed by using the composition of the present invention is placed for an extended long period of time, the line width of the pattern can be more effectively made uniform. Being placed for an extended long period of time refers to a state where when a colored pattern is formed, a film is formed using the composition, and then the film is placed for a long period of time until the film is exposed to with i-rays.

By setting the concentration of toluene to 13 ppm or less, it is possible for toluene to effectively inhibit hydrophobic components (for example, a curable compound) in the composition from being aggregated to a degree more than necessary. As a result, phase separation does not occur even when placed for an extended long period of time, and thus, a more uniform line width of the pattern can be maintained. For example, even in the case where the time for the composition to be placed is set to 3 days or more and 2.0% by mass of tetramethylammonium hydroxide is used as a developing liquid after exposure, a more uniform line width of the pattern can be maintained.

Moreover, by setting the concentration of toluene to 1 ppm or more, the compatibility between the cationic moiety in the dye structure and the hydrophobic components in the composition can be further improved, and thus, phase separation does not occur even when placed for an extended long period of time, and thus, a more uniform line width of the pattern can be maintained.

For the composition of the present invention, at least one of the concentration of the sodium ion and the concentration of the potassium ion in the composition preferably satisfies a range from 0.001 ppm to 11 ppm, more preferably satisfies a range from 1 ppm to 11 ppm, still more preferably satisfies a range from 4 ppm to 9 ppm, and particularly preferably satisfies a range from 5 ppm to 8 ppm.

By setting the concentration of the sodium ion and the concentration of the potassium ion to 11 ppm or less, the ion exchange reaction of the cation in the dye multimer with at least one of the sodium ion and the potassium ion in the composition is inhibited, and thus, the compatibility between the dye structure and the other components (for example, resins, monomers, and solvents) in the composition can be improved, whereby it is possible to effectively inhibit phase separation in the composition. As a result, even when a film is formed with the composition placed under a low temperature environment (for example, a refrigerated storage condition), it is possible to make it difficult for impurities to be generated.

Moreover, by setting the concentration of the sodium ion and the concentration of the potassium ion to 0.001 ppm or more, the compatibility between the dye structure and the other components can be inhibited from being extremely increased, and as a result, generation of impurities can be more effectively inhibited.

For the composition of the present invention, from the viewpoint of long-term thermal cycling performance, the voltage holding ration of a solid content is preferably 60% to 99%, and more preferably 80% to 99%.

Furthermore, in the present invention, by adopting the above-described configurations, it is possible to obtain a colored composition having a small change rate in viscosity after the elapse of a long period of time. For example, even when a low temperature (5° C. or lower) and a normal temperature (for example, 25° C.) are repeated for predetermined time, and 3 months or longer have elapsed, the change rate in viscosity can be reduced.

Furthermore, in the present invention, in the case where the film is placed under an environment of varying temperatures (for example, −30° C. to 150° C.) and/or a high humidity (for example, a relative humidity of 80% or more) for a long period of time, it is possible to obtain a colored composition having a small incidence of impurities. For example, in the case where the film is placed under an environment of 23° C. or an environment of 60° C. and a humidity of 95% for 1 month or longer, the incidence of impurities can be reduced.

The composition of the present invention is preferably used for forming a colored layer of a color filter. The colored composition of the present invention preferably includes a curable compound and a pigment. Examples of the curable compound include a polymerizable compound and an alkali-soluble resin (including an alkali-soluble resin containing a polymerizable group), and is appropriately selected according to applications or production methods thereof. Further, the colored composition of the present invention preferably includes a photopolymerization initiator.

For example, in the case of forming a colored layer by a photoresist, the colored composition of the present invention preferably includes a dye multimer, a solvent, an alkali-soluble resin as a curable compound, a pigment, and a photopolymerization initiator. The colored composition may further include components such as a surfactant.

In addition, in the case of forming a colored layer by dry etching, the colored composition preferably includes a dye multimer, a solvent, a polymerizable compound as a curable compound, a pigment, and a photopolymerization initiator. The colored composition may further include components such as a surfactant.

<<Dye Multimer (A)>>

The dye multimer includes a structure of a dimer, a trimer, a polymer, or the like. The dye multimer functions as, for example, a coloring agent in the colored composition of the present invention.

The dye multimer has a partial structure derived from a xanthene dye having a cationic moiety, and also has an anionic moiety. Preferred embodiments of the dye multimer include the following ones.

(A1) A dye multimer which includes a repeating unit having a partial structure derived from a xanthene dye having a cationic moiety, and also having a counter anionic moiety.

(A2) A dye multimer which includes a repeating unit having a partial structure derived from a xanthene dye having a cationic moiety, in which the dye structure further has an anionic moiety.

(A3) A dye multimer including a repeating unit having a monomer having a partial structure derived from a xanthene dye having a cationic moiety, and a counter anionic moiety.

(A4) The dye multimer further having other cationic and anionic moieties.

Hereinafter, the respective embodiments will be described in detail.

<<<Configuration of (A1)>>>

<<<<Counter Anionic Moiety>>>>

The counter anionic moiety contained in the dye multimer (A) is preferably non-nucleophilic. The non-nucleophilicity means a property of not conducting a nucleophilic attack toward a dye by heating.

The counter anion may be an organic anion or an inorganic anion, and is preferably an organic anion. Examples of the anion include the anions described in paragraph No. "0075" of JP2007-310315A, the contents of which are incorporated herein.

Preferred examples of the anion include a bis(sulfonyl)imide anion, a tris(sulfonyl)methide anion, a tetraarylborate anion, $B^-(CN)_{n1}(OR^a)_{4-n1}$ (in which $R^a$ represents an alkyl group having 1 to 10 carbon atoms or an aryl group having 6 to 10 carbon atoms, and n1 represents 1 to 4), and $PF_{n2}R^P{}_{(6-n2)}{}^-$ (in which $R^P$ represents a fluorinated alkyl group having 1 to 10 carbon atoms, and n2 represents an integer of 1 to 6), and the anion is more preferably one selected from a bis(sulfonyl)imide anion, a tris(sulfonyl)methide anion, and a tetraarylborate anion, and still preferably a bis(sulfonyl)imide anion. By using such a counter anion, the effects of the present invention tend to be more effectively exerted.

As the bis(sulfonyl)imide anion, a structure represented by the following General Formula (AN-1) is preferable.

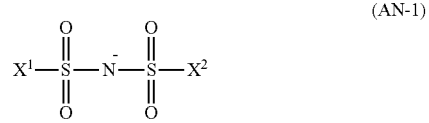

(AN-1)

(In Formula (AN-1), $X^1$ and $X^2$ each independently represent a fluorine atom or a fluorine atom-containing alkyl group having 1 to 10 carbon atoms. $X^1$ and $X^2$ may be bonded to each other to form a ring.)

$X^1$ and $X^2$ each independently represent a fluorine atom or a fluorine atom-containing alkyl group having 1 to 10 carbon atoms, among which a fluorine atom or a fluorine atom-containing alkyl group having 1 to 10 carbon atoms is preferable, a perfluoroalkyl group having 1 to 10 carbon atoms is more preferable, a perfluoroalkyl group having 1 to 4 carbon atoms is still more preferable, and a trifluoromethyl group is particularly preferable.

As the tris(sulfonyl)methide anion, a structure of the following General Formula (AN-2) is preferable.

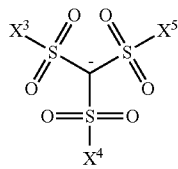
(AN-2)

(In Formula (AN-2), $X^3$, $X^4$, and $X^5$ each independently represent a fluorine atom or a fluorine atom-containing alkyl group having 1 to 10 carbon atoms.)

$X^3$, $X^4$, and $X^5$ each independently have the same definitions as $X^1$ and $X^2$, and the preferred ranges thereof are also the same.

As the tetraarylborate anion, a compound represented by the following General Formula (AN-5) is preferable.

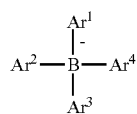
(AN-5)

(In Formula (AN-5), $Ar^1$, $Ar^2$, $Ar^3$, and $Ar^4$ each independently represent an aryl group.)

$Ar^1$, $Ar^2$, $Ar^3$, and $Ar^4$ are each independently preferably an aryl group having 6 to 20 carbon atoms, more preferably an aryl group having 6 to 14 carbon atoms, and still more preferably an aryl group having 6 to 10 carbon atoms.

The aryl group represented by $Ar^1$, $Ar^2$, $Ar^3$, and $Ar^4$ may have a substituent. In the case where the aryl group has a substituent, examples of the substituent include a halogen atom, an alkyl group, an aryl group, an alkoxy group, a carbonyl group, a carbonyloxy group, a carbamoyl group, a sulfo group, a sulfonamide group, and a nitro group, among which a halogen atom and an alkyl group are preferable, a fluorine atom and an alkyl group are more preferable, a fluorine atom, and a perfluoroalkyl group having 1 to 4 carbon atoms is still more preferable.

$Ar^1$, $Ar^2$, $Ar^3$, and $Ar^4$ are each independently more preferably a phenyl group having a halogen atom and/or a halogen atom-containing alkyl group, and still more preferably a phenyl group having a fluorine atom and/or a fluorine-containing alkyl group.

The counter anionic moiety is preferably —$B(CN)_{n1}(OR^a)_{4-n1}$ (in which $R^a$ represents an alkyl group having 1 to 10 carbon atoms or an aryl group having 6 to 10 carbon atoms, and n1 represents an integer of 1 to 4). $R^a$ as alkyl group having 1 to 10 carbon atoms is preferably an alkyl group having 1 to 6 carbon atoms, and more preferably an alkyl group having 1 to 4 carbon atoms. $R^a$ as aryl group having 6 to 10 carbon atoms is preferably a phenyl group and a naphthyl group.

n1 is preferably 1 to 3, and more preferably 1 or 2.

Further, the counter anionic moiety is preferably —$PF_6R^P_{(6-n2)}$⁻ (in which $R^P$ represents a fluorinated alkyl group having 1 to 10 carbon atoms, and n2 represents an integer of 1 to 6). $R^P$ is preferably a fluorine atom-containing alkyl group having 1 to 6 carbon atoms, more preferably a fluorine-containing alkyl group having 1 to 4 carbon atoms, and still more preferably a perfluoroalkyl group having 1 to 3 carbon atoms.

n2 is preferably an integer of 1 to 4, and more preferably 1 or 2.

The mass per molecule of the counter anionic moiety is preferably 100 to 1,000, and more preferably 200 to 500.

The dye multimer may include one kind or two or more kinds of counter anionic moiety.

Specific examples of the counter anionic moiety are shown below, but the present invention is not limited thereto.

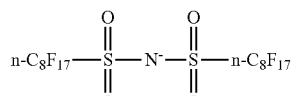
(IM-6)

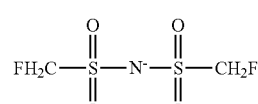
(IM-7)

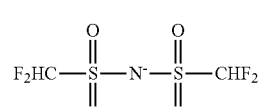
(IM-8)

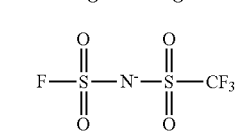
(IM-9)

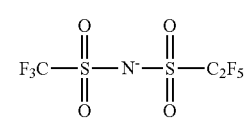
(IM-10)

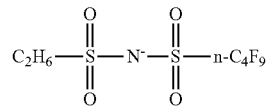
(IM-11)

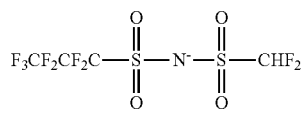
(IM-12)

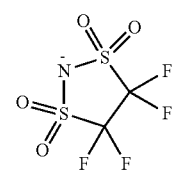
(IM-14)

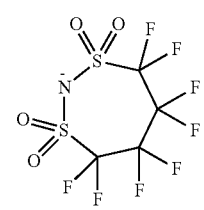
(IM-15)

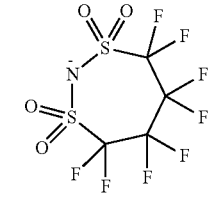
(MD-2)

-continued
(MD-3)
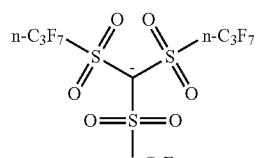
(MD-4)
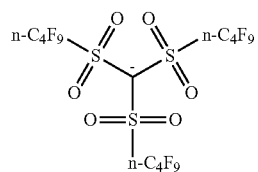
(MD-5)
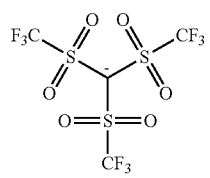
(MD-6)
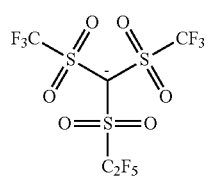
(MD-7)
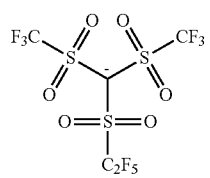
(MD-8)
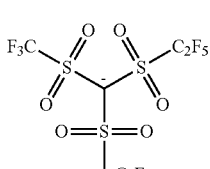
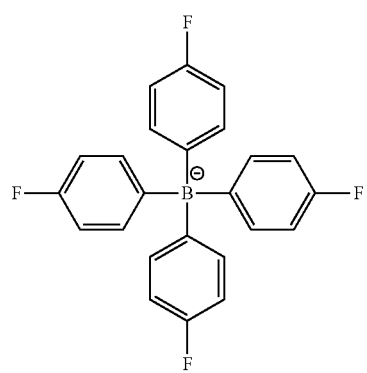
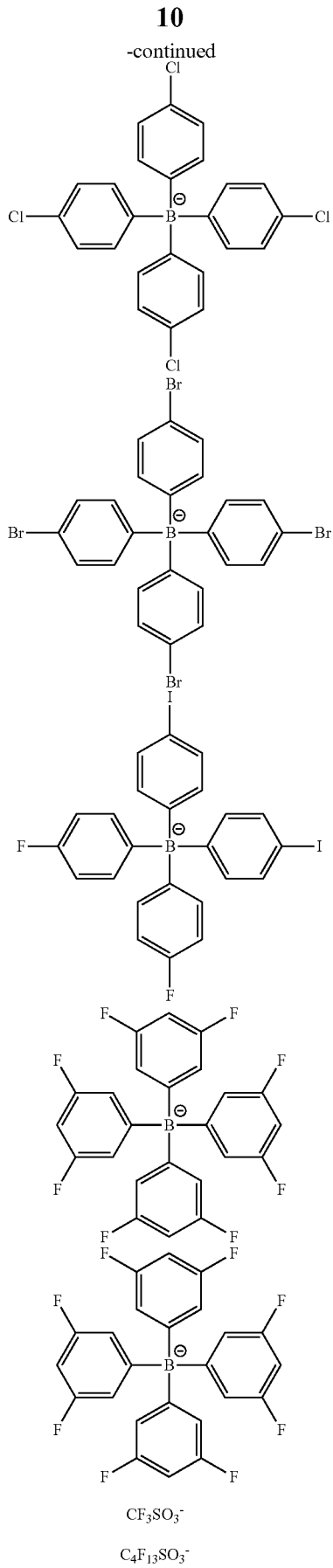
$CF_3SO_3^-$ (a-1)
$C_4F_{13}SO_3^-$ (a-2)

(a-3) C₈F₁₇SO₃⁻
(a-4)
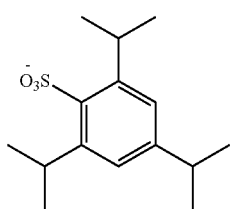
(a-5)
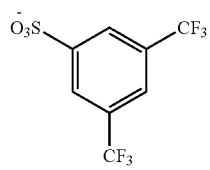
(a-6)
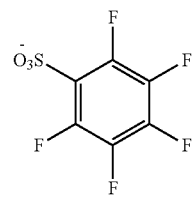
(a-7)
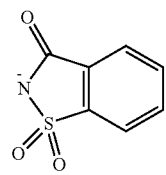
(a-8)
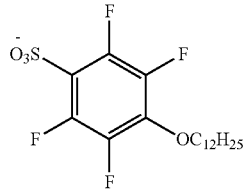
(a-9)
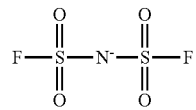
(a-10)
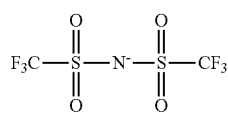
(a-11)
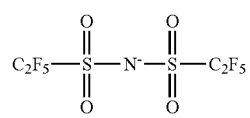
(a-12)
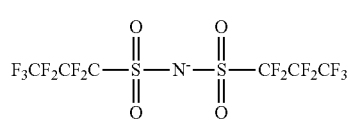
(a-13)
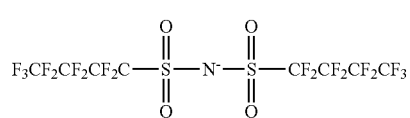
(a-14)
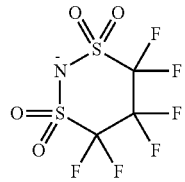
(a-15)
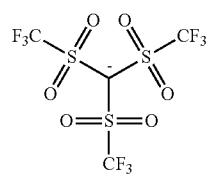
(a-16)
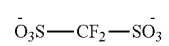
(a-17)
(a-18)
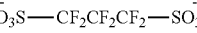
(a-19)
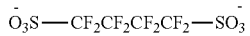
(a-20)
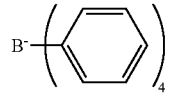
(a-21)
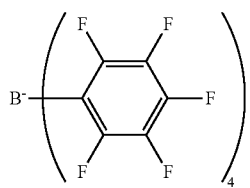
(a-22)
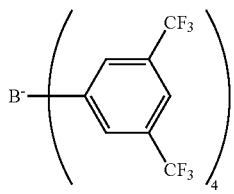
(a-23)
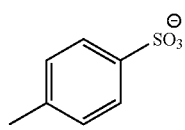
(a-24)
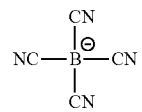
(a-25)
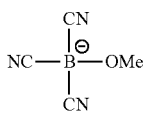

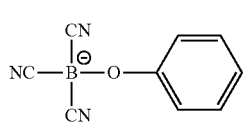
(a-27)

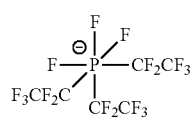
(a-28)

<<<<Dye Structure>>>>

The dye structure in the present invention is a partial structure derived from a xanthene dye having a cationic moiety, and refers to a structure which is formed when hydrogen atoms are removed from a specific dye (hereinafter also referred to as a "dye compound") which can form a dye structure, and can be linked to a dye multimer linking portion (a polymer chain, a core of dendrimer, and the like). Details thereof will be described below.

The dye structure is not particularly limited as long as it is a structure derived from a xanthene dye having a cationic moiety, and various structures having known dye structures can be applied.

Examples of the dye multimer (A) include those having a partial structure derived from a xanthene compound represented by the following General Formula (J) as a partial structure of a dye moiety.

General Formula (J)

[Structure with $R^{82}$, $R^{84}$, $R^{81}$, $R^{83}$, $X^-$, $(R^{85})_m$]

(In General Formula (J), $R^{81}$, $R^{82}$, $R^{83}$, and $R^{84}$ each independently represent a hydrogen atom or a monovalent substituent. $R^{85}$'s each independently represent a monovalent substituent, and m represents an integer of 0 to 5. $X^-$ represents a counter anionic moiety.)

The substituents which may be contained in $R^{81}$ to $R^{84}$ and $R^{85}$ in General Formula (J) have the same definitions as the substituents exemplified in the section of the substituent group A which will be described later.

In General Formula (J), $R^{81}$ and $R^{82}$, $R^{83}$ and $R^{84}$, and $R^{85}$'s in a case where m is 2 or more may be each independently bonded to each other to form a 5-, 6-, or 7-membered saturated ring or a 5-, 6-, or 7-membered unsaturated ring. In the case where the formed 5-, 6-, or 7-membered ring is a group which can be further substituted, the ring may be substituted with the substituents described for $R^{81}$ to $R^{85}$. In the case where the ring is substituted with two or more substituents, these substituents may be the same as or different from each other.

In General Formula (J), in the case where $R^{81}$ and $R^{82}$, $R^{83}$ and $R^{84}$, and $R^{85}$'s in a case where m is 2 or more are bonded to each other to form 5-, 6-, and 7-membered saturated rings not having a substituent or form 5-, 6-, and 7-membered unsaturated rings, examples of the 5-, 6-, and 7-membered saturated rings not having a substituent or the 5-, 6-, and 7-membered unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

It is particularly preferable that $R^{82}$ and $R^{83}$ are each a hydrogen atom or a substituted or unsubstituted alkyl group, and $R^{81}$ and $R^{84}$ are each a substituted or unsubstituted alkyl group or phenyl group. Further, $R^{85}$ is preferably a halogen atom, a linear or branched alkyl group having 1 to 5 carbon atoms, a sulfo group, a sulfonamide group, a carboxyl group, or an amide group, and more preferably a sulfo group, a sulfonamide group, a carboxyl group, or an amide group. $R^{85}$ is preferably bonded to an adjacent portion of carbon linked to a xanthene ring. The substituent contained in the phenyl group represented by $R^{81}$ and $R^{84}$ is particularly preferably a hydrogen atom, a halogen atom, a linear or branched alkyl group having 1 to 5 carbon atoms, a sulfo group, a sulfonamide group, or a carboxyl group.

The compounds having xanthene skeletons represented by General Formula (J) may be synthesized using methods disclosed in the document. Specifically, the methods disclosed in Tetrahedron Letters, 2003, vol. 44, No. 23, pp. 4355 to 4360; Tetrahedron, 2005, vol. 61, No. 12, pp. 3097 to 3106; and the like can be applied.

Specific examples of the xanthene compounds are shown below, but the present invention is not limited thereto.

TABLE 1

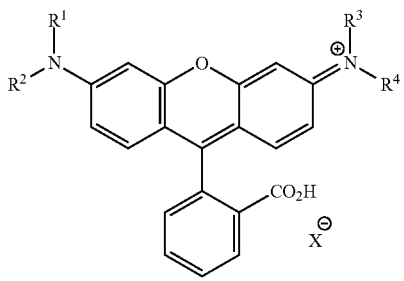

| No. | $R^1$ | $R^2$ | $R^3$ | $R^4$ |
|---|---|---|---|---|
| (XT-1) | —Me | —Me | —Me | —Me |
| (XT-2) | —Et | —Et | —Et | —Et |

TABLE 1-continued

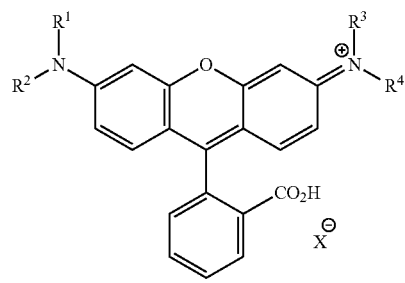

| No. | R¹ | R² | R³ | R⁴ |
|---|---|---|---|---|
| (XT-3) | -n-Pr | -n-Pr | -n-Pr | -n-Pr |
| (XT-4) | -i-Pr | -i-Pr | -i-Pr | -i-Pr |
| (XT-5) | -n-Bu | -n-Bu | -n-Bu | -n-Bu |
| (XT-6) | -sec-Bu | -sec-Bu | -sec-Bu | -sec-Bu |
| (XT-7) | -i-Bu | -i-Bu | -i-Bu | -i-Bu |
| (XT-8) | -tert-Bu | -tert-Bu | -tert-Bu | -tert-Bu |
| (XT-9) | -n-$C_6H_{13}$ | -n-$C_6H_{13}$ | -n-$C_6H_{13}$ | -n-$C_6H_{13}$ |
| (XT-10) | -n-$C_{18}H_{37}$ | -n-$C_{18}H_{37}$ | -n-$C_{18}H_{37}$ | -n-$C_{18}H_{37}$ |
| (XT-11) | —Me | —Et | —Me | —Et |
| (XT-12) | —$CH_2CH_2OCH_2CH_2$— | | —$CH_2CH_2OCH_2CH_2$— | |
| (XT-13) | —$(CH_2)_5$— | | —$(CH_2)_5$— | |
| (XT-14) | —$(CH_2)_4$— | | —$(CH_2)_4$— | |
| (XT-15) | —$(CH_2)_5$— | | —$(CH_2)_4$— | |
| (XT-16) | —$CH_2$Ph | —$CH_2$Ph | —$CH_2$Ph | —$CH_2$Ph |
| (XT-17) | —Et | —$CH_2CH_2$OMe | —Et | —$CH_2CH_2$OMe |
| (XT-18) | —Me | -cyclo-$C_6H_{11}$ | —Me | -cyclo-$C_6H_{11}$ |
| (XT-19) | —$CH_2C\equiv CH$ | —$CH_2C\equiv CH$ | —$CH_2C\equiv CH$ | —$CH_2C\equiv CH$ |
| (XT-20) | —$CH_2CH=CH_2$ | —$CH_2CH=CH_2$ | —$CH_2CH=CH_2$ | —$CH_2CH=CH_2$ |
| (XT-21) | —Me | —H | —Me | —H |
| (XT-22) | —Et | —H | —Et | —H |
| (XT-23) | -n-Pr | —H | -n-Pr | —H |
| (XT-24) | -i-Pr | —H | -i-Pr | —H |
| (XT-25) | -n-Bu | —H | -n-Bu | —H |
| (XT-26) | —H | —H | —H | —H |
| (XT-27) | -i-Bu | —H | -i-Bu | —H |
| (XT-28) | -tert-Bu | —H | -tert-Bu | —H |
| (XT-29) | -n-$C_6H_{13}$ | —H | -n-$C_6H_{13}$ | —H |
| (XT-30) | -n-$C_{18}H_{37}$ | —H | -n-$C_{18}H_{37}$ | —H |
| (XT-31) | —Ph | —H | —Ph | —H |
| (XT-32) | —$CH_2$Ph | —H | —$CH_2$Ph | —H |
| (XT-33) | -cyclo-$C_6H_{11}$ | —H | -cyclo-$C_6H_{11}$ | —H |
| (XT-34) | -cyclo-$C_5H_9$ | —H | -cyclo-$C_5H_9$ | —H |
| (XT-35) | —$CH_2C\equiv CH$ | —H | —$CH_2C\equiv CH$ | —H |
| (XT-36) | —$CH_2CH=CH_2$ | —H | —$CH_2CH=CH_2$ | —H |
| (XT-37) | 2,3-dimethylphenyl | —H | 2,3-dimethylphenyl | —H |
| (XT-38) | 4-chlorophenyl | —H | 4-chlorophenyl | —H |

TABLE 2

[Structure: xanthene dye with R¹R²N- and R³R⁴N=+ groups on xanthene, 9-position bearing 2-sulfophenyl group, counterion X⁻]

| No. | R¹ | R² | R³ | R⁴ |
|---|---|---|---|---|
| (XT-39) | —Me | —Me | —Me | —Me |
| (XT-40) | —Et | —Et | —Et | —Et |
| (XT-41) | -n-Pr | -n-Pr | -n-Pr | -n-Pr |
| (XT-42) | -i-Pr | -i-Pr | -i-Pr | -i-Pr |
| (XT-43) | -n-Bu | -n-Bu | -n-Bu | -n-Bu |
| (XT-44) | -sec-Bu | -sec-Bu | -sec-Bu | -sec-Bu |
| (XT-45) | -i-Bu | -i-Bu | -i-Bu | -i-Bu |
| (XT-46) | -tert-Bu | -tert-Bu | -tert-Bu | -tert-Bu |
| (XT-47) | -n-C$_6$H$_{13}$ | -n-C$_6$H$_{13}$ | -n-C$_6$H$_{13}$ | -n-C$_6$H$_{13}$ |
| (XT-48) | -n-C$_{18}$H$_{37}$ | -n-C$_{18}$H$_{37}$ | -n-C$_{18}$H$_{37}$ | -n-C$_{18}$H$_{37}$ |
| (XT-49) | —Me | —Et | —Me | —Et |
| (XT-50) | —CH$_2$CH$_2$OCH$_2$CH$_2$— | | —CH$_2$CH$_2$OCH$_2$CH$_2$— | |
| (XT-51) | —(CH$_2$)$_5$— | | —(CH$_2$)$_5$— | |
| (XT-52) | —(CH$_2$)$_4$— | | —(CH$_2$)$_4$— | |
| (XT-53) | —(CH$_2$)$_5$— | | —(CH$_2$)$_4$— | |
| (XT-54) | —CH$_2$Ph | —CH$_2$Ph | —CH$_2$Ph | —CH$_2$Ph |
| (XT-55) | —Et | —CH$_2$CH$_2$OMe | —Et | —CH$_2$CH$_2$OMe |
| (XT-56) | —Me | -cyclo-C$_6$H$_{11}$ | —Me | -cyclo-C$_6$H$_{11}$ |
| (XT-57) | —CH$_2$C≡CH | —CH$_2$C≡CH | —CH$_2$C≡CH | —CH$_2$C≡CH |
| (XT-58) | —CH$_2$CH=CH$_2$ | —CH$_2$CH=CH$_2$ | —CH$_2$CH=CH$_2$ | —CH$_2$CH=CH$_2$ |
| (XT-59) | —Me | —H | —Me | —H |
| (XT-60) | —Et | —H | —Et | —H |
| (XT-61) | -n-Pr | —H | -n-Pr | —H |
| (XT-62) | -i-Pr | —H | -i-Pr | —H |
| (XT-63) | —H | —H | —H | —H |
| (XT-64) | -sec-Bu | —H | -sec-Bu | —H |
| (XT-65) | -i-Bu | —H | -i-Bu | —H |
| (XT-66) | -tert-Bu | —H | -tert-Bu | —H |
| (XT-67) | -n-C$_6$H$_{13}$ | —H | -n-C$_6$H$_{13}$ | —H |
| (XT-68) | -n-C$_{18}$H$_{37}$ | —H | -n-C$_{18}$H$_{37}$ | —H |
| (XT-69) | —Ph | —H | —Ph | —H |
| (XT-70) | —CH$_2$Ph | —H | —CH$_2$Ph | —H |
| (XT-71) | -cyclo-C$_6$H$_{11}$ | —H | -cyclo-C$_6$H$_{11}$ | —H |
| (XT-72) | -cyclo-C$_5$H$_9$ | —H | -cyclo-C$_5$H$_9$ | —H |
| (XT-73) | —CH$_2$C≡CH | —H | —CH$_2$C≡CH | —H |
| (XT-74) | —CH$_2$CH=CH$_2$ | —H | —CH$_2$CH=CH$_2$ | —H |
| (XT-75) | 2,6-dimethylphenyl | —H | 2,6-dimethylphenyl | —H |
| (XT-76) | 4-chlorophenyl | —H | 4-chlorophenyl | —H |

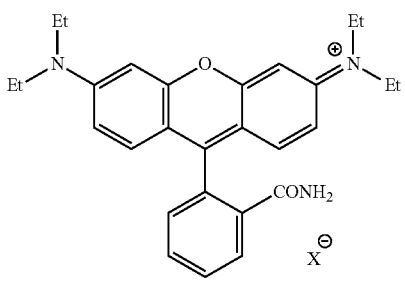
(XT-77)

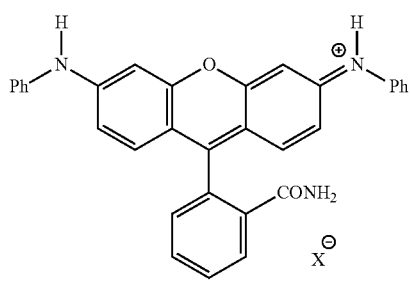
(XT-78)

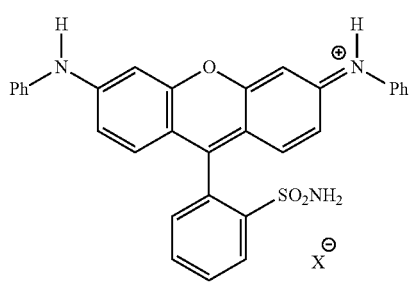
(XT-79)

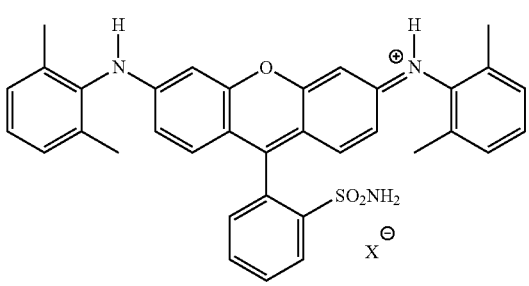
(XT-80)

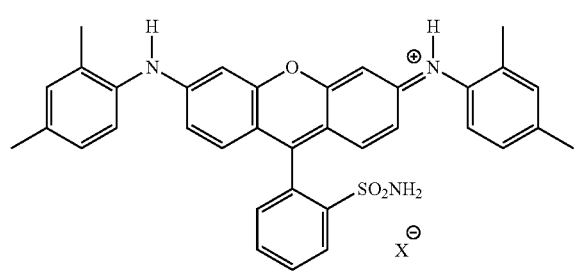
(XT-81)

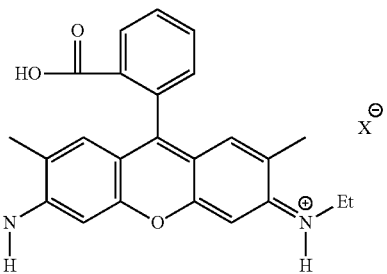
(XT-82)

For the dye multimer, a hydrogen atom in the dye structure may be substituted with a substituent selected from the following substituent group A as long as the object of the present invention is not impaired.

Substituent Group A:

Examples of the substituent which may be contained in the dye multimer include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imide group, a phosphino group, a phosphinyl group, a phosphinyloxy group, a phosphinylamino group, and a silyl group. These will be described in detail below.

Examples of the substituent include a halogen atom (for example, a fluorine atom, a chlorine atom, a bromine atom, and an iodine atom), a linear or branched alkyl group (a linear or branched substituted or unsubstituted alkyl group, and preferably an alkyl group having 1 to 30 carbon atoms, for example, methyl, ethyl, n-propyl, isopropyl, tert-butyl, n-octyl, 2-chloroethyl, 2-cyanoethyl, and 2-ethylhexyl), a cycloalkyl group (preferably a substituted or unsubstituted cycloalkyl group having 3 to 30 carbon atoms, for example, cyclohexyl and cyclopentyl, or a polycycloalkyl group, for example, a group having a polycyclic structure such as a bicycloalkyl group (preferably a substituted or unsubstituted bicycloalkyl group having 5 to 30 carbon atoms, for example, a bicyclo[1,2,2]heptan-2-yl group, and a bicyclo[2,2,2]octan-3-yl group), and a tricycloalkyl group. Among these, a monocyclic cycloalkyl group and a bicycloalkyl group are more preferable, and a monocyclic cycloalkyl group is particularly preferable), a linear or branched alkenyl group (a linear or branched substituted or unsubstituted alkenyl group, which is preferably an alkenyl group having 2 to 30 carbon atoms, for example, vinyl, allyl, prenyl, geranyl, and oleyl), a cycloalkenyl group (preferably a substituted or unsubstituted cycloalkenyl group having 3 to 30 carbon atoms, for example, 2-cyclopenten-1-yl and 2-cyclohexen-1-yl, a polycyclic alkenyl group, for example, a bicycloalkenyl group (preferably a substituted or unsubstituted bicycloalkenyl group having 5 to 30 carbon atoms, for example, bicyclo[2, 2,1]hepto-2-en-1-yl and bicyclo[2,2,2]octo-2-en-4-yl), or a tricycloalkenyl group. Among these, a monocyclic cycloalkenyl group is particularly preferable), an alkynyl group (preferably a substituted or unsubstituted alkynyl group having 2 to 30 carbon atoms, for example, an ethynyl group, a propargyl group, and a trimethylsilylethynyl group), an aryl group (preferably a substituted or unsubstituted aryl group having 6 to 30 carbon atoms, for example, phenyl, p-tolyl, naphthyl, m-chlorophenyl, and o-hexadecanoylaminophenyl), a heterocyclic group (preferably a substituted or unsubstituted, saturated or unsaturated, aromatic or non-aromatic, and monocyclic or ring-fused 5- to 7-membered heterocyclic group, more preferably a heterocyclic group of which ring-constituting atoms are selected from a carbon atom, a nitrogen atom, and a sulfur atom, and which has at least any one of hetero atoms including a nitrogen atom, an oxygen atom, and a sulfur atom, and still more preferably a 5- or 6-membered aromatic heterocyclic group having 3 to 30 carbon atoms, for example, 2-furyl, 2-thienyl, 2-pyridyl, 4-pyridyl, 2-pyrimidinyl, and 2-benzothiazolyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, tert-butoxy, n-octyloxy, and 2-methoxyethoxy), an aryloxy group (preferably a substituted or unsubstituted aryloxy group having 6 to 30 carbon atoms, for example, phenoxy, 2-methylphenoxy, 2,4-di-tert-amylphenoxy, 4-tert-butylphenoxy, 3-nitrophenoxy, and 2-tetradecanoylaminophenoxy), a silyloxy group (preferably a silyloxy group having 3 to 20 carbon atoms, for example, trimethylsilyloxy and tert-butyldimethylsilyloxy), a heterocyclic oxy group (preferably a substituted or unsubstituted heterocyclic oxy group having 2 to 30 carbon atoms, with heterocyclic moiety being preferably the heterocyclic moiety explained for the aforementioned heterocyclic group and the heterocyclic oxy group being, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, and p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, and N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, tert-butoxycarbonyloxy, and n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, and p-n-hexadecyloxyphenoxycarbonyloxy), an amino group (preferably an amino group, a substituted or unsubstituted alkylamino group having 1 to 30 carbon atoms, a substituted or unsubstituted arylamino group having 6 to 30 carbon atoms, and a heterocyclic amino group having 0 to 30 carbon atoms, for example, amino, methylamino, dimethylamino, anilino, N-methyl-anilino, diphenylamino, and N-1,3,5-triazin-2-ylamino), an acylamino group (preferably a formylamino group, a substituted or unsubstituted alkylcarbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, and 3,4,5-tri-n-octyloxyphenylcarbonylamino), an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, and morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, tert-butoxycarbonylamino, n-octadecyloxycarbonylamino, and N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, and m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, and N-n-octylaminosulfonylamino), an alkylsulfonylamino or arylsulfonylamino group (preferably a substituted or unsubstituted alkylsulfonylamino group having 1 to 30 carbon atoms, or a substituted or unsubstituted arylsulfonylamino group having 6 to 30 carbon atoms, for example, methylsulfonylamino, butylsulfonylamino, phenylsulfonylamino, 2,3,5-trichlorophenylsulfonylamino, and p-methylphenylsulfonylamino), a mercapto group, an alkylthio group (preferably a substituted or unsubstituted alkylthio group having 1 to 30 carbon atoms, for example, methylthio, ethylthio, and n-hexadecylthio), an arylthio group (preferably a substituted or unsubstituted arylthio group having 6 to 30 carbon atoms, for example, phenylthio, p-chlorophenylthio, and m-methoxyphenylthio), a heterocyclic thio group (preferably a substituted or unsubstituted heterocyclic thio group having 2 to 30 carbon atoms, in which a heterocyclic moiety is preferably the heterocyclic moiety explained for the aforementioned heterocyclic group, for example, 2-benzothiazolylthio and 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, and N-(N'-phenylcarbamoyl)sulfamoyl), a sulfo group, an alkylsulfinyl or arylsulfinyl group (preferably a substituted or unsubstituted alkylsulfinyl group having 1 to 30 carbon atoms or a substituted or unsubstituted arylsulfinyl group having 6 to 30 carbon atoms, for example, methylsulfinyl, ethylsulfinyl, phenylsulfinyl, and p-methylphenylsulfinyl), an alkylsulfonyl or arylsulfonyl group (preferably a substituted or unsubstituted alkylsulfonyl group having 1 to 30 carbon atoms or a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having 2 to 30 carbon atoms, or a substituted or unsubstituted arylcarbonyl group having 7 to 30 carbon atoms, for example, acetyl, pivaloyl, 2-chloroacetyl, stearoyl, benzoyl, and p-n-octyloxyphenylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, and p-tert-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, tert-butoxycarbonyl, and n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, and N-(methylsulfonyl)carbamoyl), an arylazo or heterocyclic azo group (preferably a substituted or unsubstituted arylazo group having 6 to 30 carbon atoms, or a substituted or unsubstituted heterocyclic azo group having 3 to 30 carbon atoms (in which a heterocyclic moiety is preferably the heterocyclic moiety explained for the aforementioned heterocyclic group), for example, phenylazo, p-chlorophenylazo, and 5-ethylthio-1,3,4-thiadiazol-2-ylazo), an imide group (preferably a substituted or unsubstituted imide group having 2 to 30 carbon atoms, for example, N-succinimide and N-phthalimide), a phosphino group (preferably a substituted or unsubstituted phosphino group having 2 to 30 carbon atoms, for example, dimethylphosphino, diphenylphosphino, and methylphenoxyphosphino), a phosphinyl group (preferably a substituted or unsubstituted phosphinyl group having 2 to 30 carbon atoms, for example, phosphinyl, dioctyloxyphosphinyl, and diethoxyphosphinyl), a phosphinyloxy group (preferably a substituted or unsubstituted phosphinyloxy group having 2 to 30 carbon atoms, for example, diphenoxyphosphinyloxy and dioctyloxyphosphinyloxy), a phosphinylamino group (preferably a substituted or unsubstituted phosphinylamino group having 2 to 30 carbon atoms, for example, dimethoxyphosphinylamino and dimethylaminophosphinylamino), and a silyl group (preferably a substituted or unsubstituted silyl group having 3 to 30 carbon atoms, for example, trimethylsilyl, tert-butyldimethylsilyl, and phenyldimethylsilyl).

Among the above functional groups, in the functional groups having hydrogen atoms, the portion of hydrogen atoms in the functional groups may be substituted with any one of the above groups. Examples of the functional groups which can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include a methylsulfonylaminocarbonyl group, a p-methylphenylsulfonylaminocarbonyl group, an acetylaminosulfonyl group, and a benzoylaminosulfonyl group.

<Structure of Dye Multimer>

The dye multimer (A) used in the colored composition of the present invention is not particularly limited, but it is preferably a dye multimer including at least one of repeating units represented by the following General Formulae (a1-1) and (a1-2), or a dye multimer represented by General Formula (a1-3). One kind of the dye multimer may include one kind or two or more kinds of the repeating unit represented by General Formula (a1-1). Further, the dye multimer may include other repeating units as will be described later.

In the present invention, the dye multimer represented by General Formula (a1-1) is preferably included. These will be described in order.

<<Repeating Unit Represented by General Formula (a1-1)>>

General Formula (a1-1)

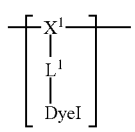

(In General Formula (a1-1), $X^1$ represents a group that forms a main chain, $L^1$ represents a single bond or a divalent linking group, and DyeI represents a dye structure having a cationic moiety.)

Hereinafter, General Formula (a1-1) will be described in detail.

In General Formula (a1-1), $X^1$ represents a group that forms a main chain. That is, $X^1$ represents a portion that forms a repeating unit corresponding to a main chain formed by a polymerization reaction. $X^1$ is not particularly limited as long as it is a linking group formed of a known polymerizable monomer. Particularly, $X^1$ is preferably a linking group represented by the following (XX-1) to (XX-24), more preferably selected from (meth)acryl-based linking chains represented by (XX-1) and (XX-2), styrene-based linking chains represented by (XX-10) to (XX-17), and a vinyl-based linking chain represented by (XX-24), and still more preferably (meth)acryl-based linking chains represented by (XX-1) and (XX-2), and a styrene-based linking chain represented by (XX-11).

In (XX-1) to (X-24), the site represented by * represents a site for lining to $L^1$.

Me represents a methyl group. Further, R in (XX-18) and (XX-19) represents a hydrogen atom, an alkyl group having 1 to 5 carbon atoms, or a phenyl group.

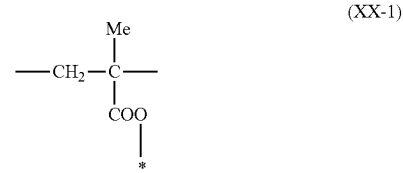

(XX-1)

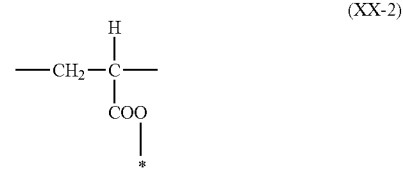

(XX-2)

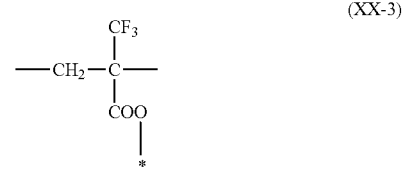

(XX-3)

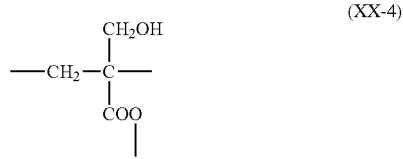

(XX-4)

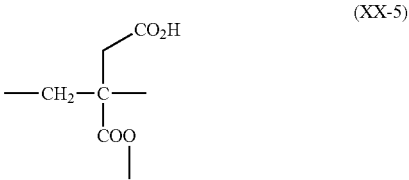

(XX-5)

(XX-6) 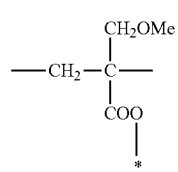
(XX-7) 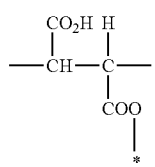
(XX-8) 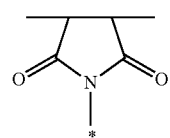
(XX-9) 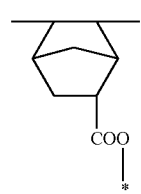
(XX-10) 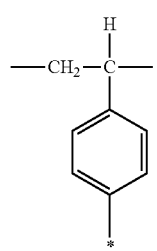
(XX-11) 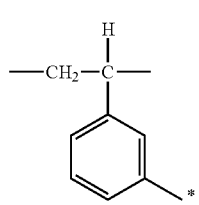
(XX-12) 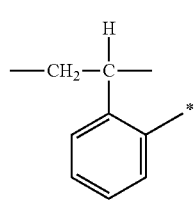
(XX-13) 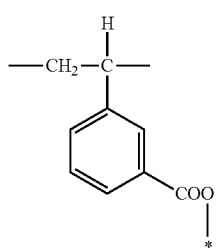
(XX-14) 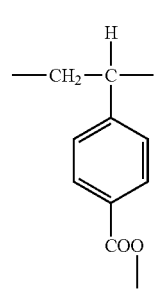
(XX-15) 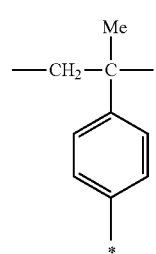
(XX-16) 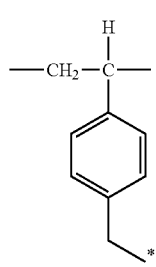
(XX-17) 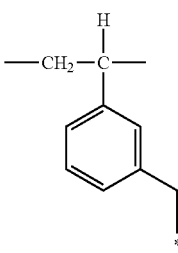
(XX-18) 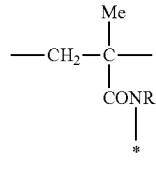
(XX-19) 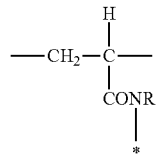
(XX-20) 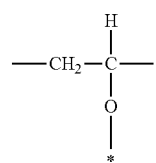

(XX-21)

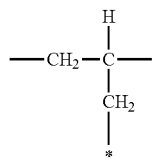

(XX-22)

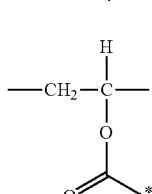

(XX-23)

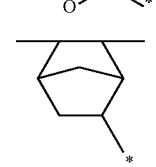

(XX-24)

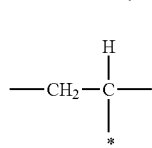

In General Formula (a1-1), $L^1$ represents a single bond or a divalent linking group. In the case where $L^1$ represents a divalent linking group, examples of the divalent linking group represent a substituted or unsubstituted alkylene group having 1 to 30 carbon atoms (for example, a methylene group, an ethylene group, a trimethylene group, a propylene group, and a butylene group), a substituted or unsubstituted arylene group having 6 to 30 carbon atoms (for example, a phenylene group and a naphthalene group), a substituted or unsubstituted heterocyclic linking group, —CH=CH—, —O—, —S—, —C(=O)—, —CO$_2$—, —NR—, —CONR—, —O$_2$C—, —SO—, —SO$_2$—, and a linking group formed of two or more of these linked to each other. $L^1$ is more preferably a single bond or an alkylene group, and still more preferably a single bond or —(CH$_2$)$_n$— (in which n represents an integer of 1 to 5). Herein, R's each independently represent a hydrogen atom, an alkyl group, an aryl group, or a heterocyclic group.

The divalent linking group represented by $L^1$ may be a group which can form an ionic bond or a coordinate bond with DyeI, and in this case, it may be either an anionic group or a cationic bond.

Examples of the anionic group include —COO$^-$, —PO$_3$H$^-$, —SO$_3^-$, —SO$_3$NH$^-$, and —SO$_3$N$^-$CO—, among which —COO$^-$, —PO$_3$H$^-$, and —SO$_3^-$ are preferable.

Examples of the cationic group include substituted or unsubstituted onium cations (for example, ammonium, pyridinium, imidazolium, and phosphonium), among which an ammonium cation is particularly preferable.

In the case where $L^1$ has a group which can form an ionic bond or a coordinate bond with DyeI, $L^1$ can be bonded to an anion portion (—COO$^-$, —SO$_3^-$, and —O$^-$) or a cation portion (the onium cation described above, a metal cation, or the like) contained in DyeI.

In General Formula (a1-1), DyeI represents a dye structure derived from the aforementioned dye compound.

The dye multimer having the repeating unit represented by General Formula (a1-1) can be synthesized by (1) a method of synthesizing the dye multimer by addition polymerization using a monomer having a dye residue, or (2) a method of synthesizing the dye multimer by performing a reaction between a polymer having a highly reactive functional group such as an isocyanate group, an acid anhydride group, and an epoxy group with a dye having a functional group (a hydroxyl group, a primary or secondary amino group, a carboxyl group, or the like) which can react with the highly reactive group.

For the addition polymerization, known addition polymerization (radical polymerization, anionic polymerization, or cationic polymerization) is applicable, but among these, it is particularly preferable for the dye multimer to be synthesized by radical polymerization since the reaction condition can be set to be mild conditions, and the dye structure is not degraded. For the radical polymerization, known reaction conditions can be applied.

Among these, from the viewpoint of heat resistance, the dye multimer having the repeating unit represented by General Formula (a1-1) is preferably a radical polymer which is obtained by performing radical polymerization using a dye monomer having an ethylenically unsaturated bond.

Specific examples of the repeating unit represented by General Formula (a1-1) will be shown below, but the present invention is not limited thereto.

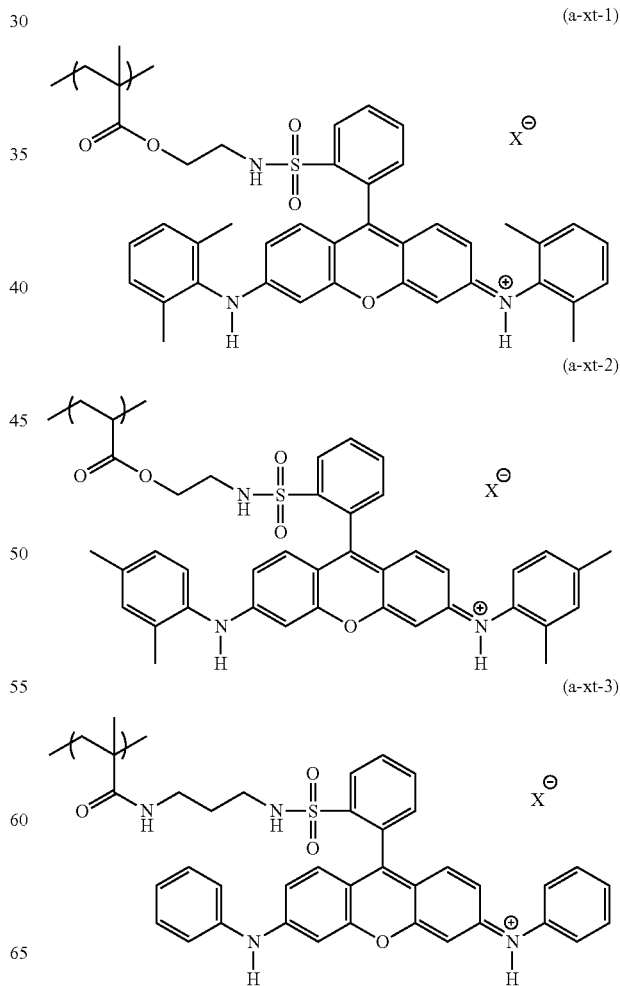

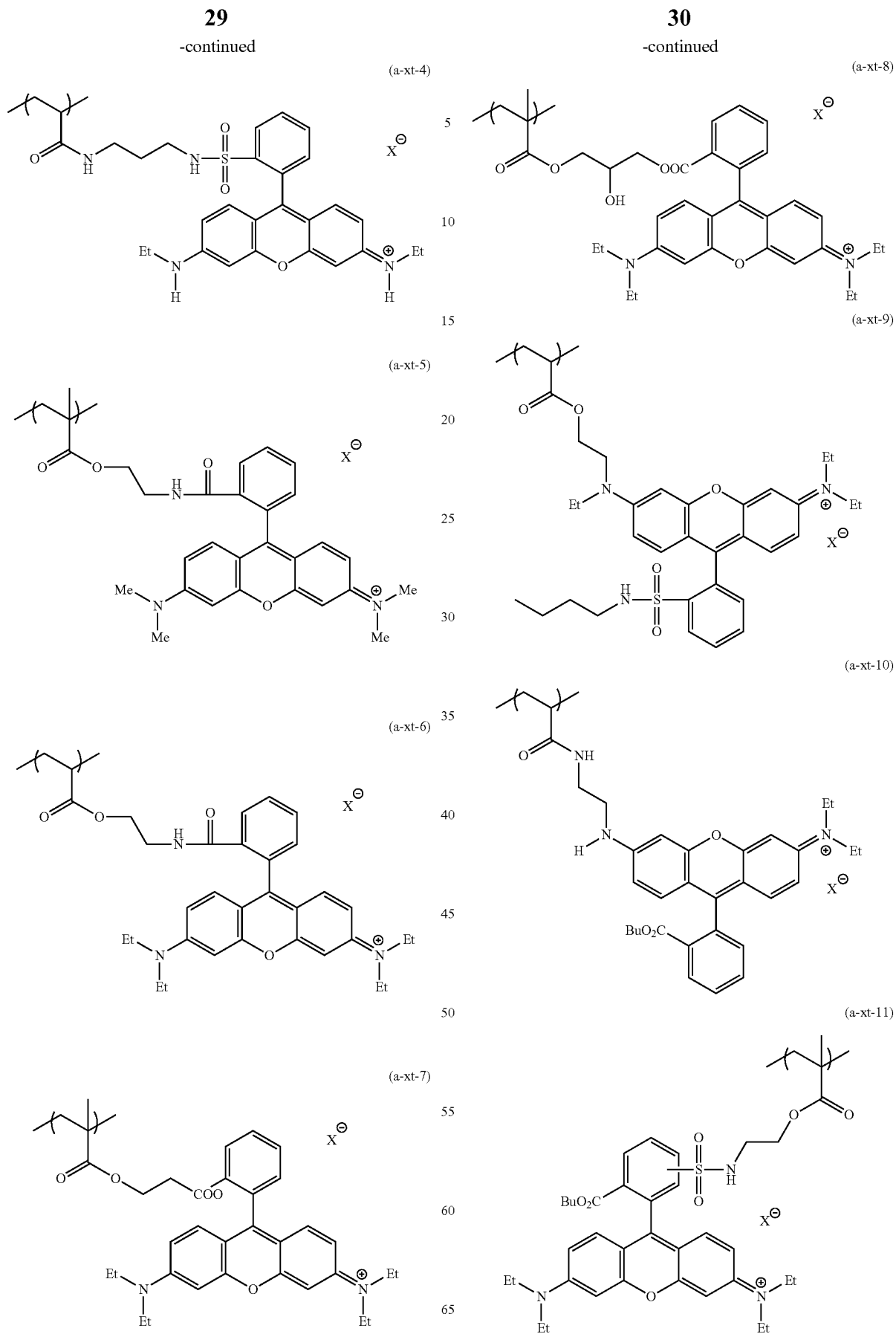

-continued (a-xt-12)

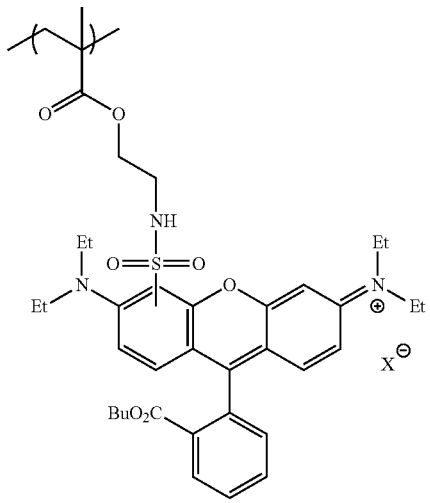

(B-xt-1)

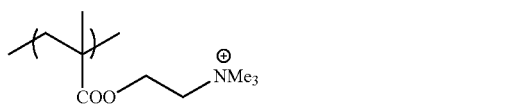

(B-xt-2)

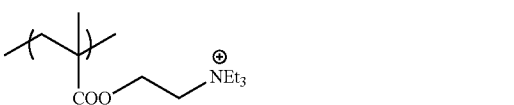

<<Repeating Unit Represented by General Formula (a1-2)>>

Next, details of the dye multimer represented by General Formula (a1-2) will be described.

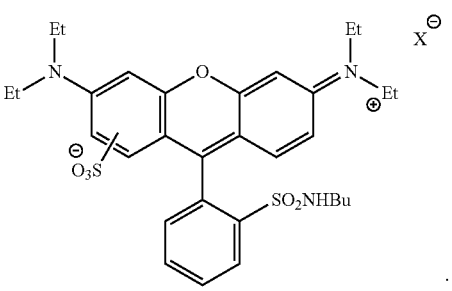

General Formula (a1-2)

(In General Formula (a1-2), $L^3$ represents a single bond or a divalent linking group. DyeIII represents a dye structure having a cationic moiety, and m represents 0 or 1.)

In General Formula (a1-2), $L^3$ represents a single bond or a divalent linking group. Suitable examples of the divalent linking group represented by $L^3$ include a substituted or unsubstituted linear, branched, or cyclic alkylene group having 1 to 30 carbon atoms (for example, a methylene group, an ethylene group, a trimethylene group, a propylene group, and a butylene group), a substituted or unsubstituted arylene group having 6 to 30 carbon atoms (for example, a phenylene group and a naphthylene group), a substituted or unsubstituted heterocyclic linking group, —CH═CH—, —O—, —S—, —NR— (in which R's each independently represent a hydrogen atom, an alkyl group, an aryl group, or a heterocyclic group), —C(═O)—, —SO—, —SO$_2$—, and a linking group which is formed of two or more of these groups linked to each other.

m represents 0 or 1, and preferably 1.

Specific examples of the groups which are suitably used as the divalent linking group represented by $L^3$ in General Formula (a1-2) are shown below, but $L^3$ of the present invention is not limited thereto. Further, the site represented by * represents a linking moiety to DyeIII or the like.

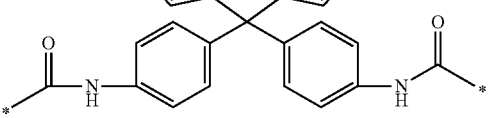

-continued

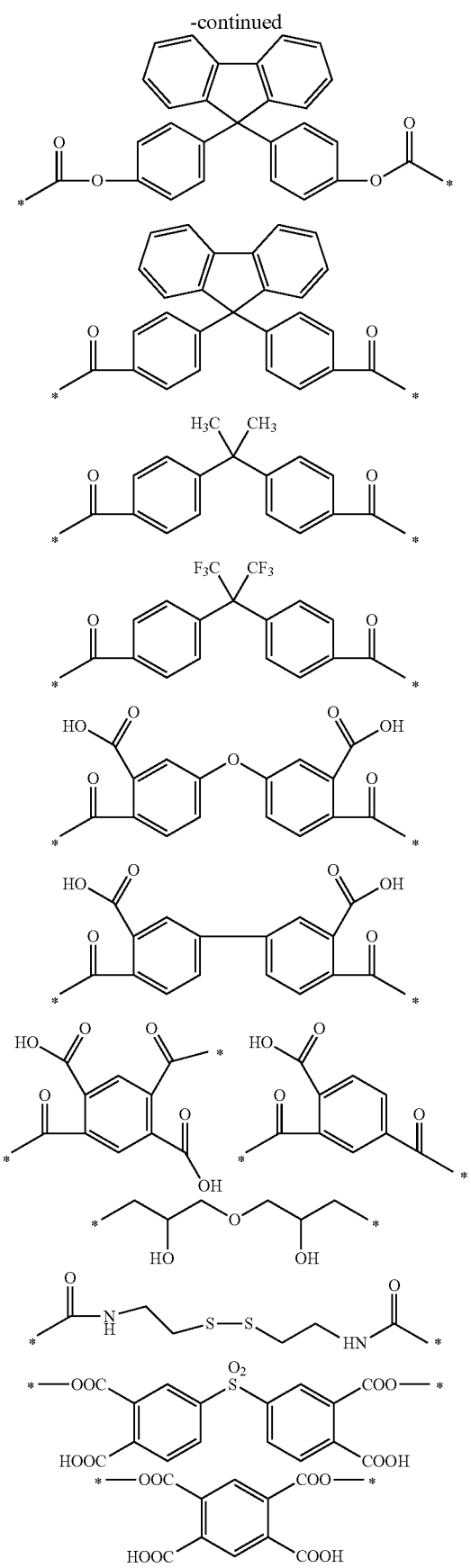

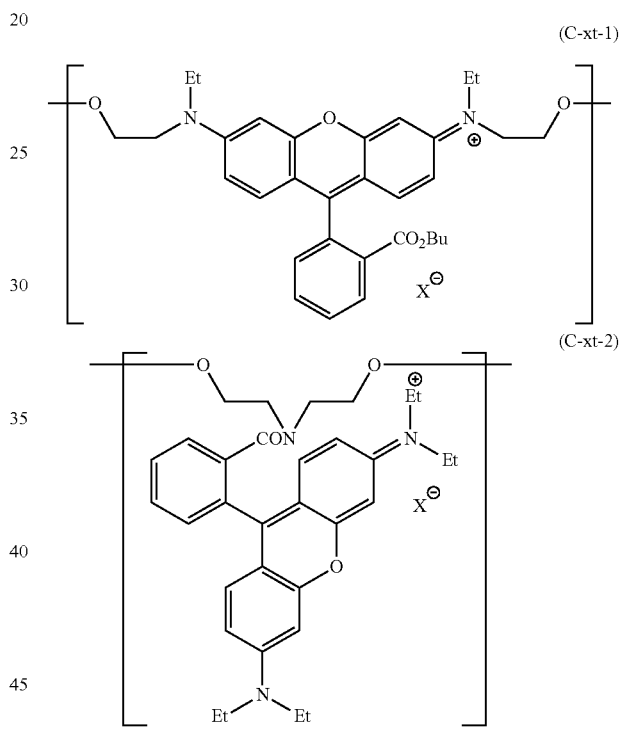

The dye multimer having the repeating unit represented by General Formula (a1-2) is synthesized by sequential polymerization. Examples of the sequential polymerization include polyaddition (for example, a reaction between an diisocyanate compound and diol, a reaction between a diepoxy compound and a dicarboxylic acid, and a reaction between a tetracarboxylic dianhydride and diol) and polycondensation (for example, a reaction between a dicarboxylic acid and diol, and a reaction between a dicarboxylic acid and diamine). Among these, it is particularly preferable to use the polyaddition reaction to synthesize the dye multimer since the reaction conditions can be set to be mild, and a dye structure is not degraded by the reaction. For the sequential polymerization, known reaction conditions can be applied.

Specific examples of the repeating unit represented by General Formula (a1-2) will be shown below, but the present invention is not limited thereto.

<<Dye Multimer Represented by General Formula (a1-3)>>

Next, details of the dye multimer represented by General Formula (a1-3) will be described.

General Formula (a1-3)

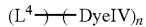

(In General Formula (a1-3), $L^4$ represents an n-valent linking group, n represents an integer of 2 to 20, and DyeIV represents a dye structure having a cationic moiety.)

In General Formula (a1-3), n is preferably 3 to 15, and particularly preferably 3 to 6.

In General Formula (a1-3), in the case where n is 2, suitable examples of the divalent linking groups represented by $L^4$ include a substituted or unsubstituted alkylene group having 1 to 30 carbon atoms (for example, a methylene group, an ethylene group, a trimethylene group, a propylene group, and a butylenes group), a substituted or unsubstituted arylene group having 6 to 30 carbon atoms (for example, a phenylene group and a naphthylene group), a substituted or unsubstituted heterocyclic linking group, —CH=CH—, —O—, —S—, —NR— (in which R's each independently represent a hydrogen atom, an alkyl group, an aryl group, or a heterocyclic group), —C(=O)—, —SO—, —SO$_2$—, and a linking group which is formed of two or more of these groups linked to each other.

Examples of the n-valent linking group in which n is 3 or more include linking groups which have, as a central core, a substituted or unsubstituted arylene group (a 1,3,5-phenylene group, a 1,2,4-phenylene group, a 1,4,5,8-naphthalene group, or the like), a heterocyclic linking group (for example, a 1,3,5-triazine group), an alkylene linking group, or the like, and are formed when the divalent linking group is substituted.

Specific examples of L$^4$ in General Formula (a1-3) are shown below, but the present invention is not limited thereto. Further, the site represented by * represents a linking moiety to DyeIV.

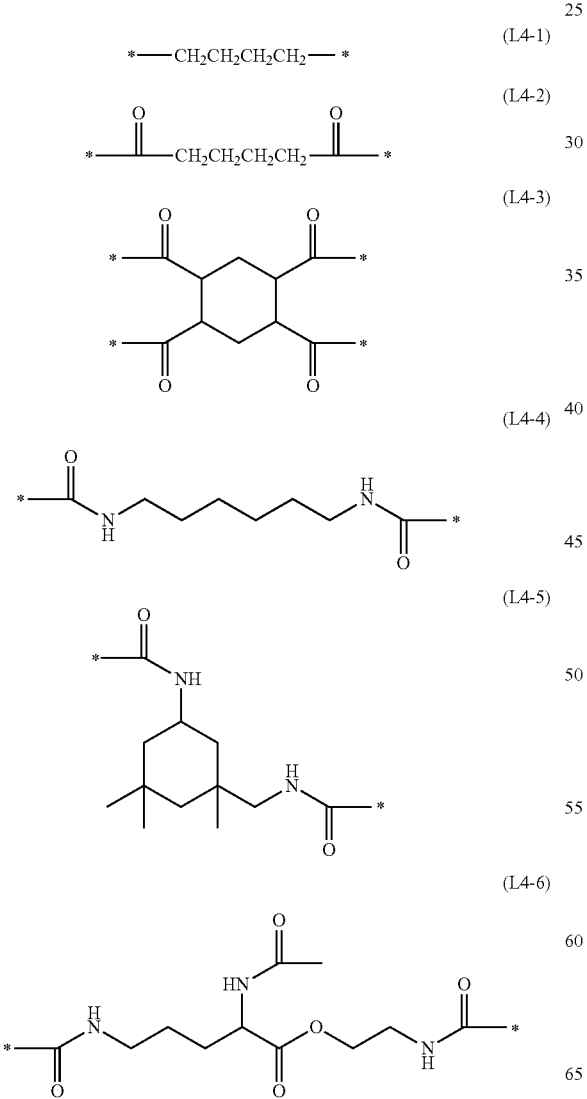
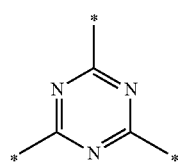
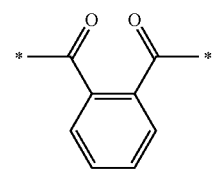
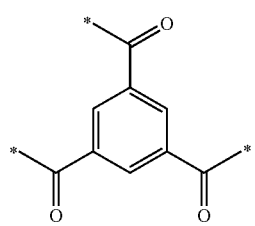
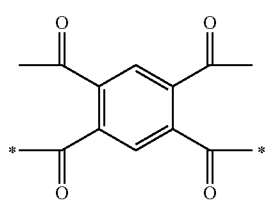
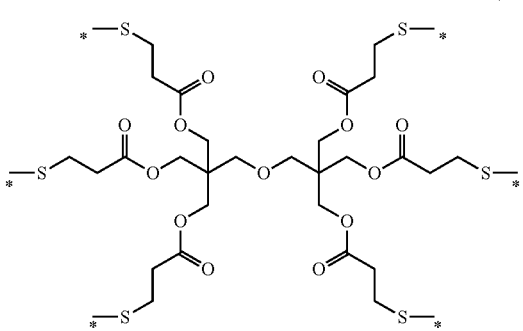
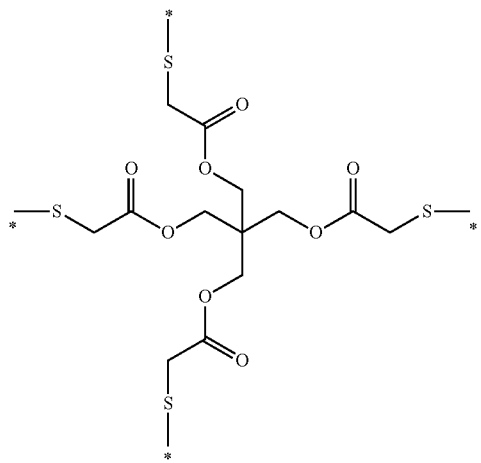

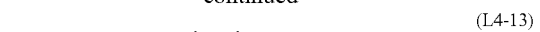
(L4-13)

(L4-14)

Specific examples of DyeIV in General Formula (a1-3) are shown below, but the present invention is not limited thereto.

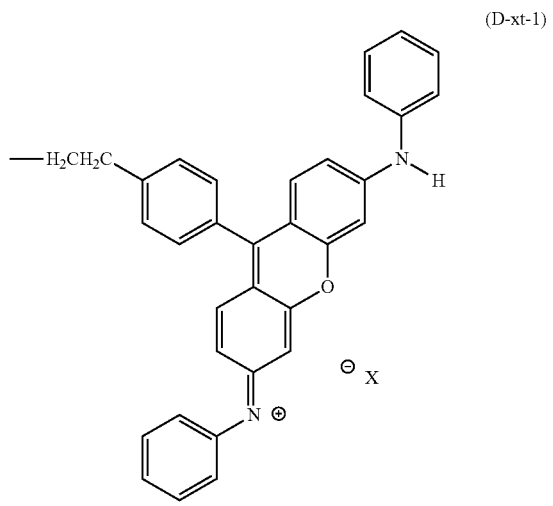
(D-xt-1)

Among the dye multimer having at least one of the repeating units represented by General Formulae (a1-1) and (a1-2), and the dye multimer represented by General Formula (a1-3), in the dye multimer having the repeating unit represented by General Formula (a1-1), the dye multimer having the repeating unit represented by General Formula (a1-2), and the dye multimer represented by General Formula (a1-3), the partial structures derived from a dye are linked to each other through a covalent bond in the molecular structure. Accordingly, the colored composition containing the dye multimer has excellent heat resistance. Therefore, a case where the colored composition is applied to pattern formation including a high-temperature process is preferable since an effect of inhibiting color migration to another colored pattern adjacent thereto is obtained. Moreover, in particular, the compound represented by General Formula (a1-1) is preferable since the compound makes it easy to control the molecular weight of the dye multimer.

<<Other Functional Groups and Repeating Units>>

The dye multimer may have other functional groups in the dye structure moiety of the aforementioned dye multimer. Examples of such other functional groups include a polymerizable group, an acid group, and an alkali-soluble group.

Furthermore, the dye multimer may include other repeating units in addition to the repeating unit including the aforementioned dye structure. Such other repeating unit may have a functional group.

Moreover, examples of such other repeating units include repeating units including at least one of a polymerizable group, an acid group, and an alkali-soluble group.

That is, the dye multimer may have other repeating units, in addition to the repeating units represented by General Formulae (a1-1) to (a1-3). One kind or two or more kinds of other repeating unit may be included in one dye multimer.

Furthermore, the dye multimer may have other functional groups in the dye multimers represented by General Formulae (a1-1) to (a1-3). Details thereof will be described below.

<<<Polymerizable Group Contained in Dye Multimer (A)>>>

The dye multimer preferably includes a polymerizable group. One kind or two or more kinds of the polymerizable group may be included.

For the polymerizable group, the dye structure may contain a polymerizable group, or include other moieties. In the present invention, it is preferable that the dye structure contains a polymerizable group. By using this configuration, heat resistance tends to be improved.

Furthermore, in the present invention, an embodiment in which a moiety other than the dye structure contains a polymerizable group is also preferable.

As the polymerizable group, known polymerizable groups which can be crosslinked by a radical, an acid, or heat can be used, and examples thereof include a group having an ethylenically unsaturated bond, a cyclic ether group (an epoxy group and an oxetane group), and a methylol group. Particularly, a group having an ethylenically unsaturated bond is preferable, a (meth)acryloyl group is more preferable, and (meth)acryloyl groups derived from glycidyl (meth)acrylate and 3,4-epoxycyclohexyl methyl(meth)acrylate are still more preferable.

The polymerizable group is preferably contained as a repeating unit having a polymerizable group in the dye multimer, and is more preferably contained as a repeating unit having an ethylenically unsaturated bond. That is, one example of preferred embodiments of the dye multimer is an embodiment in which the dye multimer includes a repeating unit containing a dye monomer and a repeating unit having a polymerizable group, and more preferably an embodiment in which the dye multimer includes a repeating unit containing a dye monomer and a repeating unit having an ethylenically unsaturated bond.

Examples of the method of introducing the polymerizable group include (1) a method of introducing the polymerizable group by modifying the dye multimer with a polymerizable group-containing compound, and (2) a method of introducing the polymerizable group by copolymerizing the dye multimer with a polymerizable group-containing compound. Hereinafter, the methods will be described in detail.

(1) Method of Introducing Polymerizable Group by Modifying Dye Multimer with Polymerizable Group-Containing Compound:

As the method of introducing the polymerizable group by modifying the dye multimer with a polymerizable group-containing compound, known methods can be used without particular limitation. For example, from the viewpoint of production, (a) a method of reacting a carboxylic acid contained in the dye multimer with an unsaturated bond-containing epoxy compound, (b) a method of reacting a hydroxyl group or an amino group contained in the dye multimer with an unsaturated bond-containing isocyanate compound, and (c) a method of reacting an epoxy compound contained in the dye multimer with an unsaturated bond-containing carboxylic acid compound are preferable from the viewpoint of production.

Examples of the unsaturated bond-containing epoxy compound in (a) the method of reacting a carboxylic acid contained in the dye multimer with an unsaturated bond-containing epoxy compound include glycidyl methacrylate, glycidyl acrylate, allylglycidyl ether, 3,4-epoxycyclohexylmethyl acrylate, and 3,4-epoxycyclohexylmethyl methacrylate. Glycidyl methacrylate and 3,4-epoxycyclohexylmethyl methacrylate are particularly preferable since these compounds have excellent crosslinking properties and storage stability. Known conditions can be used as the reaction conditions.

Examples of the unsaturated bond-containing isocyanate compound in (b) the method of reacting a hydroxyl group or an amino group contained in the dye multimer with an unsaturated bond-containing isocyanate compound include 2-isocyanatoethyl methacrylate, 2-isocyanatoethyl acrylate, and 1,1-bis(acryloyloxymethyl)ethyl isocyanate. Among these, 2-isocyanatoethyl methacrylate is preferable since it has excellent crosslinking properties and storage stability. Known conditions can be used as the reaction conditions.

As the unsaturated bond-containing carboxylic acid compound in (c) the method of reacting an epoxy compound contained in the dye multimer with an unsaturated bond-containing carboxylic acid compound, any carboxylic acid compounds can be used without particular limitation as long as the compound has a known (meth)acryloyloxy group. Among these, methacrylic acid and acrylic acid are preferable, and methacrylic acid is particularly preferable since this acid has excellent crosslinking properties and storage stability. Known conditions can be used as the reaction conditions.

(2) Method of Introducing Polymerizable Group by Copolymerizing Dye Monomer and Polymerizable Group-Containing Compound:

As (2) a method of introducing a polymerizable group by copolymerizing a dye monomer and a polymerizable group-containing compound, any known methods can be used without particular limitation. Among these, (d) a method of copolymerizing a radically polymerizable dye monomer with a polymerizable group-containing compound which can be radically polymerized, and (e) a method of copolymerizing a dye monomer which can be subjected to polyaddition with a polymerizable group-containing compound which can be subjected to polyaddition are preferable.

Examples of the polymerizable group-containing compound which can be radically polymerized in (d) the method of copolymerizing a radically polymerizable dye monomer with a polymerizable group-containing compound which can be radically polymerized particularly include an allyl group-containing compound (for example, allyl(meth)acrylate), an epoxy group-containing compound (for example, glycidyl(meth)acrylate and 3,4-epoxycyclohexyl methyl (meth)acrylate), an oxetane group-containing compound (for example, 3-methyl-3-oxetanyl methyl(meth)acrylate), and a methylol group-containing compound (for example, N-(hydroxymethyl)acrylamide). Among these, an epoxy compound and an oxetane compound are particularly preferable. Known conditions can be used as the reaction conditions.

Examples of the polymerizable group-containing compound which can be subjected to polyaddition in (e) the method of copolymerizing a dye monomer which can be subjected to polyaddition with a polymerizable group-containing compound which can be subjected to polyaddition include an unsaturated bond-containing diol compound (for example, 2,3-dihydroxypropyl(meth)acrylate). Known conditions can be used as the reaction conditions.

As the method of introducing a polymerizable group, a method of reacting a carboxylic acid contained in the dye multimer with an unsaturated bond-containing epoxy compound is particularly preferable.

The amount of the polymerizable group contained in the dye multimer is preferably 0.1 mmol to 2.0 mmol, more preferably 0.2 mmol to 1.5 mmol, and particularly preferably 0.3 mmol to 1.0 mmol, with respect to 1 g of the dye multimer (A).

Furthermore, the proportion of the repeating units containing the repeating unit in which the dye multimer contains a polymerizable group is preferably, for example, from 5 moles to 50 moles, and more preferably 10 moles to 20 moles, with respect to 100 moles of the total repeating units.

As the method of introducing a polymerizable group, a method in which a carboxylic acid contained in the dye multimer is reacted with an unsaturated bond-containing epoxy compound is particularly preferable.

Specific examples of the repeating unit having a polymerizable group are shown below, but the present invention is not limited thereto.

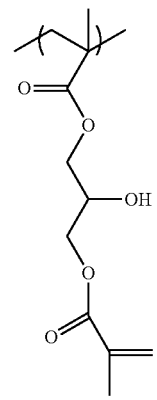

(G-1)

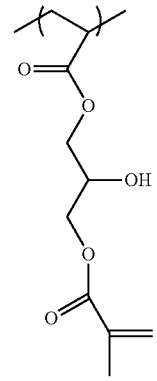

(G-2)

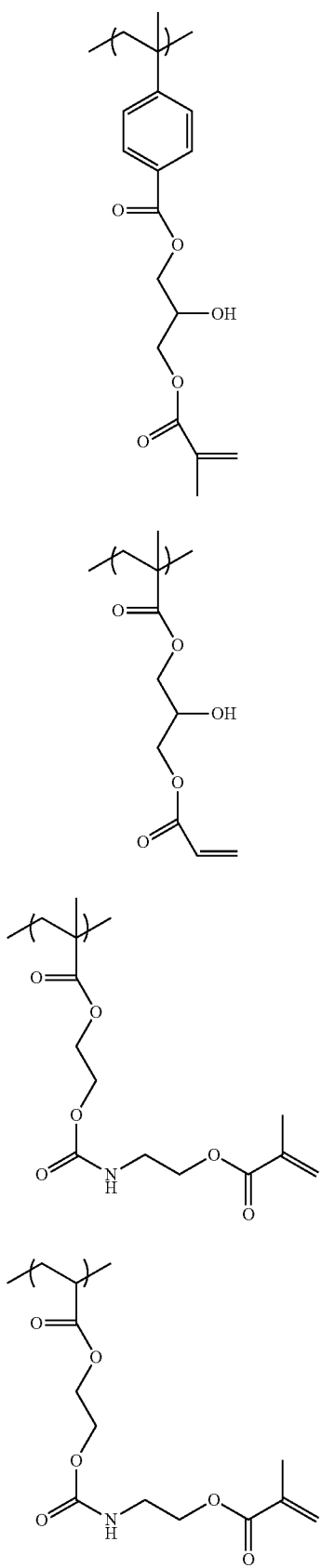
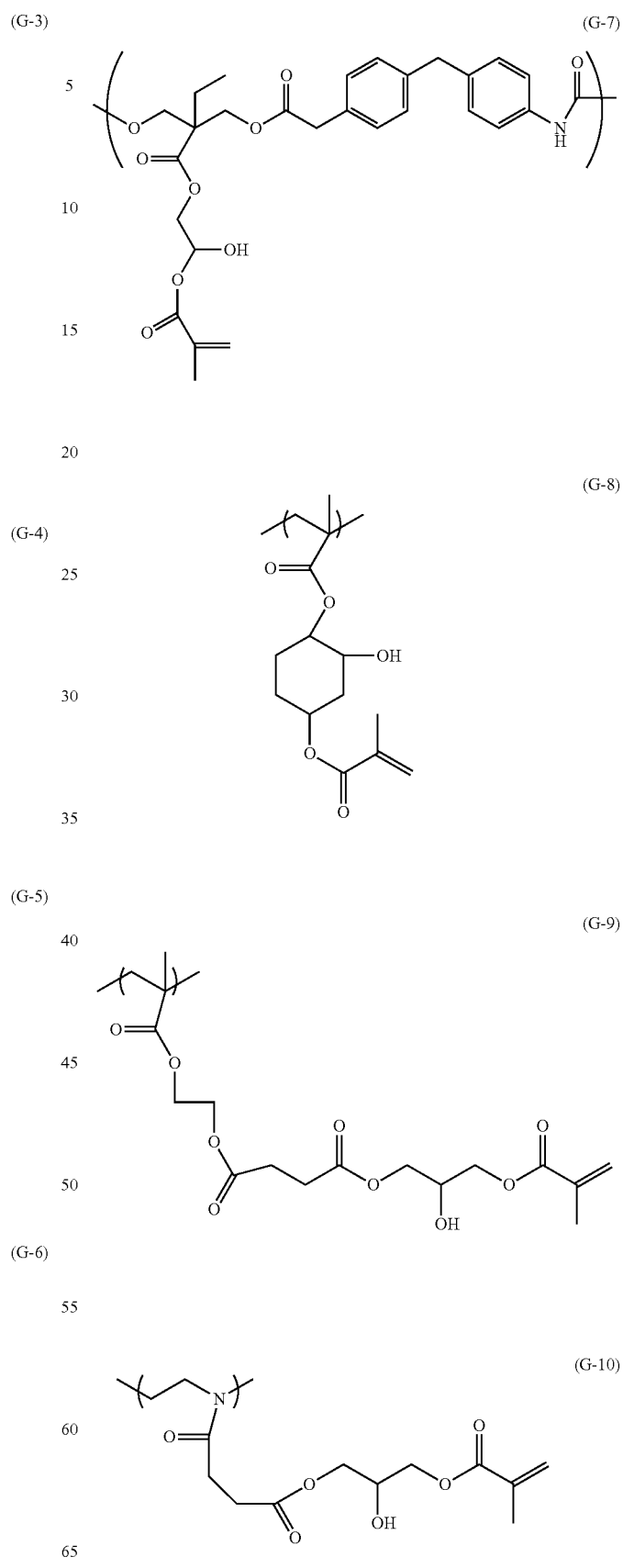

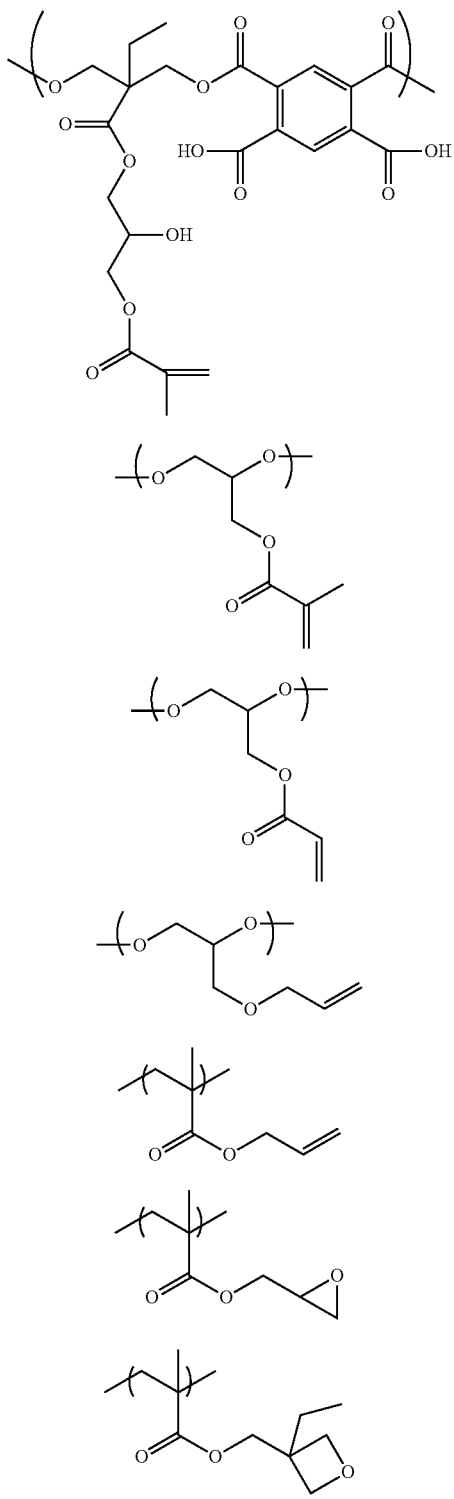

Among the above specific examples, from the viewpoint of substrate adhesiveness and surface roughness, dye monomers having an ethylenically unsaturated bond are preferable. Among these, a methacryloyl group, an acryloyl group, a styryl group, or a vinyloxy group is preferable, a methacryloyl group and an acryloyl group are more preferable, and a methacryloyl group is still more preferable.

<<<Acid Group and Alkali-Soluble Group Contained in Dye Multimer (A)>>>

Examples of the acid group which may be contained in the dye multimer include a carboxylic acid group, a sulfonic acid group, and a phosphoric acid group. Further, examples of the alkali-soluble group include a phenolic hydroxyl group and a carboxylic acid.

In the present invention, it is preferable that an acid group and/or an alkali-soluble group is/are contained in the dye multimer as a repeating unit having an acid group and/or an alkali-soluble group.

The acid value of the repeating unit having an acid group is preferably 15 mgKOH/g to 110 mgKOH/g, more preferably 20 mgKOH/g to 90 mgKOH/g, and still more preferably 30 mgKOH/g to 60 mgKOH/g.

The acid value of the dye multimer can be calculated from, for example, an average content of acid groups in the dye multimer. Further, it is possible to obtain a resin having a desired acid value by changing the content of monomer units containing an acid group constituting the dye multimer.

Examples of the method for introducing the alkali-soluble group into the dye multimer include a method in which an alkali-soluble group is introduced into a dye monomer in advance, and a method of copolymerizing monomers (a caprolactone-modified derivative of (meth)acrylic acids and acrylic acids, a succinic anhydride-modified derivative of 2-hydroxyethyl(meth)acrylate, a phthalic anhydride-modified derivative of 2-hydroxyethyl(meth)acrylate, a 1,2-cyclohexane dicarboxylic acid anhydride-modified derivative of 2-hydroxyethyl(meth)acrylate, styrenecarboxylic acid, carboxylic acid-containing monomers such as itaconic acid, maleic acid, and norbornene carboxylic acid, phosphoric acid-containing monomers such as acid phosphoxyethyl methacrylate, and vinyl phosphonic acid, and sulfonic acid-containing monomers such as vinylsulfonic acid and 2-acrylamide-2-methylsulfonic acid) other than a dye monomer having an alkali-soluble group. It is more preferable to use both of the methods.

The amount of the alkali-soluble groups contained in the dye multimer is preferably 0.3 mmol to 2.0 mmol, more preferably 0.4 mmol to 1.5 mmol, and particularly preferably 0.5 mmol to 1.0 mmol, with respect to 1 g of the dye multimer.

Furthermore, in the case where the dye multimer contains a repeating unit having a dye monomer and an acid group, the proportion of the repeating units containing a repeating unit having an acid group is, for example, preferably 5 moles to 70 moles, and more preferably 10 moles to 50 moles, with respect to 100 moles of the repeating unit containing the dye monomer.

Examples of other functional groups contained in the dye multimer include a development accelerating group such as lactone, acid anhydride, amide, —COCH$_2$CO—, and a cyano group, and a hydrophobicity- or hydrophilicity-regulating group such as a long chain-alkyl group, a cyclic alkyl group, an aralkyl group, an aryl group, a polyalkylene oxide group, a hydroxyl group, a maleimide group, and an amino group, which can be appropriately introduced.

Examples of the introduction method include a method for introducing a functional group into the dye monomer in advance, and a method in which monomers having the functional group are copolymerized.

Specific examples of the repeating unit having other functional groups contained in the dye multimer are shown, but the present invention is not limited thereto.

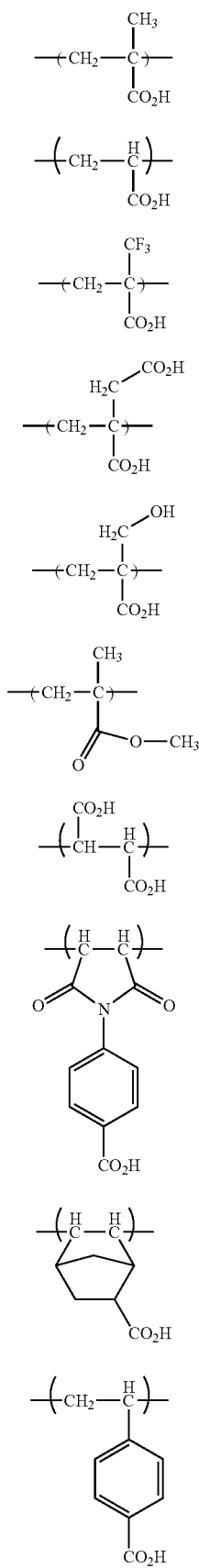
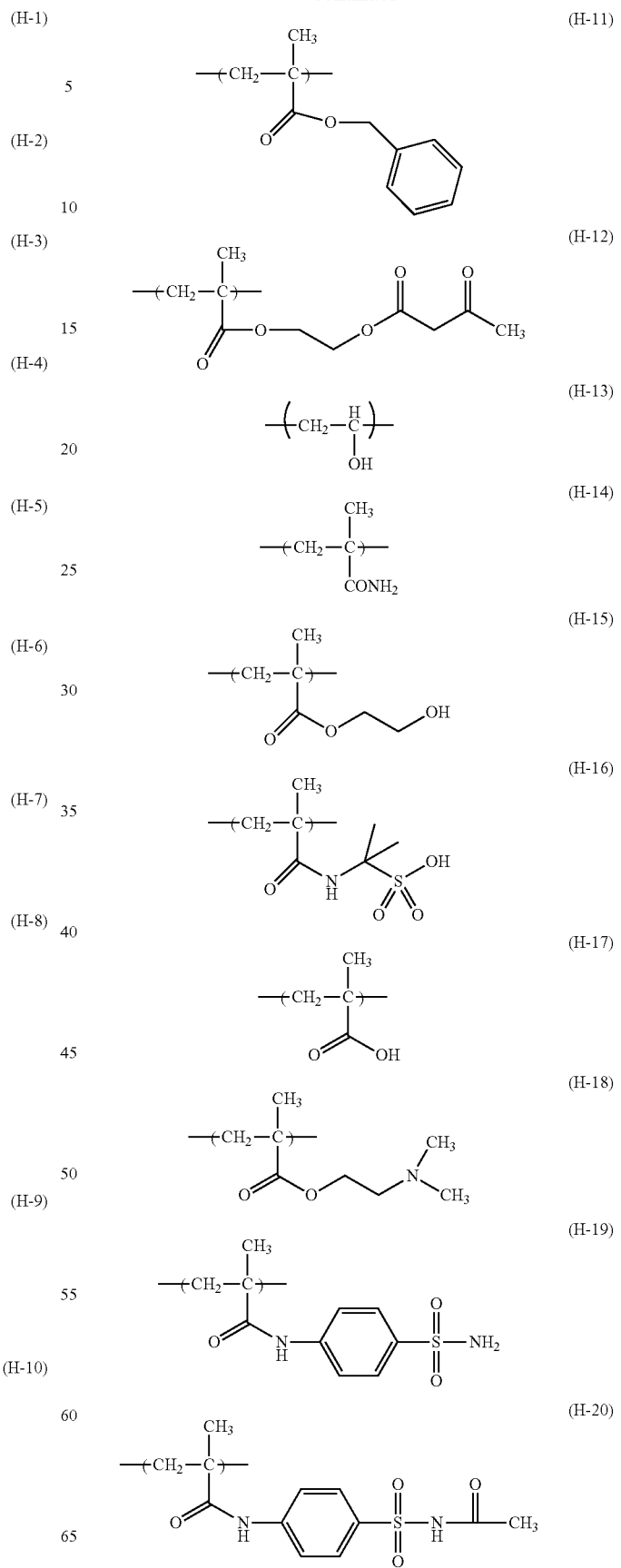

(H-21) 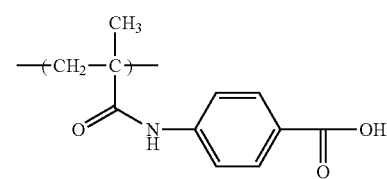
(H-22) 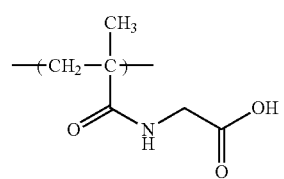
(H-23) 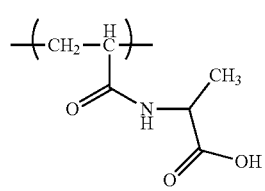
(H-24) 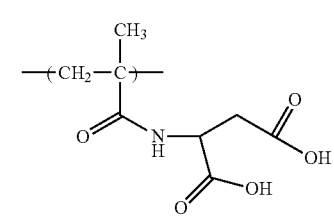
(H-25) 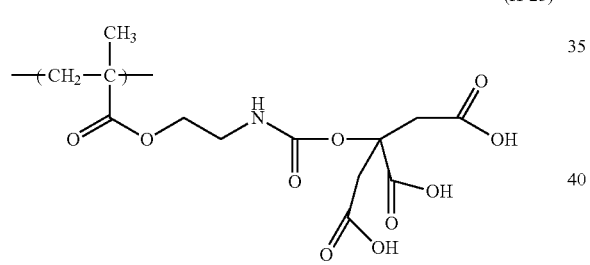
(H-26) 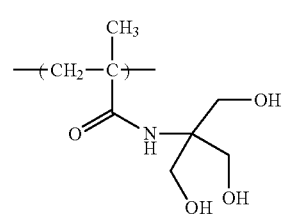
(H-27) 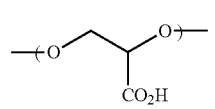
(H-28) 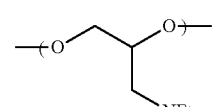
(H-29) 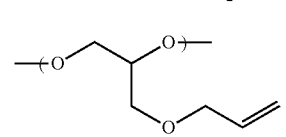
(H-30) 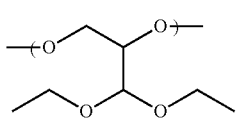
(H-31) 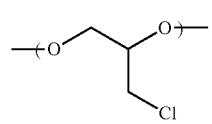
(H-32) 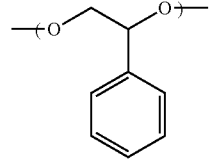
(H-33) 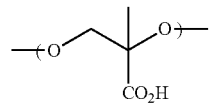
(H-34) 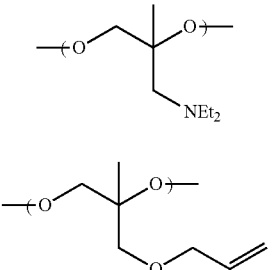
(H-35) 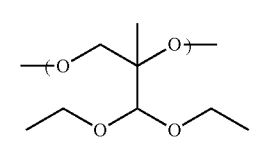
(H-36) 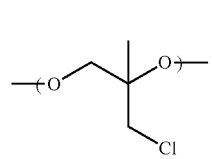
(H-37) 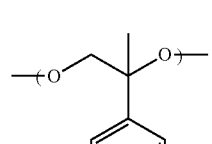
(H-38) 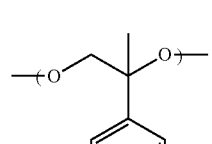
(H-39) 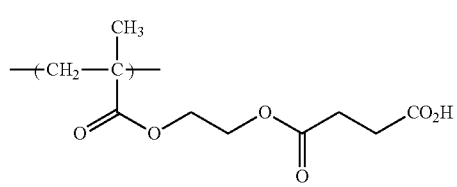

-continued

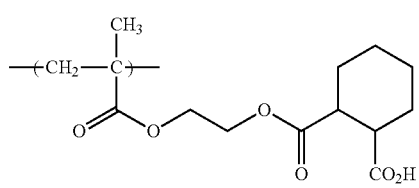
(H-40)

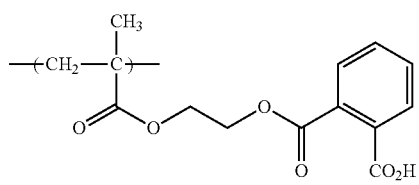
(H-41)

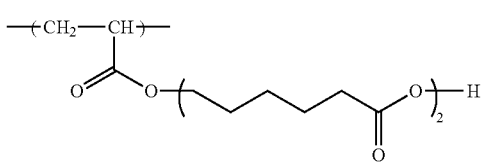
(H-42)

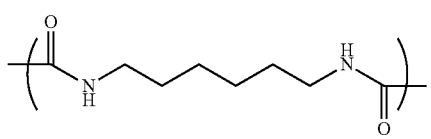
(H-43)

<<<Configuration of (A2)>>>

The configuration of the dye multimer (A2) is a dye multimer including a repeating unit having a dye structure, in which the dye structure has an anionic moiety.

For example, the dye multimer preferably includes a repeating unit represented by General Formula (a2).

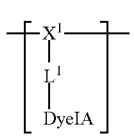
General Formula (a2)

(In General Formula (a2), $X^1$ represents a group that forms a main chain, and $L^1$ represents a single bond or a divalent linking group. DyeIA represents a dye structure having a cationic moiety and an anionic moiety.)

In General Formula (a2), $X^1$ and $L^1$ have the same definitions as General Formula (a1-1), and the preferred ranges are also the same.

In General Formula (a2), DyeIA is one in which DyeI in General Formula (a1-1) further has an anionic moiety. Examples of the anionic moiety include —$SO_3^-$ and —$CO_2^{2-}$.

With respect to the specific examples of the configuration of the dye multimer (A2), reference can be made to A-1 and A-3 to A-6 described in paragraph "0069" of JP2012-032754A, the contents of which are incorporated herein.

<<<Configuration of (A3)>>>

The configuration of the dye multimer (A3) is a dye multimer including a monomer having a dye structure and a repeating unit having a counter anionic moiety.

The monomer having a dye structure has the same definition as a monomer including a partial structure derived from the xanthene compound represented by General Formula (J).

It is preferable that the repeating unit having a counter anionic moiety includes a repeating unit represented by the following General Formula (a3).

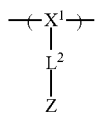
General Formula (a3)

(In General Formula (a3), $X^1$ represents a group that forms a main chain, $L^2$ represents a single bond or a divalent linking group, and Z represents a structure having a counter anionic moiety.)

In General Formula (a3), $X^1$ has the same definition as in General Formula (a1-1), and the preferred ranges are also the same.

In General Formula (a3), in the case where $L^2$ represents a divalent linking group, examples of the group include an alkylene group having 1 to 20 carbon atoms (preferably having 1 to 10 carbon atoms), an arylene group having 6 to 20 carbon atoms (preferably having 6 to 10 carbon atoms), a heterocyclic group having 4 to 20 carbon atoms (preferably having 5 to 10 carbon atoms), an alkylsulfonyl group having 1 to 20 carbon atoms (preferably having 1 to 10 carbon atoms), an arylsulfonyl group having 6 to 20 carbon atoms (preferably having 6 to 10 carbon atoms), an alkylcarbonyl group having 1 to 20 carbon atoms (preferably having 1 to 10 carbon atoms), an arylcarbonyl group having 6 to 20 carbon atoms (preferably having 6 to 11 carbon atoms), an alkylamino group having 1 to 20 carbon atoms (preferably having 1 to 10 carbon atoms), an arylamino group having 6 to 20 carbon atoms (preferably having 6 to 10 carbon atoms), an alkylcarbonyloxy group having 1 to 20 carbon atoms (preferably having 1 to 10 carbon atoms), and an arylcarbonyloxy group having 6 to 20 carbon atoms (preferably having 6 to 11 carbon atoms). These divalent linking groups are preferably substituted with an electron withdrawing group, and examples of the electron withdrawing group include a halogen atom (a fluorine atom, a chlorine atom, a bromine atom, and an iodine atom), a nitro group, a cyano group, a halogenated alkyl group (for example, a trifluoromethyl group), and a halogenated aryl group.

In the case where Z in General Formula (1) as will be described later is a weakly nucleophilic anion structure represented by the General Formula (2-1), $L^2$ is preferably an alkylene group (a fluorinated alkylene group) having 1 to 10 carbon atoms, which is substituted with a fluorine atom.

In General Formula (a3), Z preferably represents a group represented by General Formula (2-1), a fluorinated alkylsulfoneimide group or a fluorinated alkylsulfonemethide group, or a group represented by General Formula (2-3).

General Formula (2-1)

*—$Y^1$-$A^1$ (In General Formula (2-1), * represents a binding site to $L^2$ in General Formula (a3), $Y^1$ represents a fluorinated alkylene group, and $A^1$ represents $SO_3^-$.)

General Formula (2-3)

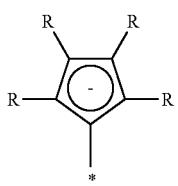

(In General Formula (2-3), * represents a binding site to $L^2$ in General Formula (a3), and R's each represent a cyano group or a fluorinated alkyl group, and preferably a cyano group.)

Hereinafter, specific examples of the repeating unit represented by General Formula (a3) used in the present invention are shown below, but the present invention is not limited thereto. Further, the specific examples show a state where the anionic moieties are not disassociated, but it is certain that a state where the anionic moieties are dissociated also falls into the range of the present invention.

(X-57)

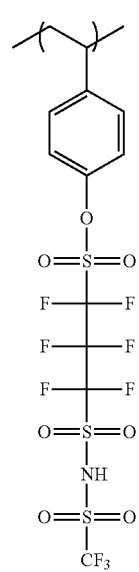

(X-58)

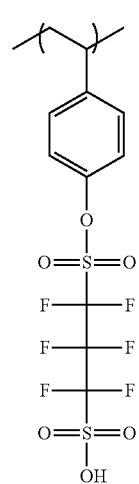

(X-59)

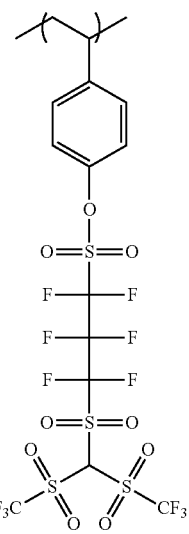

(X-60)

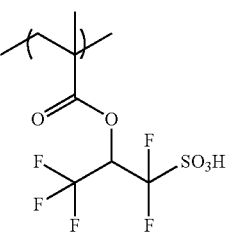

(X-61)

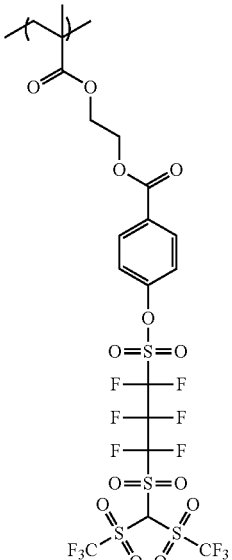

(X-62)

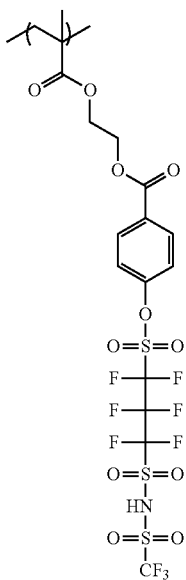

(X-63)

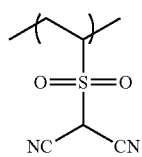

(X-64)

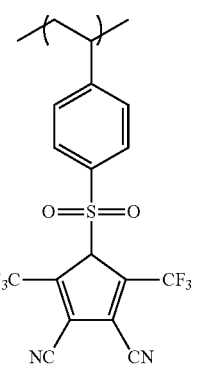

<<<Configuration of (A4)>>>

The configuration of the dye multimer (A4) is a dye multimer further including other cationic and anionic moieties. It is, for example, a dye multimer having a monomer having a dye structure, and a repeating unit having a cationic moiety, in which the monomer having a dye structure includes a corresponding anionic moiety.

For the repeating unit having a cationic moiety, reference can be made to the descriptions in paragraphs "0018" to "0061" of JP2011-242752A, the contents of which are incorporated herein Examples of the monomer having a dye structure, which includes a corresponding anionic moiety, include C. I. Acid Red 289.

For the specific examples of the dye multimer (A4), reference can be made to the description in paragraph "0165" of JP2011-242752A, the contents of which are incorporated herein.

The maximum absorption wavelength of the dye multimer is preferably 420 nm to 700 nm, and more preferably 450 nm to 650 nm.

The acid value of the dye multimer is preferably 5 mgKOH/g to 100 mgKOH/g, and more preferably 15 mgKOH/g to 60 mgKOH/g.

In the present invention, the proportion of the repeating units including structures derived from a dye in the dye multimer is preferably 10% by mole to 100% by mole, more preferably 50% by mole to 100% by mole, and particularly preferably 60% by mole to 100% by mole, with respect to 100% by mole of the total repeating units.

The weight-average molecular weight of the dye multimer is preferably 2,000 to 20,000, more preferably 3,000 to 15,000, and particularly preferably 4,000 to 10,000.

The weight-average molecular weight and the number-average molecular weight can be determined by gel permeation chromatography (GPC).

Moreover, a ratio [(Mw)/(Mn)] between the weight-average molecular weight (Mw) and the number average molecular weight (Mn) of the dye multimer is preferably 1.0 to 3.0, more preferably 1.6 to 2.5, and particularly preferably 1.6 to 2.0.

The glass transition temperature (Tg) of the dye multimer is preferably 50° C. or higher, and more preferably 100° C. or higher. Further, a 5% weight reduction temperature measured by thermogravimetric analysis (TGA measurement) is preferably 120° C. or higher, more preferably 150° C. or higher, and still more preferably 200° C. or higher.

In addition, the absorption coefficient (hereinafter described as $\epsilon'$. $\epsilon'=\epsilon$/average molecular weight, unit: L/g·cm) per unit weight of the dye multimer is preferably 30 or more, more preferably 60 or more, and still more preferably 100 or more. If the absorption coefficient is within this range, in the case where a color filter is manufactured using the colored composition of the present invention, a color filter having excellent color reproducibility can be manufactured.

The molar absorption coefficient of the dye multimer is preferably as high as possible from the viewpoint of coloring ability.

The reduced viscosity of the dye multimer is preferably 4.0 to 10.0, more preferably 5.0 to 9.0, and still more preferably 6.0 to 7.0, from the viewpoint of color migration. The reduced viscosity can be measured by using, for example, an Ubbelohde type viscometer.

The dye multimer is preferably a compound which is dissolved in the following solvent.

Examples of the solvent include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones(methyl ethyl ketone, cyclohexanone, 2-heptanone, and 3-heptanone), and aromatic hydrocarbons (for example, toluene and xylene). The dye multimer is dissolved in the amount of preferably 1% by mass to 50% by mass, more preferably 5% by mass to 40% by mass, and still more preferably 10% by mass to 30% by mass, with respect to these solvents. If the solubility is within this region, when the colored composition of the present invention is applied to the manufacture of a color filter or the like, preferable coating surface properties can be obtained or reduction in concentration caused by elution after coating of other colors can be decreased.

In the colored composition of the present invention, the dye multimer may be used alone or in combination of two or more kinds thereof. In the case of using two or more kinds, the total amount thereof preferably corresponds to the content which will be described later.

The content of the dye multimer (A) in the colored composition of the present invention is preferably determined after consideration of its content ratio relative to a pigment which will be described later.

The mass ratio of the dye multimer to the pigment (dye multimer (A)/pigment) is preferably 0.1 to 5, more preferably 0.2 to 2, and still more preferably 0.3 to 1.

The colored composition of the present invention may include known dyes other than the aforementioned dye multimer.

For example, reference can be made to the descriptions of JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. No. 4,808,501A, U.S. Pat. No. 5,667,920A, U.S. Pat. No. 505,950A, U.S. Pat. No. 5,667,920A, JP1993-333207A (JP-H05-333207A), JP1994-35183A (JP-H06-35183A), JP1994-51115A (JP-H06-51115A), JP1994-194828A (JP-H06-194828A), JP2010-250291A, JP2011-95732A, JP2012-13945A, JP2012-46708A, JP2012-46712A, JP2012-181502A, JP2012-208494A, JP2013-28764A, and JP2013-29760A, the contents of which are incorporated herein. With respect to the chemical structure, dyes such as a pyrazoleazo based-dye, a pyromethene based-dye, an anilinoazo based-dye, a triphenylmethane based-dye, an anthraquinone based-dye, a benzylidene based-dye, an oxonol based-dye, a pyrazolotriazole azo based-dye, a pyridoneazo based-dye, a cyanine based-dye, a phenothiazine based-dye, and a pyrrolopyrazoleazomethine-based dye can be used.

<<Solvent (B)>>

The colored composition of the present invention contains a solvent.

Basically, the solvent is not particularly limited as long as the solvent satisfies the solubility of the respective components or the coatability of the colored composition. In particular, it is preferable to select the solvent in consideration of the solubility, coatability, and safety of an ultraviolet absorber, the alkali-soluble resin, the dispersant, or the like.

Suitable examples of the solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, 3-heptanone, and cyclopentanone; and aromatic hydrocarbons such as toluene and xylene.

Among these, a solvent having a molecular weight in the range of 90 to 135, or a boiling point in the range of 120° C. to 160° C. is preferable from the viewpoint of drying after coating. Examples of the solvents corresponding to this include n-butyl acetate, propylene glycol monomethyl ether acetate, propylene glycol monomethyl ether, cyclohexanone, and cyclopentanone.

From the viewpoint of coatability, the content of the solvent in the colored composition is set such that the concentration of the total solid contents of the composition becomes preferably 5% by mass to 80% by mass, more preferably 5% by mass to 60% by mass, and particularly preferably 10% by mass to 50% by mass.

The composition of the present invention may include one kind or two or more kinds of solvent. In the case where the composition includes two or more kinds of the solvent, the total amount thereof is preferably within the range.

<Curable Compound>

The colored composition of the present invention preferably contains a curable compound.

As the curable compound, known polymerizable compounds which can be crosslinked by a radical, an acid, or heat can be used. Examples thereof include polymerizable compounds having an ethylenically unsaturated bond, a cyclic ether (epoxy or oxetane), methylol, or the like. From the viewpoint of sensitivity, the polymerizable compound is suitably selected from compounds having at least one and preferably two or more terminal ethylenically unsaturated bonds.

Among these, polyfunctional polymerizable compounds are preferable, polyfunctional polymerizable compounds having 4 or more functional groups are more preferable, polyfunctional polymerizable compounds having 5 or more functional groups are still more preferable, and polyfunctional polymerizable compounds having 6 or more functional groups are particularly preferable.

In particular, polyfunctional monomers (preferably having 4 or more functional groups, and more preferably having 6 or more functional groups), which are alkylene oxide-modified, are preferable.

Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a multimer thereof. The polymerizable compound in the present invention may be used alone or in combination of two or more kinds thereof.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic esters or amides having nucleophilic substituent such as a hydroxyl group, an amino group, or a mercapto group and monofunctional or polyfunctional isocyanates or epoxies, products of a dehydration condensation reaction between the unsaturated carboxylic esters or amides and a monofunctional or polyfunctional carboxylic acid, and the like are also suitably used. In addition, products of an addition reaction between unsaturated carboxylic esters or amides having an electrophilic substituent such as an isocyanate group or an epoxy group and monofunctional or polyfunctional alcohols, amines, or thiols, and products of a substitution reaction between unsaturated carboxylic esters or amides having an eliminatable substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraphs "0095" to "0108" of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. Examples of the compound include a monofunctional acrylate or methacrylate such as polyethylene glycol mono(meth)acrylate, polypropylene glycol mono (meth)acrylate, and phenoxyethyl (meth)acrylate; a compound which is obtained by adding ethylene oxide or propylene oxide to a polyfunctional alcohol, and then (meth) acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol(meth)acrylate, trimethylolpropane tri(acryloyloxypropyl)ether, tri(acryloyloxyethyl)isocyanurate, glycerin, and trimethylolethane; the urethane(meth)acrylates described in JP1973-41708B (JP-S48-41708B), JP1975-6034B (JP-S50-6034B), and JP1976-37193A (JP-S51-37193A); the polyester acrylates described in JP1973-64183A (JP-S48-64183A), JP1974-43191B (JP-S49-43191B), and JP1977-30490B (JP-S52-30490B); a polyfunctional acrylate or methacrylate such as epoxy acrylate as a product of a reaction between an epoxy resin and a (meth)acrylic acid; and a mixture thereof.

Other examples thereof include a polyfunctional (meth) acrylate which is obtained by reacting a polyfunctional carboxylic acid with a compound having a cyclic ether group such as glycidyl (meth)acrylate, and an ethylenically unsaturated group.

Furthermore, as other preferred polymerizable compounds, the compounds having a fluorene ring and an ethylenically unsaturated group having 2 or more functional groups described in JP2010-160418A, JP2010-129825A, and JP4364216B, and a cardo resin can also be used.

Moreover, as the compound which has a boiling point of 100° C. or higher under normal pressure and has at least one addition-polymerizable ethylenically unsaturated group, compounds described in paragraph Nos. "0254" to "0257" of JP2008-292970A are also suitable.

In addition to those above, radically polymerizable monomers represented by the following General Formulae (MO-1) to (MO-5) can also be used. Incidentally, in the formulae, in the case where T is an oxyalkylene group, the terminal at a carbon atom side binds to R.

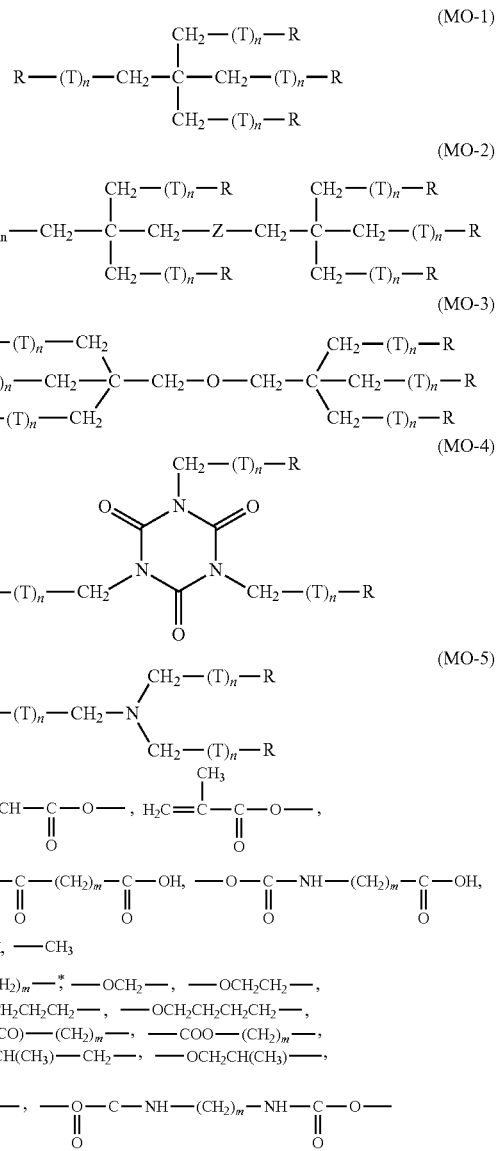

In General Formulae, n is 0 to 14, and m is 1 to 8. A plurality of R's and T's which are present in the same molecule may be the same as or different from each other.

In each of the polymerizable compounds represented by General Formulae (MO-1) to (MO-5), at least one of the plurality of R's represents a group represented by —OC(=O)CH=CH$_2$ or —OC(=O)C(CH$_3$)=CH$_2$.

As specific examples of the polymerizable compounds represented by General Formulae (MO-1) to (MO-5), the compounds described in paragraph Nos. "0248" to "0251" of JP2007-269779A can also be suitably used in the present invention.

In addition, a compound which is obtained by adding ethylene oxide or propylene oxide to the polyfunctional alcohol, which is described as General Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and a structure in which ethylene glycol or a propylene glycol residue is interposed between these (meth)acryloyl groups are preferable. Oligomer types of these can also be used.

The polymerizable compound may have an acid group such as a carboxyl group, a sulfonic acid group, and a phosphoric acid group, which is a polyfunctional monomer. If an ethylenic compound has an unreacted carboxyl group as in a case of the mixture as described above, it can be used as is, but if desired, a hydroxyl group of the aforementioned ethylenic compound may be reacted with a non-aromatic carboxylic anhydride so as to introduce an acid group thereinto. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, preferable is a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride. A monomer in which the aliphatic polyhydroxy compound in the ester is pentaerythritol and/or dipentaerythritol is particularly preferable. Examples of commercially available products thereof include M-510 and M-520, which are polybasic modified acryl oligomers manufactured by TOAGOSEI, CO., LTD.

These monomers may be used alone, but since it is difficult to use a single compound in production, two or more kinds thereof may be used as a mixture. Moreover, if desired, a polyfunctional monomer not having an acid group and a polyfunctional monomer having an acid group may be used in combination therewith as the monomer.

The acid value of the polyfunctional monomer having an acid group is preferably 0.1 mg KOH/g to 40 mg KOH/g, and particularly preferably 5 mg KOH/g to 30 mg KOH/g. If the acid value of the polyfunctional monomer is too low, the development solubility characteristics deteriorate. If the acid value is too high, difficulty is caused in the production and handleability, hence a photopolymerization performance deteriorates, which leads to deterioration of curability such as surface smoothness of pixels. Therefore, in the case where a combination of two or more kinds of polyfunctional monomers having different acid groups is used, or in the case where a combination of polyfunctional monomers not having an acid group is used, it is preferable to adjust the acid group such that the acid groups of all the polyfunctional monomers fall within the above range.

Furthermore, it is also a preferred embodiment that a polyfunctional monomer having a caprolactone structure is contained as a polymerizable compound.

The polyfunctional monomer having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polyfunctional monomer having a caprolactone structure represented by the following General Formula (Z-1) is preferable.

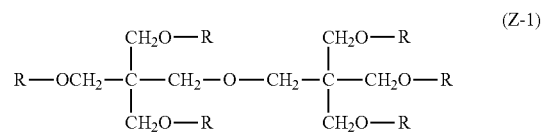

(Z-1)

In General Formula (Z-1), all of six R's are a group represented by the following General Formula (Z-2). Alternatively one to five out of six R's are a group represented by the following General Formula (Z-2), and the remainder is a group represented by the following General Formula (Z-3).

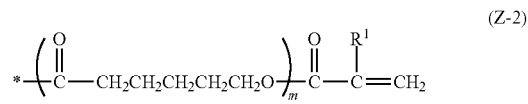

(Z-2)

In General Formula (Z-2), $R^1$ represents a hydrogen atom or a methyl group, m represents a number 1 or 2, and "*" represents a direct bond.

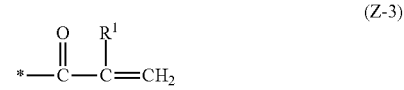

(Z-3)

In General Formula (Z-3), $R^1$ represents a hydrogen atom or a methyl group, and "*" represents a direct bond.

The polyfunctional monomer having such a caprolactone structure is commercially available from Nippon Kayaku Co., Ltd., as a KAYARAD DPCA series, and examples thereof include DPCA-20 (a compound in which m=1 in Formulae (1) to (3), the number of the groups represented by Formula (2)=2, and all of $R^1$'s are hydrogen atoms), DPCA-30 (a compound in which m=1 in the same formulae, the number of the groups represented by Formula (2)=3, and all of $R^1$'s are hydrogen atoms), DPCA-60 (a compound in which m=1 in the same formulae, the number of the groups represented by Formula (2)=6, and all of $R^1$'s are hydrogen atoms), and DPCA-120 (a compound in which m=2 in the same formulae, the number of the groups represented by Formula (2)=6, and all of $R^1$'s are hydrogen atoms).

In the present invention, the polyfunctional monomer having a caprolactone structure can be used alone or as a mixture of two or more kinds thereof.

Moreover, the specific monomer in the present invention is preferably at least one kind selected from a group of compounds represented by the following General Formula (Z-4) or General Formula (Z-5).

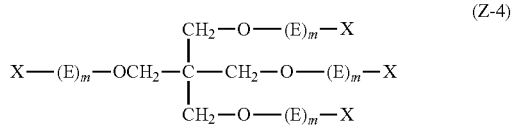

(Z-4)

-continued

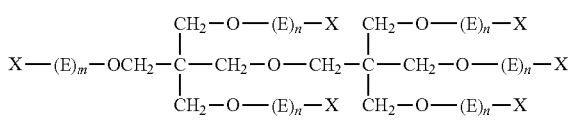
(Z-5)

In General Formulae (Z-4) and (Z-5), E's each independently represent —((CH$_2$)yCH$_2$O)— or —((CH$_2$)yCH(CH$_3$)O)—, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Herein, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Herein, in the case where the sum of the respective n's is 0, any one of X's is a carboxyl group.

In General Formula (Z-4), m is preferably an integer of 0 to 6, and more preferably an integer of 0 to 4. Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —((CH$_2$)yCH$_2$O)— or —((CH$_2$)yCH(CH$_3$)O)— in General Formula (Z-4) or General Formula (Z-5) is preferably in the form in which the terminal at an oxygen atom side binds to X.

The compound represented by General Formula (Z-4) or General Formula (Z-5) may be used alone or in combination of two or more kinds thereof. In particular, a form in which all of six X's in General Formula (Z-5) are an acryloyl group is preferable.

Moreover, the total content of the compound represented by General Formula (Z-4) or General Formula (Z-5) in the polymerizable compound is preferably 20% by mass or more, and more preferably 50% by mass or more.

The compound represented by General Formula (Z-4) or General Formula (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. The respective steps are well-known and a person skilled in the art can easily synthesize the compound represented by General Formula (Z-4) or General Formula (Z-5).

Among the compounds represented by General Formula (Z-4) or General Formula (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

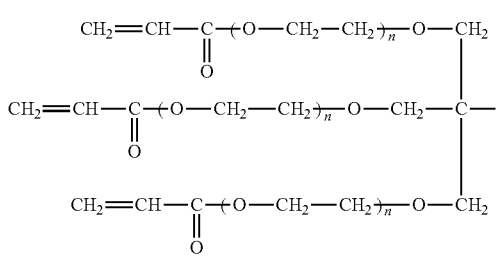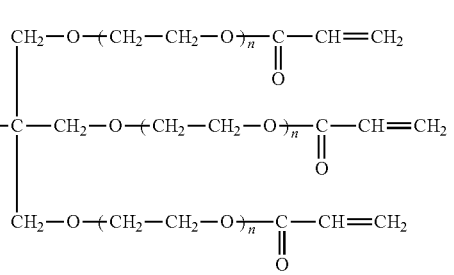

(a)

(the sum of the respective n's is 6)

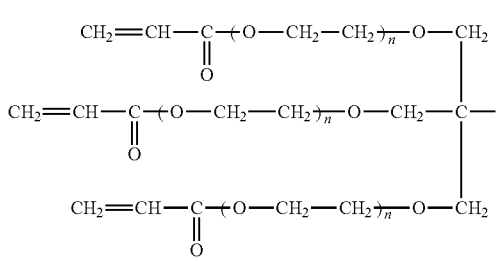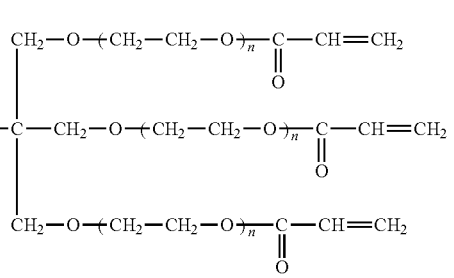

(b)

(the sum of the respective n's is 12)

-continued

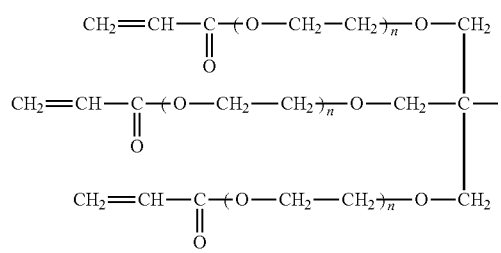 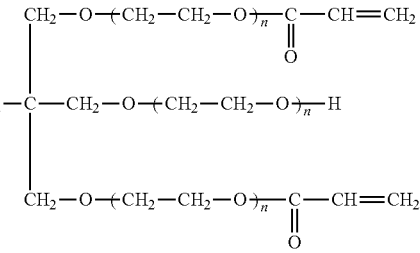

(c)

(the sum of the respective n's is 12)

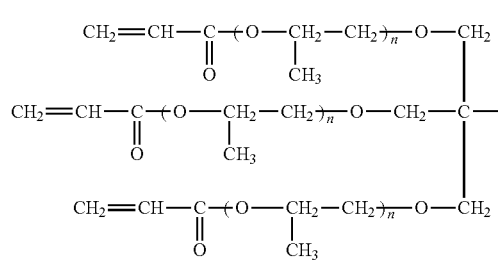 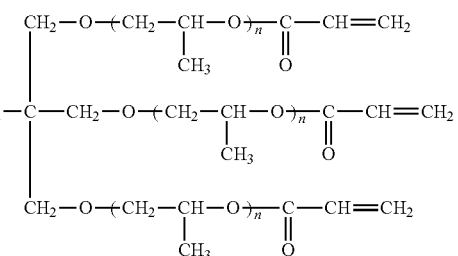

(d)

(the sum of the respective n's is 6)

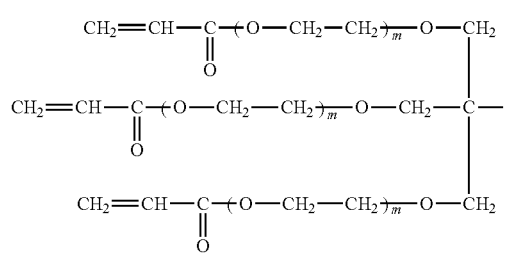 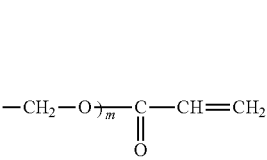

(e)

(the sum of the respective m's is 4)

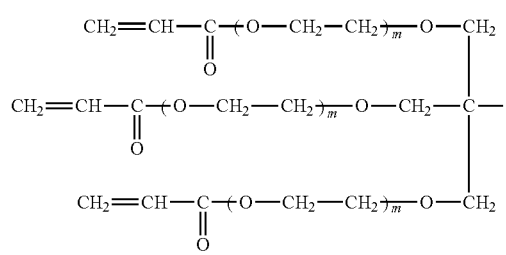 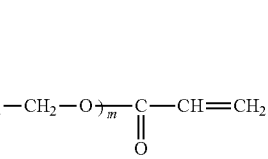

(f)

(the sum of the respective m's is 12)

Examples of commercially available products of the polymerizable compounds represented by General Formula (Z-4) or General Formula (Z-5) include SR-494 which is a tetrafunctional acrylate having four ethyleneoxy chains, manufactured by Sartomer Company, Inc., and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

As the cyclic ether (epoxy or oxetane), examples of a bisphenol A type epoxy resin, which have an epoxy group, include JER-827, JER-828, JER-834, JER-1001, JER-1002, JER-1003, JER-1055, JER-1007, JER-1009, and JER-1010 (all manufactured by Japan Epoxy Resins Co., Ltd.), and EPICLON 860, EPICLON 1050, EPICLON 1051, and EPICLON 1055 (all manufactured by DIC Corporation); examples of a bisphenol F type epoxy resin include JER-806, JER-807, JER-4004, JER-4005, JER-4007, and JER-4010 (all manufactured by Japan Epoxy Resins Co., Ltd.), EPICLON 830 and EPICLON 835 (both manufactured by DIC Corporation), and LCE-21 and RE-602S (all manufactured by Nippon Kayaku Co., Ltd.); examples of a phenol novolac type epoxy resin include JER-152, JER-154, JER-157S70, and JER-157S65 (all manufactured by Japan Epoxy Resins Co., Ltd.), and EPICLON N-740, EPICLON N-770, and EPICLON N-775 (all manufactured by DIC Corporation); examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (all manufactured by Nippon Kayaku Co., Ltd.); and examples of an aliphatic epoxy resin include ADEKA RESIN EP-4080S, ADEKA RESIN EP-4085S, and ADEKA RESIN EP-4088S (all manufactured by ADEKA CORPORATION), CELLOXIDE 2021P, CELLOXIDE 2081, CELLOXIDE 2083, CELLOXIDE 2085, EHPE-3150 (a 1,2-epoxy-4-(2-oxiranyl(cyclohexane adduct of 2,2-bis(hydroxymethyl)-1-butanol), EPOLEAD PB 3600, and EPOLEAD PB 4700 (all manufactured by Daicel Chemical Industries, Ltd.), DENACOL EX-211L, EX-212L, EX-214L, EX-216L, EX-321L, and EX-850L (all manufactured by Nagase ChemteX Corporation), ADEKA RESIN EP-4000S, ADEKA RESIN EP-4003S, ADEKA RESIN EP-4010S, and ADEKA RESIN EP-4011S (all manufactured by ADEKA CORPORATION), NC-2000, NC-3000, NC-7300, XD-1000, EPPN-501, and EPPN-502 (all manufactured by ADEKA CORPORATION), and JER-1031S (manufactured by Japan Epoxy Resins Co., Ltd.). Such polymerizable compounds are suitable for a case of forming a pattern by a dry etching method.

Details of how to use these polymerizable compounds, such as the structure, whether the polymerizable compounds are used singly or used in combination thereof, and the amount of the polymerizable compounds added, can be arbitrarily set according to the designed final performance of the colored composition. For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the colored composition, it is preferable that the polymerizable compound has 3 or more functional groups. In addition, a method for adjusting both the sensitivity and the strength by using a combination of compounds which differ in the number of functional groups and have different polymerizable groups (for example, an acrylic ester, a methacrylic ester, a styrene-based compound, and a vinylether-based compound) is also effective. Further, it is preferable to use polymerizable compounds having 3 or more functional groups and differing in the length of an ethylene oxide chain since the developability of the colored composition can be adjusted, and excellent pattern formability is obtained.

In addition, from the viewpoints of the compatibility with other components (for example, a photopolymerization initiator, a substance to be dispersed, and an alkali-soluble resin) contained in the colored composition, and the dispersibility, how to select and use the polymerizable compound is an important factor. For example, if a low-purity compound is used or a combination of two or more kinds thereof is used, the compatibility can be improved in some cases. In addition, from the viewpoint of improving the adhesiveness of the composition to a hard surface of a support or the like, specific structures may be selected in some cases.

The content of the curable compound in the composition of the present invention is preferably 0.1% by mass to 90% by mass, more preferably 1.0% by mass to 60% by mass, and particularly preferably 2.0% by mass to 40% by mass, with respect to the total solid contents of the composition.

The composition of the present invention may include one kind or two or more kinds of curable compound. In the case where the composition includes two or more kinds of curable compound, the total amount thereof is preferably within the range.

<Pigment>

It is preferable that the colored composition of the present invention further contains a pigment (C).

As the pigment used in the present invention, various inorganic or organic pigments known in the related art can be used, and the organic pigments are preferable. As the pigment, one having a high transmittance is preferable.

Examples of the inorganic pigment include metal compounds represented by a metal oxide, a metal complex salt, or the like, and specific examples thereof include metal oxides of iron, cobalt, aluminum, cadmium, lead, copper, titanium, magnesium, chromium, zinc, antimony, and the like, complex oxides of the metals, and black pigments such as carbon black and titanium black.

Examples of the organic pigment include:

C. I. Pigment Yellow 11, 24, 31, 53, 83, 93, 99, 108, 109, 110, 138, 139, 147, 150, 151, 154, 155, 167, 180, 185, 199;

C. I. Pigment Orange 36, 38, 43, 71;

C. I. Pigment Red 81, 105, 122, 149, 150, 155, 171, 175, 176, 177, 209, 220, 224, 242, 254, 255, 264, 270;

C. I. Pigment Violet 19, 23, 32, 39;

C. I. Pigment Blue 1, 2, 15, 15:1, 15:3, 15:6, 16, 22, 60, 66;

C. I. Pigment Green 7, 36, 37, 58;

C. I. Pigment Brown 25, 28; and

C. I. Pigment Black 1.

Examples of the pigment which can be preferably used in the present invention include the following ones, but the present invention is not limited thereto:

C. I. Pigment Yellow 11, 24, 108, 109, 110, 138, 139, 150, 151, 154, 167, 180, 185, C. I. Pigment Orange 36, 71, C. I. Pigment Red 122, 150, 171, 175, 177, 209, 224, 242, 254, 255, 264, C. I. Pigment Violet 19, 23, 32, C. I. Pigment Blue 15:1, 15:3, 15:6, 16, 22, 60, 66, C. I. Pigment Green 7, 36, 37, 58, and C. I. Pigment Black 1.

These organic pigments can be used alone or in various combinations for spectral adjustment or improvement of color purity. Specific examples of the combination are shown below. For example, as a red pigment, an anthraquinone-based pigment, a perylene-based pigment, or a diketopyrrolopyrrole-based pigment can be used alone or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigment with C. I. Pigment Yellow 139 is preferable. The mass ratio of the red pigment to the yellow pigment is preferably 100:5 to 100:50. If the mass ratio is 100:4 or less, it is difficult to reduce the light transmittance at 400 nm to 500 nm, and if it is 100:51 or more, a dominant wavelength moves closer to a short wavelength, so a color separating power cannot be improved in some cases. In particular, the mass ratio is optimally in a range of 100:10 to 100:30. Moreover, in a case of a combination of red pigments, the mass ratio can be adjusted according to the required spectrum.

In addition, as a green pigment, a halogenated phthalocyanine-based pigment can be used alone or as a mixture of this pigment with a disazo-based yellow pigment, a quinophthalone-based yellow pigment, an azomethine-based yellow pigment, or an isoindoline-based yellow pigment. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used alone or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

Moreover, as a pigment for a black matrix, carbon, titanium black, iron oxide, or titanium oxide may be used alone or as a mixture, and a combination of carbon with titanium black is preferable. The mass ratio between carbon and titanium black is preferably in a range of 100:0 to 100:60.

For the colored composition of the present invention, it is preferable to blend pigments other than a black one, which is suitable for a blue pigment.

In the case where the colored composition is used for a color filter, the primary particle size of the pigment is preferably 100 nm or less from the viewpoints of color unevenness or contrast. From the viewpoint of dispersion stability, the primary particle size is preferably 5 nm or more. The primary particle size of the pigment is more preferably 5 nm to 75 nm, still more preferably 5 nm to 55 nm, and particularly preferably 5 nm to 35 nm The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are particularly preferable.

As the pigment, a phthalocyanine pigment is particularly preferable.

In the case where a phthalocyanine pigment is used as the pigment, the mass ration of the phthalocyanine pigment to the aforementioned dye multimer is preferably (90):(10) to (50):(50), and more preferably (70):(30) to (60):(40).

The content of the pigment is preferably 10% by mass to 70% by mass, more preferably 20% by mass to 60% by mass, and still more preferably 25% by mass to 50% by mass, with respect to the total components excluding a solvent, contained in the colored composition.

In the case where a phthalocyanine pigment is used as a pigment, the content of the phthalocyanine pigment is preferably (60)% by mass to (25)% by mass % by mass, more preferably (50)% by mass to (30)% by mass % by mass, and still more preferably (45)% by mass to (35)% by mass % by mass, with respect to the total components excluding a solvent, contained in the colored composition.

The composition of the present invention may include one kind or two or more kinds of pigment. In the case where the composition includes two or more kinds of pigment, the total amount thereof is preferably within the range.

<Photopolymerization Initiator>

From the viewpoint of further improving sensitivity, it is preferable that the colored composition of the present invention contains a photopolymeriation initiator.

The photopolymerization initiator is not particularly limited as long as the photopolymerization initiator has an ability of initiating polymerization of the polymerizable compound, and can be appropriately selected from known photopolymerization initiators. For example, photopolymerization initiators sensitive to light rays in a range from ultraviolet region to visible light are preferable. In addition, the photopolymerization initiator may be either an activator which interacts with a photo-excited sensitizer in any way and generates active radicals or an initiator which initiates cationic polymerization according to the type of monomer.

Furthermore, it is preferable that the photopolymerization initiator contains at least one kind of compound having at least a molar absorption coefficient of about 50 in a range of about 300 nm to 800 nm (more preferably 330 nm to 500 nm).

Examples of the photopolymerization initiator include halogenated hydrocarbon derivatives (for example, a derivative having a triazine skeleton, and a derivative having an oxadiazole skeleton), acyl phosphine compounds such as acyl phosphine oxide, oxime compounds such as hexaaryl biimidazole and oxime derivatives, organic peroxides, thio compounds, ketone compounds, aromatic onium salts, ketoxime ethers, aminoacetophenone compounds, and hydroxyacetophenone, among which oxime compounds are preferable.

Furthermore, from the viewpoint of exposure sensitivity, the compound is preferably a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triaryl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound.

The compound is more preferably a trihalomethyl triazine compound, an α-aminoketone compound, an acyl phosphine compound, a phosphine oxide compound, an oxime compound, a triaryl imidazole dimer, a triaryl imidazole compound, a benzimidazole compoumd, an onium compound, a benzophenone compound, or an acetophenone compound, and particularly preferably at least one kind of compound selected from a group consisting of a trihalomethyl triazine compound, an α-aminoketone compound, an oxime compound, a triaryl imidazole compound, a benzophenone compound, and a benzimidazole compoumd. Further, the triarylimidazole compound may be a mixture thereof with benzimidazole.

Specifically, the trihalomethyltriazine compound is exemplified as follows. Incidentally Ph is a phenyl group.

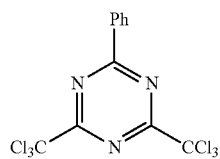

As the triarylimidazole compound and the benzimidazole compound, the following compounds are exemplified.

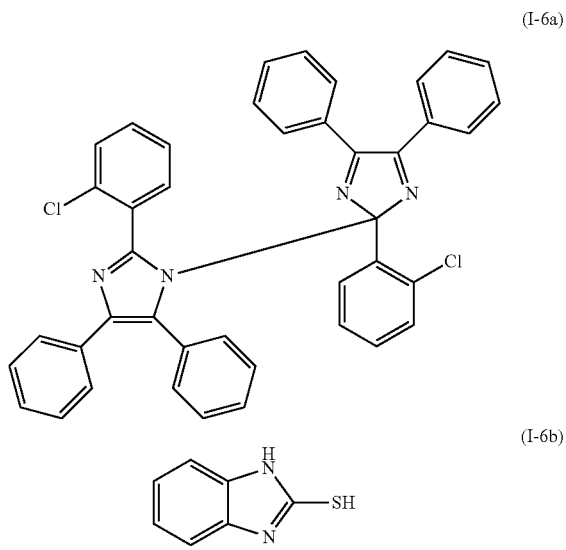

(I-6a)

(I-6b)

As the trihalomethyltriazine compound, a commercially available product can also be used, and for example, TAZ-107 (manufactured by Midori Kagaku Co., Ltd.) can also be used.

Particularly in the case where the colored composition of the present invention is used for the manufacture of a color filter included in a solid-state image sensor, a fine pattern needs to be formed in a sharp shape. Accordingly it is important that the composition has curability and is developed without residues in an unexposed area. From this viewpoint, it is particularly preferable to use an oxime compound as a polymerization initiator. In particular, in the case where a fine pattern is formed in the solid-state image sensor, stepper exposure is used for exposure for curing. However, the exposure machine used at this time is damaged by halogen in some cases, so it is necessary to reduce the amount of a polymerization initiator added. In consideration of this point, in order to form a fine pattern as in a solid-state image sensor, it is particularly preferable to use an oxime compound as the photopolymerization initiator (D).

Examples of the halogenated hydrocarbon compound having a triazine skeleton include the compounds described in Wakabayashi, et al., Bull. Chem. Soc. Japan, 42, 2924 (1969), the compounds described in UK1388492B, the compounds described in JP1978-133428A (JP-S53-133428A), the compounds described in GE3337024B, the compound described in F. C. Schaefer, et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A, in particular, the compounds described in paragraph No. "0075" of JP2013-077009A.

In addition, as photopolymerization initiators other than those above, acridine derivatives are exemplified. Specific examples thereof include the compound described in paragraph No. "0076" of JP2013-077009A, the contents of which are incorporated herein.

Examples of the ketone compound include the compound described in paragraph No. "0077" of JP2013-077009A, the contents of which are incorporated herein.

As the photopolymerization initiator, a hydroxyacetophenone compound, an aminoacetophenone compound, and an acyl phosphine compound can also be suitably used. More specifically, for example, the amino acetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (product names, all manufactured by BASF) can be used. As the aminoacetophenone-based initiator, IRGACURE-907, IRGACURE-369, and IRGACURE-379 (product names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used. Moreover, as the acyl phosphine-based initiator, IRGACURE-819 or DAROCUR-TPO (product name, both manufactured by BASF) which are commercially available products can be used.

Examples of the photopolymerization initiator more preferably include oxime compounds. As specific examples of the oxime compounds, the compound described in JP2001-233842A, the compound described in JP2000-80068A, or the compound described in JP2006-342166A can be used.

Examples of the oxime compound such as an oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include the compounds described in J. C. S. Perkin II (1979), pp. 1653-1660, J. C. S. Perkin II (1979), pp. 156-162, Journal of Photopolymer Science and Technology (1995), pp. 202-232, and JP2000-66385A; and the compounds described respectively in JP2000-80068A, JP2004-534797A, and JP2006-342166A.

As the commercially available product, IRGACURE-OXE01 (manufactured by BASF) and IRGACURE-OXE02 (manufactured by BASF) are also suitably used.

Furthermore, as oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a dye moiety, the ketoxime compound described in WO2009/131189A, the compound described in U.S. Pat. No. 7,556,910B which contains a triazine skeleton and an oxime skeleton in the same molecule, the compound described in JP2009-221114A, which has maximum absorption at 405 nm and has excellent sensitivity to a light source of a g-ray, and the like may be used.

The cyclic oxime compounds described in JP2007-231000A and JP2007-322744A can also be suitably used. Among the cyclic oxime compounds, the cyclic oxime compounds ring-fused to a carbazole dye, which are described in JP2010-32985A and JP2010-185072A, are preferable from the viewpoint of high sensitivity since these compounds have high light absorptivity.

Furthermore, the compound described in JP2009-242469A, which is an oxime compound having an unsaturated bond in a specific moiety, can also be suitably used since this compound makes it possible to improve sensitivity by reproducing active radicals from polymerization-inactive radicals.

Particularly preferred examples of the oxime compounds include the oxime compound having a specific substituent described in JP2007-269779A and the oxime compound having a thioaryl group described in JP2009-191061A.

Specifically, the oxime compound which is a photopolymerization initiator is preferably a compound represented by the following General Formula (OX-1). Incidentally the compound may be an oxime compound in which an N—O bond of oxime forms an (E) isomer, an oxime compound in which the N—O bond forms a (Z) isomer, or a mixture in which the N—O bond forms a mixture of an (E) isomer and a (Z) isomer.

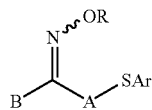

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the above substituents may be further substituted with other substituents.

Examples of the substituents include a halogen atom, an aryloxy group, an alkoxycarbonyl or aryloxycarbonyl group, an acyloxy group, an acyl group, an alkyl group, and an aryl group.

As the alkyl group, an alkyl group having 1 to 30 carbon atoms is preferable, and specifically, reference can be made to paragraph "0025" of JP2009-191061A, the contents of which are incorporated herein.

As the aryl group, an aryl group having 6 to 30 carbon atoms is preferable, and specifically, reference can be made to paragraph "0026" of JP2009-191061A, the contents of which are incorporated herein.

As the acyl group, an acyl group having 2 to 20 carbon atoms is preferable, and specifically, reference can be made to paragraph "0033" of JP2009-191061A, the contents of which are incorporated herein.

As the alkoxycarbonyl group, an alkoxycarbonyl group having 2 to 20 carbon atoms is preferable, and specifically, reference can be made to paragraph "0034" of JP2009-191061A, the contents of which are incorporated herein.

As the aryloxycarbonyl group, specifically, an aryloxycarbonyl group having 6 to 30 carbon atoms is preferable and reference can be made to paragraph "0035" of JP2009-191061A, the contents of which are incorporated herein.

As the heterocyclic group, an aromatic or aliphatic heterocyclic group containing a nitrogen atom, an oxygen atom, a sulfur atom, or a phosphorous atom is preferable.

Specifically, reference can be made to paragraph "0037" of JP2009-191061A, the contents of which are incorporated herein.

As the alkylthiocarbonyl group, specifically, an alkylthiocarbonyl group having 1 to 20 carbon atoms is preferable and reference can be made to paragraph "0038" of JP2009-191061A, the contents of which are incorporated herein.

As the arylthiocarbonyl group, specifically, an arylthiocarbonyl group having 6 to 30 carbon atoms is preferable and reference can be made to paragraph "0039" of JP2009-191061A, the contents of which are incorporated herein.

In General Formula (OX-1), the monovalent substituent represented by B represents an aryl group, a heterocyclic group, an arylcarbonyl group, or a heterocyclic carbonyl group. Further, these groups may have at least one substituent. Examples of the substituent include the aforementioned substituents. Further, the aforementioned substituent may be further substituted with another substituent.

Among these, particularly preferably, reference can be made to paragraph "0044" of JP2009-191061A, the contents of which are incorporated herein.

In Formula (OX-1), examples of the divalent organic group represented by A include an alkylene group having 1 to 12 carbon atoms, a cycloalkylene group, and an alkynylene group. Further, these groups may have one or more substituents. Examples of the substituents include the aforementioned substituents. In addition, the aforementioned substituents may be substituted with other substituents.

Among these, as A in Formula (OX-1), in view of improving sensitivity and inhibiting coloring caused by the elapse of time during heating, an unsubstituted alkylene group, an alkylene group substituted with an alkyl group (for example, a methyl group, an ethyl group, a tert-butyl group, and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group, and a styryl group) are preferable.

In Formula (OX-1), the aryl group represented by Ar is preferably an aryl group having 6 to 30 carbon atoms, and may have a substituent. Examples of the substituent include the same ones as the substituents exemplified above as specific examples of the aryl group that may have a substituent and introduced into the substituted aryl group.

Among these, in view of improving sensitivity and inhibiting coloring caused by the elapse of time during heating, a substituted or unsubstituted phenyl group is preferable.

In Formula (OX-1), for a preferred structure of "SAr" that is formed of Ar and S adjacent thereto in Formula (OX-1), reference can be made to the description of paragraph "0049" of JP2009-191061A, the contents of which are incorporated herein.

For the oxime compound, reference can be made to the description of paragraphs "0050" to "0106" of JP2009-191061A, the contents of which are incorporated herein.

The oxime compound has a maximum absorption wavelength in a wavelength region of 350 nm to 500 nm and preferably has an absorption wavelength in a wavelength region of 360 nm to 480 nm, and an oxime compound showing a high absorbance at 365 nm and 455 nm is particularly preferable.

From the viewpoint of sensitivity, the molar absorption coefficient at 365 nm or 405 nm of the oxime compound is preferably 1,000 to 300,000, and more preferably 2,000 to 300,000, and particularly preferably 5,000 to 200,000.

The molar absorption coefficient of the compound can be measured using a known method, but specifically, it is preferable to measure the molar absorption coefficient by means of, for example, an ultraviolet-visible spectrophotometer (Carry-5 spectrophotometer manufactured by Varian) by using an ethyl acetate solvent at a concentration of 0.01 g/L.

In the case where the colored composition of the present invention contains the photopolymerization initiator, the content of the photopolymerization initiator is preferably 0.1% by mass to 50% by mass, more preferably 0.5% by mass to 30% by mass, and still more preferably 1% by mass to 20% by mass, with respect to the total solid contents of the colored composition. Within this range, improved sensitivity and pattern formability are obtained.

The composition of the present invention may include one kind or two or more kinds of photopolymerization initiator. In the case where the composition includes two or more kinds of the photopolymerization initiator, the total amount thereof is preferably within the range.

<Pigment Dispersant>

In the case where the colored composition of the present invention has a pigment, a pigment dispersant can be used in combination with other components, as desired.

Examples of the pigment dispersant which can be used in the present invention include polymer dispersants [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate], surfactants such as a polyoxyethylene alkyl phosphoric ester, a polyoxyethylene alkylamine, and an alkanolamine; and pigment derivatives.

The polymer dispersants can be further classified into straight-chain polymers, terminal-modified polymers, graft type polymers, and block type polymers, according to the structure.

Examples of the terminal-modified polymers which have a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H09-77994), and the like. Moreover, a polymer obtained by introducing two or more moieties (acid groups, basic groups, partial skeletons of an organic dye, heterocycles, or the like) anchored to the pigment surface into a polymer terminal as described in JP2007-277514A is also preferable since this polymer is excellent in dispersion stability.

Examples of the graft polymers having a moiety anchored to the pigment surface include a polyester-based dispersant and the like, and specific examples thereof include a product of a reaction between a poly(lower alkyleneimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, WO2010/110491A, and the like, a graft polymer having a partial skeleton or a heterocycle of an organic dye, which is described in JP2003-238837A, JP2008-9426A, JP2008-81732A, and the like, and a copolymer of a macromonomer and an acid group-containing monomer, which is described in JP2010-106268A, and the like. In particular, an amphoteric dispersion resin having basic and acid groups, which is described in JP2009-203462A, is particularly preferable from the viewpoint of dispersibility of a pigment dispersion, dispersion stability, and developability which a colored composition using the pigment dispersant exhibits.

As the macromonomer used in production of a graft polymer having a moiety anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI, CO., LTD.; Placcel FM 5 (a product obtained by adding 5 molar equivalents of c-caprolactone to 2-hydroxyethyl methacrylate) and FA10L (a product obtained by adding 10 molar equivalents of ε-caprolactone to 2-hydroxyethyl acrylate) manufactured by Daicel Chemical Industries, LTD.; a polyester-based macromonomer described in JP1990-272009A (JP-H02-272009A), and the like. Among these, from the viewpoints of dispersibility of the pigment dispersion, dispersion stability, and the developability which the colored composition using the pigment dispersion exhibits, the polyester-based macromonomer excellent in flexibility and solvent compatibility is particularly preferable. Further, a polyester-based macromonomer represented by the polyester-based macromonomer described in JP 1990-272009A (JP-H02-272009A) is particularly preferable.

As the block polymer having a moiety anchored to the pigment surface, block polymers described in JP2003-49110A, JP2009-52010A, and the like are preferable.

The pigment dispersants which can be used in the present invention can be obtained in the form of commercially available products, and specific examples thereof include "DA-7301" manufactured by Kusumoto Chemicals, Ltd., "Disperbyk-101 (polyamide amine phosphate), 107 (carboxylic ester), 110, 111 (copolymer including an acid group), 130 (polyamide), 161, 162, 163, 164, 165, 166, and 170 (polymeric copolymer)", and "BYK-P104 and P105 (high-molecular-weight unsaturated polycarboxylic acid)", manufactured by BYK-Chemie, "EFKA 4047, 4050 to 4010 to 4165 (polyurethane-based dispersant), EFKA 4330 to 4340

(block copolymer), 4400 to 4402 (modified polyacrylate), 5010 (polyesteramide), 5765 (high-molecular-weight polycarboxylic acid salt), 6220 (aliphatic polyester), 6745 (phthalocyanine derivative), and 6750 (azo pigment derivative)" manufactured by EFKA, "Ajisper PB821, PB822, PB880, and PB881" manufactured by Ajinomoto Fine-Techno Co., Inc., "Flowlen TG-710 (urethane oligomer)" and "Polyflow No. 50E, No. 300 (acrylic copolymer)", manufactured by KYOEISHA CHEMICAL Co., LTD., "Disparlon KS-860, 873SN, 874, #2150 (aliphatic polyvalent carboxylic acid), #7004 (polyether ester), DA-703-50, DA-705, and DA-725", manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid)", "Emulgen 920, 930, 935, and 985 (polyoxyethylene nonyl phenyl ether)", and "Acetamine 86 (stearylamine acetate)", manufactured by Kao Corporation, "Solsperse 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "Nikkol T106 (polyoxyethylene sorbitan monooleate) and MYS-IEX (polyoxyethylene monostearate)" manufactured by NIKKO CHEMICALS Co., Ltd., "Hinoact T-8000E" and the like manufactured by Kawaken Fine Chemicals Co., Ltd., "organosiloxane polymer KP341" manufactured by Shin-Etsu Chemical Co., Ltd., cationic surfactants such as "W001" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA SANGYO Corporation, polymer dispersants such as "Disperse aid 6, Disperse aid 8, Disperse aid 15, and Disperse aid 9100" manufactured by SAN NOPCO Ltd., "Adeka Pluronic L31, F38, L42, L44, L61, L64, F68, L72, P95, F77, P84, F87, P94, L101, P103, F108, L121, and P-123" manufactured by ADEKA CORPORATION, and "Ionet (product name) S-20" manufactured by Sanyo Chemical Industries, Ltd.

These pigment dispersants may be used alone or in combination of two or more kinds thereof. In the present invention, it is particularly preferable to use a combination of a pigment derivative and a polymer dispersant. Further, the pigment dispersant may be used in combination with an alkali-soluble resin, together with a terminal-modified polymer having a moiety anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161A) are also preferable. Specifically, as the alkali-soluble resins, a copolymer of benzyl methacrylate/methacrylic acid/2-hydroxyethyl methacrylate is exemplified.

In the case where the colored composition contains a pigment dispersant, the total content of the pigment dispersant in the colored composition is preferably 1 part by mass to 80 parts by mass, more preferably 5 parts by mass to 70 parts by mass, and still more preferably 20 parts by mass to 40 parts by mass, with respect to 100 parts by mass of the pigment.

The composition of the present invention may include one kind or two or more kinds of pigment dispersant. In the case where the composition includes two or more kinds of the pigment dispersant, the total amount thereof is preferably within the range.

Specifically in the case where a polymer dispersant is used, the amount of the polymer dispersant used is preferably 5 parts by mass to 100 parts by mass, and more preferably 10 parts by mass to 80 parts by mass, with respect to 100 parts by mass of the pigment.

Moreover, in the case where a pigment derivative is used in combination with other components, the amount of the pigment derivative used is preferably 1 part by mass to 30 parts by mass, more preferably 3 parts by mass to 20 parts by mass, and particularly preferably 5 parts by mass to 15 parts by mass, in terms of mass, with respect to 100 parts by mass of the pigment.

In the colored composition, from the viewpoint of curing sensitivity and color density, the total content of the coloring agent components and the pigment dispersant components is preferably 50% by mass to 90% by mass, more preferably 55% by mass to 85% by mass, and still more preferably 60% by mass to 80% by mass, with respect to the total solid contents constituting the colored composition.

<Alkali-Soluble Resin>

It is preferable that the colored composition of the present invention further contains an alkali-soluble resin.

The molecular weight of the alkali-soluble resin is not particularly defined, but Mw is preferably 5,000 to 100,000. Further, Mn is preferably 1,000 to 20,000.

The weight-average molecular weight of the compound used in the present invention is defined as a value in terms of polystyrene by GPC measurement. The weight-average molecular weight and the number-average molecular weight can be determined, for example, with HLC-8220 (manufactured by Tosoh Corporation) by using TSKgel Super AWM-H (manufactured by Tosoh Corporation, 6.0 mm ID×15.0 cm) as a column and a 10 mmol/L solution of lithium bromide in N-methylpyrrolidone (NMP) as an eluent.

The alkali-soluble resin can be appropriately selected from alkali-soluble resins which are linear organic high molecular-weight polymers and have at least one group enhancing alkali-solubility in a molecule (preferably a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable. Further, from the viewpoint of controlling developability, an acryl-based resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include a (meth)acrylic acid. These acid groups may be used alone or in combination of two or more kinds thereof.

Examples of the monomer which can give the acid group after polymerization include monomers having a hydroxyl group, such as 2-hydroxyethyl(meth)acrylate, monomers having an epoxy group, such as glycidyl(meth)acrylate, and monomers having an isocyanate group, such as 2-isocyanatoethyl(meth)acrylate. The monomers for introducing these acid groups may be used alone or in combination of two or more kinds thereof. In order to introduce the acid group into the alkali-soluble resin, for example, the monomer having the acid group and/or the monomer which can give the acid group after polymerization (hereinafter referred to as a "monomer for introducing an acid group" in some cases) may be polymerized as a monomer component.

Incidentally in the case where a monomer which can give the acid group after polymerization is used as a monomer component to introduce the acid group, a treatment for giving the acid group, as will be described later, needs to be performed after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl(meth)acrylate, aryl(meth)acrylate, and a vinyl compound. Examples of the alkyl(meth)acrylate and aryl (meth)acrylate include methyl(meth)acrylate, ethyl(meth) acrylate, propyl(meth)acrylate, butyl(meth)acrylate, isobutyl(meth)acrylate, pentyl(meth)acrylate, hexyl(meth) acrylate, octyl(meth)acrylate, phenyl(meth)acrylate, benzyl (meth)acrylate, tolyl(meth)acrylate, naphthyl(meth)acrylate, and cyclohexyl(meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP 1998-300922A (JP-H10-300922A) include N-phenylmaleimide and N-cyclohexylmaleimide. Incidentally, other monomers copolymerizable with a (meth)acrylic acid may be used alone or in combination of two or more kinds thereof.

It is also preferable that a polymer (a) obtained by polymerizing monomer components including a compound represented by the following General Formula (ED) (hereinafter also referred to as an "ether dimer" in some cases) as an essential component is included as the alkali-soluble resin.

General Formula (ED)

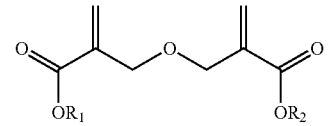

In General Formula (ED), $R^1$ and $R^2$ each independently represent a hydrogen atom or a hydrocarbon group having 1 to 25 carbon atoms, which may have a substituent.

Thus, the colored composition of the present invention can form a coating film which is extremely excellent in heat resistance as well as transparency. In General Formula (ED), which represents the ether dimer, examples of the hydrocarbon group having 1 to 25 carbon atoms, which may have a substituent, represented by $R^1$ and $R^2$ are not particularly limited, and include a linear or branched alkyl group such as a methyl, ethyl, n-propyl, isopropyl, n-butyl, isobutyl, tert-butyl, tert-amyl, stearyl, lauryl, and 2-ethylhexyl; an aryl group such as phenyl; an alicyclic group such as a cyclohexyl, tert-butylcyclohexyl, dicyclopentadienyl, tricyclodecanyl, isobornyl, adamantyl, and 2-methyl-2-adamantyl; an alkoxy-substituted alkyl group such as a 1-methoxyethyl and 1-ethoxyethyl; and an alkyl group which is substituted with an aryl group such as benzyl. Among them, a substituent of primary or secondary carbon, which is hardly eliminated by acid or heat, such as a methyl, ethyl, cyclohexyl, and benzyl, is particularly preferable in view of heat resistance.

Specific examples of the ether dimer include dimethyl-2, 2'-[oxybis(methylene)]bis-2-propenoate, diethyl-2,2'-[oxybis(methylene)]bis-2-propenoate, di(n-propyl)-2,2'-[oxybis (methylene)]bis-2-propenoate, di(isopropyl)-2,2'-[oxybis (methylene)]bis-2-propenoate, di(n-butyl)-2,2'-[oxybis (methylene)]bis-2-propenoate, di(isobutyl)-2,2'-[oxybis (methylene)]bis-2-propenoate, di(tert-butyl)-2,2'-[oxybis (methylene)]bis-2-propenoate, di(tert-amyl)-2,2'-[oxybis (methylene)]bis-2-propenoate, di(stearyl)-2,2'-[oxybis (methylene)]bis-2-propenoate, di(lauryl)-2,2'-[oxybis (methylene)]bis-2-propenoate, di(2-ethylhexyl)-2,2'-[oxybis (methylene)]bis-2-propenoate, di(1-methoxyethyl)-2,2'- [oxybis(methylene)]bis-2-propenoate, di(1-ethoxyethyl)-2, 2'-[oxybis(methylene)]bis-2-propenoate, dibenzyl-2,2'- [oxybis(methylene)]bis-2-propenoate, diphenyl-2,2'-[oxybis (methylene)]bis-2-propenoate, dicyclohexyl-2,2'-[oxybis (methylene)]bis-2-propenoate, di(tert-butylcyclohexyl)-2, 2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis (methylene)]bis-2-propenoate. Among these, dimethyl-2,2'- [oxybis(methylene)]bis-2-propenoate, diethyl-2,2'-[oxybis (methylene)]bis-2-propenoate, dicyclohexyl-2,2'-[oxybis (methylene)]bis-2-propenoate, and dibenzyl-2,2'-[oxybis (methylene)]bis-2-propenoate are particularly preferable. These ether dimer may be used alone or in combination of two or more kinds thereof. The structural body derived from a compound represented by General Formula (ED) may be copolymerized with other monomers.

Moreover, in order to improve the crosslinking efficiency of the colored composition in the present invention, it is preferable to use an alkali-soluble resin having a polymerizable group.

As the alkali-soluble resin having a polymerizable group, an alkali-soluble resin having an allyl group, a (meth)acryloyl group, or an allyloxyalkyl group in a side chain is useful.

Examples of the polymer having a polymerizable group include DIANAL NR series (manufactured by Mitsubishi Rayon Co., Ltd.), PHOTOMER 6173 (a COOH-containing polyurethane acrylic oligomer, manufactured by Diamond Shamrock Co., Ltd.), VISCOAT R-264 and KS RESIST 106 (both manufactured by Osaka Organic Chemical Industry Ltd.), CYCLOMER P series and PLACCEL CF200 series (both manufactured by Daicel Chemical Industries, Ltd.), and EBECRYL 3800 (manufactured by Daicel-UCB Co., Ltd.). As the alkali-soluble resin having a polymerizable group, a urethane-modified acrylic resin including a polymerizable double bond, which is obtained by reacting a compound in which an isocyanate group has been reacted with an OH group in advance, in such a manner that one isocyanate group is left unreacted, and having a (meth)acryloyl group, with an acrylic resin including a carboxyl group; an acrylic resin including an unsaturated group, which is obtained by reacting an acrylic resin including a carboxyl group with a compound having an epoxy group and a polymerizable double bond in the molecule; an acid pendant-type epoxy acrylate resin; an acrylic resin including a polymerizable double bond, which is obtained by reacting an acrylic resin including an OH group with a dibasic acid anhydride having a polymerizable double bond; a resin obtained by reacting an acrylic resin including an OH group with a compound having an isocyanate group and a polymerizable group, and a resin obtained by performing a basic treatment of a resin having an ester group in a side chain, wherein the ester group has a halogen group or a leaving group such a sulfonate group at the a position or the β position, as described in JP2002-229207A and JP2003-335814A, are preferable.

As an example of the alkali-soluble resin, a benzyl(meth)acrylate/(meth)acrylic acid copolymer or a multi-component copolymer formed of benzyl(meth)acrylate/(meth)acrylic acid/other monomer are particularly preferable. Other examples of the alkali-soluble resin include a benzyl(meth)acrylate/(meth)acrylic acid/2-hydroxyethyl(meth)acrylate copolymer obtained by copolymerizing 2-hydroxyethyl methacrylate, a 2-hydroxypropyl(meth)acrylate/a polystyrene macromonomer/benzyl methacrylate/methacrylic acid copolymer described in JP1995-140654A (JP-H07-140654A), a 2-hydroxy-3-phenoxypropyl acrylate/a polymethyl methacrylate macromonomer/benzyl methacrylate/methacrylic acid copolymer, 2-hydroxyethyl methacrylate/a polystyrene macromonomer/methyl methacrylate/methacrylic acid copolymer, and a 2-hydroxyethyl methacrylate/a polystyrene macromonomer/benzyl methacrylate/methacrylic acid copolymer, and particularly preferably a benzyl methacrylate/methacrylic acid copolymer.

With respect to the alkali-soluble resin, reference can be made to the descriptions in paragraphs "0558" to "0571" of JP2012-208494A ("0685" to "0700" of the corresponding US2012/0235099A), the contents of which are incorporated herein.

Furthermore, it is preferable to use the copolymers (B) described in paragraph Nos. "0029" to "0063" of JP2012-32767A and the alkali-soluble resins used in Examples of the document, the binder resins described in paragraph Nos. "0088" to "0098" of JP2012-208474A and the binder resins used in Examples of the document, the binder resins described in paragraph Nos. "0022" to "0032" of JP2012-137531A and the binder resins in Examples of the document, the binder resins described in paragraph Nos. "0132" to "0143" of JP2013-024934A and the binder resins used in Examples of the document, the binder resins described in paragraph Nos. "0092" to "0098" of JP2011-242752A and used in Examples, or the binder resins described in paragraph Nos. "0030" to 0072" of JP2012-032770A, the contents of which are incorporated herein. More specifically, the following resins are preferable.

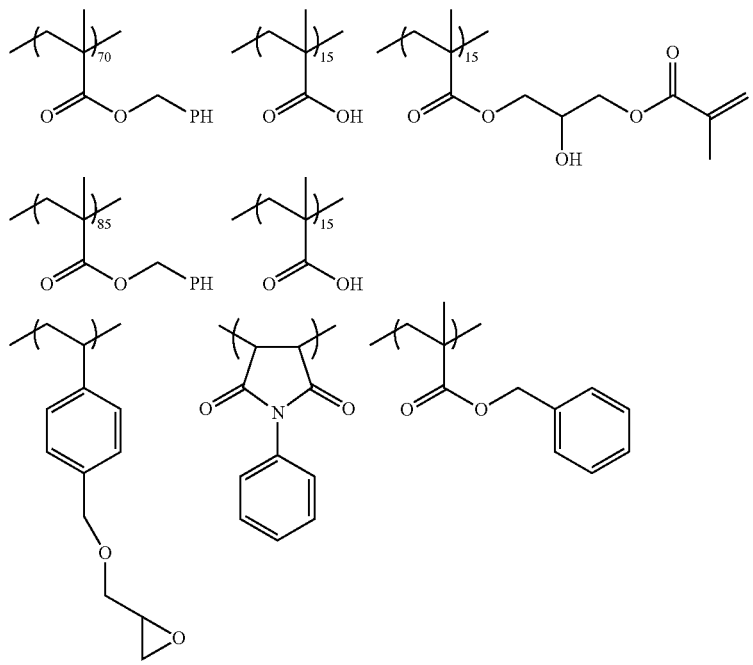

-continued
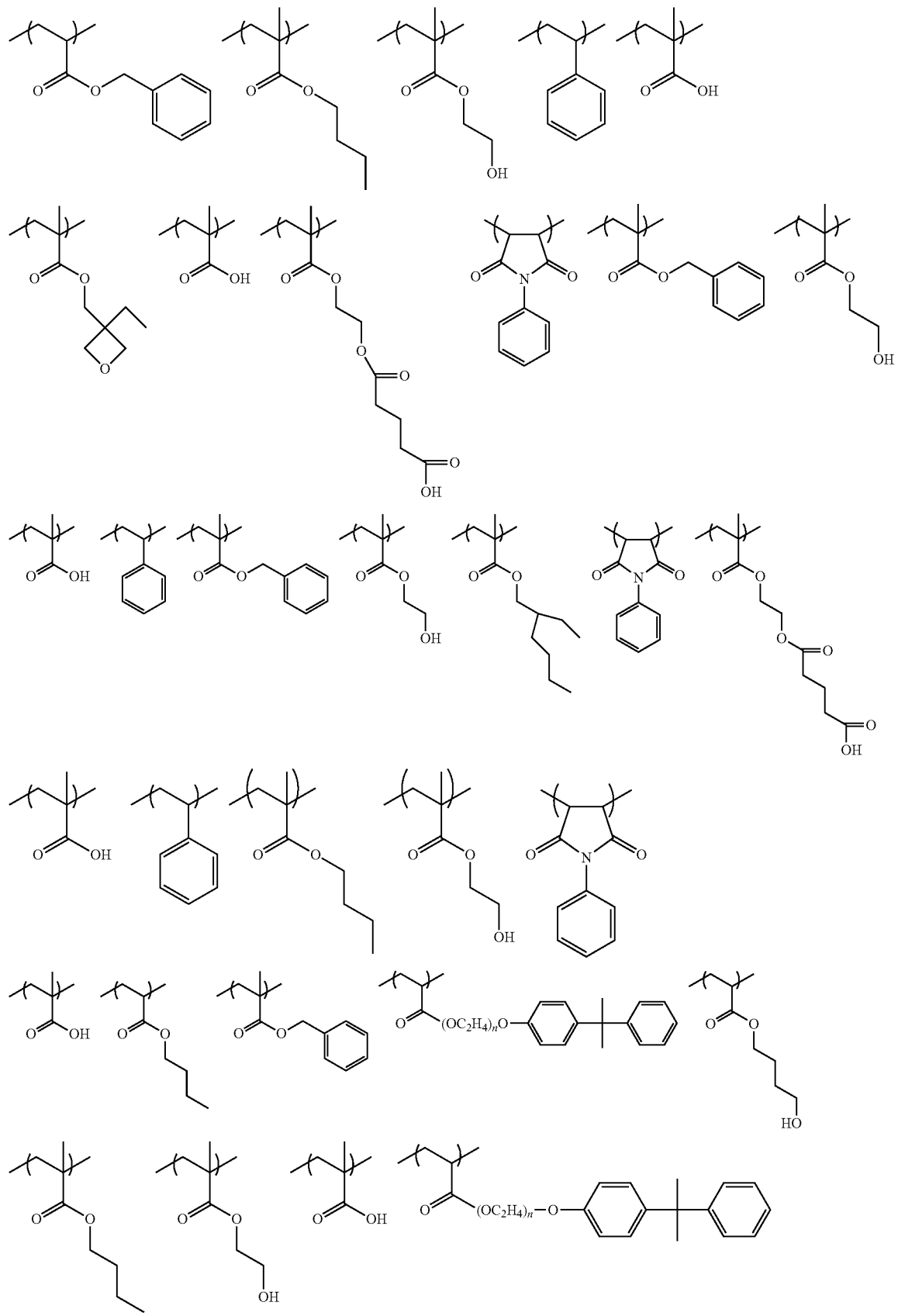

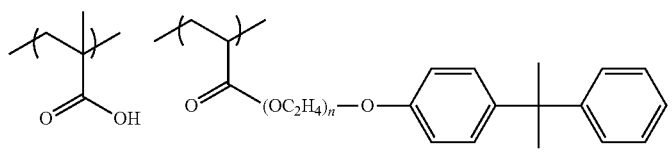
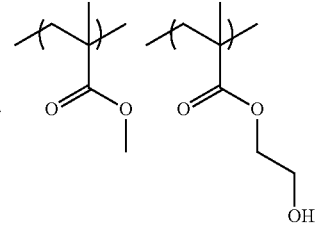

The acid value of the alkali-soluble resin is preferably 30 mgKOH/g to 200 mgKOH/g, more preferably 50 mgKOH/g to 150 mgKOH/g, and particularly preferably 70 mgKOH/g to 120 mgKOH/g.

Furthermore, the weight-average molecular weight (Mw) of the alkali-soluble resin is preferably 2,000 to 50,000, more preferably 5,000 to 30,000, and particularly preferably 7,000 to 20,000.

In the case where the colored composition contains an alkali-soluble resin, the content of the alkali-soluble resin in the colored composition is preferably 1% by mass to 15% by mass, more preferably 2% by mass to 12% by mass, and particularly preferably 3% by mass to 10% by mass, with respect to the total solid contents of the colored composition.

The composition of the present invention may include one kind or two or more kinds of alkali-soluble resin, preferably includes two or more kinds of alkali-soluble resin, and more preferably includes at least one polymerizable group. In the case where the composition includes two or more kinds of the alkali-soluble resin, the total amount thereof is preferably within the range.

<Other Components>

The colored composition of the present invention may further contain other components such as a surfactant, a crosslinking agent, a polymerization inhibitor, an organic carboxylic acid, and an organic carboxylic anhydride in addition to the respective components described above, within a range which does not diminish the effects of the present invention.

<<Surfactant>>

From the viewpoint of further improving coatability, various surfactants may be added to the colored composition of the present invention. As the surfactants, it is possible to use various surfactants such as a fluorine-based surfactant, a nonionic surfactant, a cationic surfactant, an anionic surfactant, and a silicone-based surfactant.

Particularly, if the colored composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the colored composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several pm is formed of a small amount of liquid, the colored composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within this range is effective in terms of the uniformity of the thickness of the coating film or liquid saving properties, and the solubility of the surfactant in the colored composition is also good.

Examples of the fluorine-based surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, and Megaface F781 (all manufactured by DIC Corporation), Fluorad FC430, FC431, and FC171 (all manufactured by Sumitomo 3M), and Surflon S-382, Surflon SC-101, Surflon SC-103, Surflon SC-104, Surflon SC-105, Surflon SC1068, Surflon SC-381, Surflon SC-383, Surflon S393, and Surflon KH-40 (all manufactured by ASAHI GLASS Co., Ltd.).

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L10, L31, L61, L62, 10R5, 17R2, and 25R2, and Tetronic 304, 701, 704, 901, 904, and 150R1 manufactured by BASF), and Solseperse 20000 (manufactured by Lubrizol Japan Ltd.).

Specific examples of the cationic surfactant include phthalocyanine derivatives (product name EFKA-745 manufactured by MORISHITA SANGYO Corporation), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH3OPA", and "Toray Silicone SH8400", manufactured by Dow Corning Toray, "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Silicones, and "BYK307", "BYK323", and "BYK330", manufactured by BYK-Chemie.

In the case where the colored composition of the present invention contains a surfactant, the amount of the surfactant added is preferably 0.001% by mass to 2.0% by mass and more preferably 0.05% by mass to 1.0% by mass, with respect to the total mass of the colored composition.

The composition of the present invention may include one kind or two or more kinds of surfactant. In the case where the composition includes two or more kinds of the surfactant, the total amount thereof is preferably within the range.

<<Crosslinking Agent>>

It is also possible to improve the hardness of the cured film obtained by curing the colored composition by using a crosslinking agent complementarily in the colored composition of the present invention.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to the details of specific examples and the like of the crosslinking agent, reference can be made to the description of paragraphs "0134" to "0147" of JP2004-295116A.

In the case where the colored composition of the present invention contains a crosslinking agent, the blending amount of the crosslinking agent is not particularly limited, but is preferably 2% by mass to 30% by mass, and more preferably 3% by mass to 20% by mass, with respect to the total solid contents of the composition.

The composition of the present invention may include one kind or two or more kinds of crosslinking agent. In the case where the composition includes two or more kinds of the crosslinking agent, the total amount thereof is preferably within the range.

<<Polymerization Inhibitor>>

It is preferable to add a small amount of a polymerization inhibitor to the colored composition of the present invention in order to suppress the occurrence of unnecessary thermal polymerization of the polymerizable compound during production or storage of the colored composition.

Examples of the polymerization inhibitor which can be used in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and cerium (III) N-nitrosophenyl hydroxyamine.

In the case where the colored composition of the present invention contains a polymerization inhibitor, the amount of the polymerization inhibitor added is preferably 0.01% by mass to 5% by mass, with respect to the total mass of the composition.

The composition of the present invention may include one kind or two or more kinds of polymerization inhibitor. In the case where the composition includes two or more kinds of the polymerization inhibitor, the total amount thereof is preferably within the range.

<<Organic Carboxylic Acid and Organic Carboxylic Anhydride>>

The colored composition of the present invention may contain an organic carboxylic acid having a molecular weight of 1,000 or less, and/or an organic carboxylic anhydride.

Specific examples of the organic carboxylic acid compound include an aliphatic carboxylic acid and an aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid, and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly those having a molecular weight of 50 to 500, and specifically, maleic acid, malonic acid, succinic acid, and itaconic acid are preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, and naphthalic anhydride. Among these, those having a molecular weight of 600 or less, particularly having a molecular weight of 50 to 500, specifically, for example, maleic anhydride, succinic anhydride, citraconic anhydride, and itaconic anhydride are preferable.

If the colored composition of the present invention contains an organic carboxylic acid or an organic carboxylic anhydride, the amount of these organic carboxylic acids and/or the organic carboxylic anhydrizdes added is generally in a range of 0.01% by weight to 10% by weight, preferably 0.03% by weight to 5% by weight, and more preferably 0.05% by weight to 3% by weight in the total solid contents.

The composition of the present invention may include one kind or two or more kinds of each of an organic carboxylic acid and/or an organic carboxylic anhydride. In the case where the composition includes two or more kinds of the organic carboxylic acid and/or the organic carboxylic anhydride, the total amount thereof is preferably within the range.

By adding these organic carboxylic acids and/or the organic carboxylic anhydrides having a molecular weight of 1,000 or less, it is possible to further reduce the amount of the residual undissolved substance of the colored composition while maintaining high pattern adhesiveness.

If desired, various additives such as a filler, an adhesion promoting agent, an antioxidant, an ultraviolet absorber, and an anti-aggregation agent may be blended into the colored composition. Examples of these additives include those described in paragraphs "0155" and "0156" of JP2004-295116A, the contents of which are incorporated herein.

The colored composition of the present invention can contain the sensitizer or the light stabilizer described in paragraph "0078" of JP2004-295116A, and the thermal polymerization inhibitor described in paragraph "0081" of JP2004-295116A.

The composition of the present invention may include one kind or two or more kinds of each of the components. In the case where the composition includes two or more kinds of each of the components, the total amount thereof is preferably within the range.

<Method for Preparing Colored Composition>

The colored composition of the present invention is prepared by mixing the aforementioned components.

Furthermore, when the colored composition is prepared, the respective components constituting the colored composition may be mixed together at the same time or mixed together sequentially after being dissolved and dispersed in a solvent. Further, the order of adding the components and the operation conditions during the mixing is not particularly restricted. For example, all the components may be dissolved and dispersed in a solvent at the same time to prepare the composition. Alternatively, if desired, the respective components may be appropriately prepared as two or more solutions and dispersions and mixed at the time of use (at the time of coating) to prepare the composition.

The colored composition prepared as above can be provided for use after being filtered using a filter having a pore diameter of preferably 0.01 µm to 3.0 µm, and more preferably 0.05 µm to 0.5 µm, or the like.

In addition, in the case where a pigment is blended into the composition of the present invention, it is preferable to use a cleaned pigment. By using the cleaned pigment, it is possible to further reduce the impurities in the composition. With respect to the method for cleaning the pigment, reference may be made to paragraphs "0011" to "0099" of JP2010-83997A, the contents of which are incorporated herein.

The colored composition of the present invention is preferably used for forming a colored layer of a color filter. More specifically, since the colored composition of the present invention can form a cured film having excellent heat resistance and color characteristics, it is suitably used for forming a colored pattern (colored layer) of a color filter. Further, the colored composition of the present invention can be suitably used for forming a colored pattern of a color filter or the like used in a solid-state image sensor (for example, a CCD and a CMOS) or an image display device such as a liquid crystal display (LCD). Further, the composition can also be suitably used in an application of the manufacture of a print ink, an ink jet ink, a coating material, or the like. Among these, the composition can be suitably used in an application of the manufacture of a color filter for a solid-state image sensor such as a CCD and a CMOS.

<Cured Film, Pattern Forming Method, Color Filter, and Method for Producing Color Filter>

Next, the cured film, the pattern forming method, and the color filter in the present invention will be described in detail by an explanation of production methods thereof.

The cured film of the present invention is formed by curing the colored composition of the present invention. Such a cured film is preferably used in a color filter.

In the pattern forming method of the present invention, the colored composition of the present invention is applied onto a support to form a colored composition layer, and an undesired area is removed to form a colored pattern.

The pattern forming method of the present invention can be suitably applied for forming a colored pattern (pixel) included in a color filter.

With the composition of the present invention, a color filter may be produced by forming a pattern using so-called photolithography and a pattern may be formed by a dry etching method.

That is, a first method for producing a color filter of the present invention includes a step of applying a colored composition onto a support to form a colored composition layer, a step of patternwise exposing the colored composition layer, and a step of removing an unexposed area by development to form a colored pattern.

Furthermore, as a second method for producing a color filter of the present invention, a method for manufacturing a color filter, including a step of applying a colored composition onto a support to form a colored composition layer, followed by curing, to form a colored layer, a step of forming a photoresist layer on the colored layer, a step of patterning the photoresist layer by exposure and development to obtain a resist pattern, and a step of dry-etching the colored layer using the resist pattern as an etching mask is exemplified.

In the present invention, production using photolithography is more preferable.

Hereinafter, details of these will be described.

The respective steps in the pattern forming method of the present invention will be described in detail below with reference to the method for manufacturing a color filter for a solid-state image sensor, but the present invention is not limited to this method. Hereinafter, the color filter for a solid-state image sensor may be simply referred to as a "color filter" in some cases.

<<Colored Composition Layer Forming Step>>

In the colored composition layer forming step, the colored composition of the present invention is provided on a support to form a colored composition layer.

As the support which can be used in the present step, for example, it is possible to use a substrate for a solid-state image sensor, which is formed by providing an image sensor (light-receiving element) such as a charge coupled device (CCD) or a complementary metal-oxide semiconductor (CMOS) onto a substrate (for example, a silicon substrate).

The colored pattern in the present invention may be formed on the surface (front surface) on which an image sensor is formed or on the surface (back surface) where an image sensor is not formed, of a substrate for a solid-state image sensor.

A light shielding film may be disposed between the colored pattern in a solid-state image sensor or onto the back surface of the substrate for a solid-state image sensor.

In addition, if desired, an undercoat layer may be disposed onto the support in order to improve adhesiveness between the support and the upper layer, prevent diffusion of substances, or planarize the substrate surface. A solvent, an alkali-soluble resin, a polymerizable compound, a polymerization inhibitor, a surfactant, a photopolymerization initiator, or the like can be blended into the undercoat layer, and it is preferable that these respective components are properly selected from the components blended into the aforementioned composition of the present invention.

As the method for applying the colored composition of the present invention onto the support, various coating methods such as slit coating, ink jet coating, spin coating, cast coating, roll coating, and a screen printing method can be applied.

Drying (pre-baking) of the colored composition layer applied onto the support can be carried out using a hot plate, an oven, or the like at a temperature of 50° C. to 140° C. for 10 seconds to 300 seconds.

<Pattern Forming Step by Photolithography Method>
<<Exposing Step>>

In the exposing step, the colored composition layer formed in the colored composition layer forming step is patternwise exposed through a mask having a predetermined mask pattern by using, for example, an exposure device such as a stepper. Thus, a cured film is obtained.

As radiation (light) usable in exposure, particularly, ultraviolet rays such as a g-ray and an i-ray are preferably used (particularly, an i-ray is preferably used). The irradiation dose (exposure dose) is preferably 30 mJ/cm$^2$ to 1,500 mJ/cm$^2$, more preferably 50 mJ/cm$^2$ to 1,000 mJ/cm$^2$, and particularly preferably 80 mJ/cm$^2$ to 500 mJ/cm$^2$.

The film thickness of the cured film (colored film) is preferably 1.0 µm or less, more preferably 0.1 µm to 0.9 µm, and still more preferably 0.2 µm to 0.8 µm.

It is preferable to set the film thickness to be 1.0 µm or less since a high degree of resolution and adhesiveness are obtained.

Moreover, in this step, a cured film having a small film thickness of 0.7 µm or less can be suitably formed. Further, if the obtained cured film is subjected to a development process in a pattern forming step which will be described later, it is possible to obtain a thin film having a colored pattern which exhibits excellent developability and reduced surface roughness and has an excellent pattern shape.

<<Developing Step>>

Thereafter, by performing an alkaline developing treatment, the colored composition layer in an area not irradiated with light in the exposing step is eluted into an aqueous alkaline solution, and as a result, only a photocured area remains.

As a developing liquid, an organic alkaline developing liquid not damaging an image sensor, a circuit, or the like in an underlayer is preferable. The development temperature is usually from 20° C. to 30° C., and the development time is 20 seconds to 90 seconds in the related art. In order to further remove residues, development is recently carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent used for the developing liquid include organic alkaline compounds such as aqueous ammonia, ethylamine, diethylamine, dimethyl ethanolamine, tetramethyl ammonium hydroxide, tetraethyl ammonium hydroxide, tetrapropyl ammonium hydroxide, tetrabutyl ammonium hydroxide, trimethylbenzyl ammonium hydroxide, choline, pyrrole, piperidine, and 1,8-diazabicyclo-[5,4,0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (post-baking) after drying. If a multi-colored pattern is formed, the above steps can be sequentially repeated for each color to produce a cured coat. Thus, a color filter is obtained.

The post-baking is a heating treatment performed after development so as to complete curing, and in the post-baking, a thermal curing treatment is carried out usually at 100° C. to 240° C., and preferably at 200° C. to 240° C.

The post-baking treatment can be carried out on the coating film obtained after development in a continuous or batch manner, by using heating means such as a hot plate, a convection oven (a hot-air circulation type drier), and a high-frequency heater under the conditions described above.

<<Case of Forming Pattern by Dry Etching Method>>

With the colored layer, the dry etching can be carried out with an etching gas, using a patterned photoresist layer as a mask. Specifically, a positive-type or negative-type radiation-sensitive composition is applied onto the colored layer and dried to form a photoresist layer. In the formation of the photoresist layer, it is preferable to further carry out a pre-baking treatment. In particular, as a process for forming a photoresist, a configuration in which a post-exposure heating treatment (PEB) or a post-development heating treatment (post-baking treatment) is carried out is preferable.

As the photoresist, for example, a positive-type radiation-sensitive composition is used. As the positive-type radiation-sensitive composition, a positive-type resist composition suitable for a positive-type photoresist, which responds to radiation, for example, an ultraviolet ray (a g-ray, an h-ray, or an i-ray), a far ultraviolet ray including an excimer laser and the like, an electron beam, an ion beam, or an X-ray, can be used. Among the radiations, a g-ray, an h-ray, or an i-ray is preferable, among which the i-ray is more preferable.

Specifically, as the positive-type radiation-sensitive composition, a composition containing a quinonediazide compound and an alkali-soluble resin is preferable. The positive-type radiation-sensitive composition containing a quinonediazide compound and an alkali-soluble resin utilizes a quinonediazide group being decomposed to generate a carboxyl group by light irradiation at a wavelength of 500 µm or less, and as a result, the quinonediazide compound is shifted from an alkali-insoluble state to an alkali-soluble state. Since this positive-type photoresist is remarkably excellent in the resolving power, it is used for the manufacture of an integrated circuit, for example, IC and LSI. Examples of the quinonediazide compound include a naphthoquinonediazide compound. Examples of commercially available products thereof include "FHi622BC" (manufactured by FUJIFILM Electronics Materials Co., Ltd.).

The thickness of the photoresist layer is preferably 0.1 µm to 3 µm, more preferably 0.2 µm to 2.5 µm, and still more preferably 0.3 µm to 2 µm. Incidentally coating of the photoresist layer can be suitably carried out using the coating method described with respect to the above-described colored layer.

Next, a resist pattern (patterned photoresist layer) in which a resist through-hole group is disposed is formed by exposing and developing the photoresist layer. The formation of the resist pattern can be carried out by appropriately optimizing heretofore known techniques of photolithography without particular limitation. By providing the resist through-hole group in the photoresist layer by exposure and development, the resist pattern which is used as an etching mask in the subsequent etching is provided on the colored layer.

Exposure of the photoresist layer can be carried out by exposing a positive-type or negative-type radiation-sensitive composition to a g-ray, an h-ray, or an i-ray, and preferably to an i-ray through a predetermined mask pattern. After the exposure, a development treatment is carried out using a developing liquid to remove the photoresist corresponding to the region where a colored pattern is to be formed.

As the developing liquid, any developing liquid which does not affect a colored layer containing a coloring agent and dissolves the exposed area of a positive resist or the uncured area of a negative resist may be used, and for example, a combination of various organic solvents or an aqueous alkaline solution is used. As the aqueous alkaline solution, an aqueous alkaline solution prepared by dissolving an alkaline compound to yield a concentration of 0.001% by mass to 10% by mass, and preferably 0.01% by mass to 5% by mass is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene. Incidentally in the case where an aqueous alkaline solution is used as the developing liquid, a cleaning treatment with water is generally carried out after development.

Next, the colored layer is patterned by dry etching so as to form a through-hole group in the colored layer using the resist pattern as an etching mask. Thus, a colored pattern is formed. The through-hole group is provided checkerwise in the colored layer. Thus, a first colored pattern having the through-hole group provided in the colored layer has a plurality of first quadrangular colored pixels checkerwise.

Specifically, the dry etching is carried out by dry etching the colored layer using the resist pattern as an etching mask. Representative examples of the dry etching include the methods described in JP1984-126506A (JP-S59-126506A) JP1984-46628A (JP-S59-46628A), JP1983-9108A (JP-S58-9108A), JP1983-2809A (JP-S58-2809A), JP1982-148706A (JP-S57-148706A), JP1986-41102A (JP-S61-41102A), or the like.

It is preferable that the dry etching is carried out in a configuration as described below from the viewpoint of forming a pattern cross-section closer to that of a rectangle or of further reducing damage to a support.

A configuration is preferable, which includes a first-stage etching of etching up to an area (depth) where the support is not revealed by using a mixed gas of a fluorine-based gas and an oxygen gas ($O_2$), a second-stage etching of preferably etching up to the vicinity of an area (depth) where the support is revealed by using a mixed gas of a nitrogen gas ($N_2$) and an oxygen gas ($O_2$) after the first-stage etching, and an over-etching carried out after the support has been revealed. A specific manner of the dry etching as well as the first-stage etching, the second-stage etching, and the over-etching will be described below.

The dry etching is carried out by determining the etching conditions in advance in the following manner.

(1) An etching rate (nm/min) in the first-stage etching and an etching rate (nm/min) in the second-stage etching are respectively calculated. (2) A time for etching a predetermined thickness in the first-stage etching and a time for etching a predetermined thickness in the second-stage etching are calculated, respectively. (3) The first-stage etching is carried out according to the etching time calculated in (2) above. (4) The second-stage etching is carried out according to the etching time calculated in (2) above. Alternatively an etching time is determined by endpoint detection, and the second-stage etching may be carried out according to the determined etching time. (5) The over-etching time is calculated in response to the total time of (3) and (4) above, and the over-etching is carried out.

The mixed gas used in the first-stage etching step preferably contains a fluorine-based gas and an oxygen gas ($O_2$) from the viewpoint of processing an organic material of the film to be etched into a rectangle shape. The first-stage etching step may avoid damage to the support by adopting the configuration of etching up to an area where the support is not revealed. After the etching is carried out up to an area where the support is not revealed by the mixed gas of a fluorine-based gas and an oxygen gas in the first-stage etching step, etching treatment in the second-stage etching step and etching treatment in the over-etching step are preferably carried out by using the mixed gas of a nitrogen gas and an oxygen gas from the viewpoint of avoiding damage to the support.

It is important that a ratio between the etching amount in the first-stage etching step and the etching amount in the second-stage etching step is determined so as not to deteriorate the linearity by the etching treatment in the first-stage etching step. Further, the proportion of the etching amount in the second-stage etching step with respect to the total etching amount (the sum of the etching amount in the first-stage etching step and the etching amount in the second-stage etching step) is preferably in a range of more than 0% and 50% or less, and more preferably from 10% to 20%. The etching amount means an amount determined by a difference between the remaining film thickness of the etched film and the film thickness of the film before the etching.

Furthermore, the etching preferably includes an over-etching treatment. The over-etching treatment is preferably carried out by determining an over-etching rate. The over-etching rate is preferably calculated from an etching treatment time which is carried out at first. Although the over-etching rate may be arbitrarily determined, it is preferably 30% or less, more preferably 5% to 25%, and particularly preferably 10% to 15%, of the etching processing time in the etching steps, from the viewpoint of etching resistance of the photoresist and preservation of the rectangularity of the etched pattern.

Next, the resist pattern (that is, the etching mask) remaining after the etching is removed. The removal of the resist pattern preferably includes a step of supplying a peeling solution or a solvent on the resist pattern to bring the resist pattern into a removable state, and a step of removing the resist pattern using cleaning water.

The step of supplying a peeling solution or a solvent on the resist pattern to bring the resist pattern into a removable state includes, for example, a step of paddle development by supplying a peeling solution or a solvent at least on the resist pattern and retaining for a predetermined time. The time for retaining the peeling solution or a solvent is not particularly limited, and is preferably several tens of seconds to several minutes.

Moreover, the step of removing the resist pattern using cleaning water includes, for example, a step of removing the resist pattern by spraying cleaning water from a spray-type or shower-type spray nozzles onto the resist pattern. As the cleaning water, pure water is preferably used. The spray nozzles include spray nozzles having a spray area which covers the entire support and mobile spray nozzles having a mobile area which covers the entire support. In the case where the spray nozzles are mobile spray nozzles, the resist pattern can be more effectively removed by moving the mobile spray nozzles twice or more from the center of support to the edge of the support to spray cleaning water in the step of removing the resist pattern.

The peeling solution generally contains an organic solvent and may further contain an inorganic solvent. Examples of the organic solvent include 1) a hydrocarbon-based compound, 2) a halogenated hydrocarbon-based compound, 3) an alcohol-based compound, 4) an ether- or acetal-based compound, 5) a ketone- or aldehyde-based compound, 6) an ester-based compound, 7) a polyhydric alcohol-based compound, 8) a carboxylic acid- or its acid anhydride-based compound, 9) a phenol-based compound, 10) a nitrogen-containing compound, 11) a sulfur-containing compound, and 12) a fluorine-containing compound. The peeling solution preferably contains a nitrogen-containing compound, and more preferably contains an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, and triethanolamine, among which monoethanolamine, diethanolamine, and triethanolamine are preferable, and monoethanolamine ($H_2NCH_2CH_2OH$) is more preferable. Further, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine, N-methyl-2-pyrrolidone, N-phenyl morpholine, 2,4-lutidine, and 2,6-lutidine, among which N-methyl-2-pyrrolidone and N-ethyl morpholine are preferable, and N-methyl-2-pyrrolidone (NMP) is more preferable.

The peeling solution preferably includes both the acyclic nitrogen-containing compound and the cyclic nitrogen-containing compound, more preferably contains at least one selected from monoethanolamine, diethanolamine, and triethanolamine as the acyclic nitrogen-containing compound, and at least one selected from N-methyl-2-pyrrolidone and N-ethyl morpholine as the cyclic nitrogen-containing compound, and still more preferably contains monoethanolamine and N-methyl-2-pyrrolidone.

In the removal with the peeling solution, it is sufficient that the resist pattern formed on the first colored pattern is removed, and in a case where a deposit of an etching product is attached to the side wall of the first colored pattern, it is not always necessary to completely remove the deposit. The deposit means an etching product attached and deposited to the side wall of colored layer.

For the peeling solution, it is preferable that the content of the acyclic nitrogen-containing compound is 9 parts by mass to 11 parts by mass based on 100 parts by mass of the peeling solution, and the content of the cyclic nitrogen-containing compound is 65 parts by mass to 70 parts by mass based on 100 parts by mass of the peeling solution. Further, the peeling solution is preferably one prepared by diluting a mixture of the acyclic nitrogen-containing compound and the cyclic nitrogen-containing compound with pure water.

Furthermore, the production method of the present invention may have a step known as a method for producing a color filter for a solid-state image sensor, if desired, as a step other than the above steps. For example, the method may include a curing step of curing the formed colored pattern by heating and/or exposure, if desired, after the colored composition layer forming step, the exposing step, and the pattern forming step are carried out.

Moreover, in the case of using the colored composition according to the present invention, contaminations or the like occur in some cases, for example, when a nozzle of an ejection portion or a piping portion of a coating device is clogged, or the colored composition or a pigment adheres to or is precipitated or dried inside the coating machine. Accordingly, in order to efficiently clean off the contaminations caused by the colored composition of the present invention, it is preferable to use the solvent relating to the colored composition of the present invention as a cleaning liquid. In addition, the cleaning liquids described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, JP2007-281523A, and the like can also be suitably used to remove and clean the colored composition according to the present invention.

Among those, alkylene glycol monoalkyl ether carboxylate and alkylene glycol monoalkyl ether are preferable.

These solvents may be used alone or as a mixture of two or more kinds thereof. In the case where two or more kinds thereof are mixed, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and still more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Further, in order to improve the permeability of the cleaning liquid with respect to the contaminant, it is preferable to add the aforementioned surfactants relating to the present formulation to the cleaning liquid.

Since the color filter of the present invention uses the colored composition of the present invention, exposure having an excellent exposure margin can be carried out, and the formed colored pattern (colored pixel) has an excellent pattern shape. Further, since the surface roughness of the pattern and the amount of residues in a developed area are reduced, excellent color characteristics are exhibited.

The color filter of the present invention can be suitably used for a solid-state image sensor such as a CCD and a CMOS, and is particularly preferable for a CCD, a CMOS, and the like with a high resolution, having more than 1,000,000 pixels. The color filter for a solid-state image sensor of the present invention can be used as, for example, a color filter disposed between a light-receiving portion of each pixel constituting a CCD or a CMOS and a microlens for condensing light.

Furthermore, the film thickness of the colored pattern (colored pixel) in the color filter of the present invention is preferably 2.0 μm or less, more preferably 1.0 μm or less, and still more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Image Sensor>

The solid-state image sensor of the present invention includes the aforementioned color filter of the present invention. The constitution of the solid-state image sensor of the present invention is not particularly limited as long as the solid-state image sensor is constituted to include the color filter in the present invention and functions as a solid-state image sensor. However, for example, the solid-state image sensor can be constituted as below.

The solid-state image sensor has a configured in which transfer electrodes consisting of a plurality of photodiodes and polysilicon or the like constituting a light-receiving area of a solid-state image sensor (a CCD image sensor, a CMOS image sensor, or the like) are arranged onto a support; a light shielding film which is opened only to the light-receiving portion of the photodiode and is formed of tungsten or the like is disposed on the photodiodes and the transfer electrodes; a device protecting film which is formed for covering the entire surface of the light shielding film and the light receiving portion of the photodiodes and is formed of silicon nitride or the like is disposed on the light shielding film; and the color filter for a solid-state image sensor of the present invention is disposed on the device protecting film.

In addition, the solid-state image sensor may have a constitution in which light-condensing means (for example, a microlens or the like, which shall apply hereinafter) is disposed to a portion positioned on the device protecting film and under the color filter (side close to the support), a constitution in which light-condensing means is disposed on the color filter, and the like.

<Image Display Device>

The color filter of the present invention can be used not only for a solid-state image sensor, but also for an image display device such as a liquid crystal display device and an organic EL display device. In particular, the color filter is suitable for the applications of a liquid crystal display device. The liquid crystal display device including the color filter of the present invention can display a high-quality image showing a good tone and having excellent display characteristics.

The definition of display devices or details of the respective display devices are described in, for example, "Electronic Display Device (Akio Sasaki, Kogyo Chosakai Publishing Co., Ltd., published in 1990)", "Display Device (Toshiyuki Ibuki, Sangyo Publishing Co., Ltd., published in 1989)", and the like. In addition, the liquid crystal display device is described in, for example, "Next-Generation Liquid Crystal Display Technology (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Next-Generation Liquid Crystal Display Technology".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, a dye multimer having an excellent hue is used. Accordingly the color purity, light-transmitting properties, and the like are excellent, and the tone of the colored pattern (pixel) is excellent. Consequently, a liquid crystal display device of a COA system which has a high resolution and is excellent in long-term durability can be provided. Further, in order to satisfy the characteristics required for a low dielectric constant, a resin coat may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18 to 24 (Yasuhiro Shima) and pp. 25 to 30 (Takaaki Yagi) of this document, and the like.

If the color filter in the present invention is used in a liquid crystal display device, high contrast can be realized when the color filter is combined with a three-wavelength tube of a cold cathode tube known in the related art. Further, if a light source of red, green, and blue LED (RGB-LED) is used as a backlight, a liquid crystal display device having high luminance, high color purity, and good color reproducibility can be provided.

EXAMPLES

Hereinafter, the present invention will be described in more detail with reference to Examples. The materials, use amounts and ratios thereof, treatment procedures, treatment orders, and the like shown in the Examples below may be appropriately modified as long as the object of the present invention is not impaired. Therefore, the ranges of the present invention are not limited to the specific examples shown below.

Further, "%" and "part(s)" are based on mass unless otherwise specified

Synthesis Examples of Dye Multimers

The following xanthenes 1 to 4 are included in a preferred configuration (A1) of the aforementioned dye multimer. The following xanthene 5 is included in a preferred configuration (A2) of the aforementioned dye multimer. The following xanthene 6 is included in a preferred configuration (A3) of the aforementioned dye multimer. The following xanthenes 7 and 8 are included in a preferred configuration (A4) of the aforementioned dye multimer.

<Synthesis of Xanthene 1>

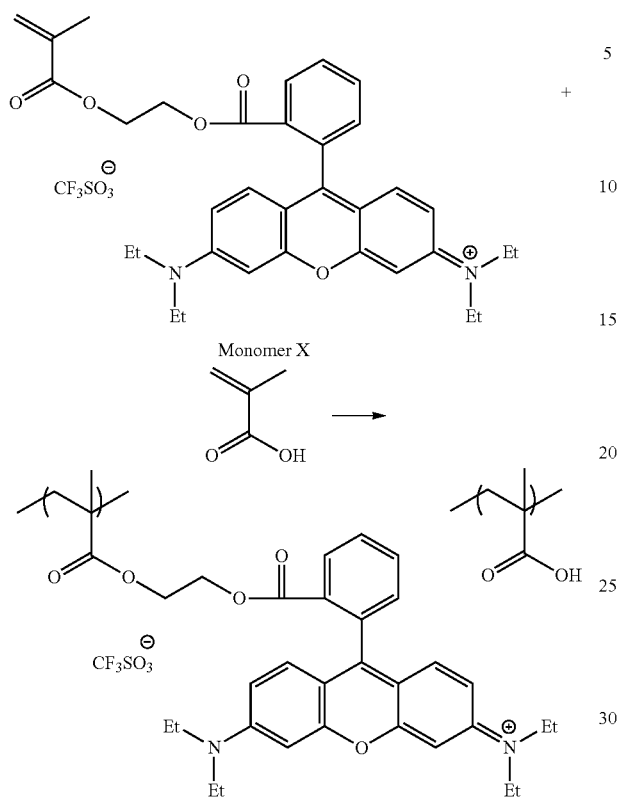

20.0 g (41.8 mmol) of Rhodamine B was dissolved in 125 g of chloroform, and then 9.6 g (62.6 mmol) of phosphorus oxychloride was added dropwise thereto while cooling in an ice bath. Then, the mixture was heated at an external temperature of 65° C. for 3 hours. After cooling to 20° C., 9.8 g (75.2 mmol) of 2-hydroxyethyl methacrylate was added to the mixture while cooling in an ice bath, and 30.8 g (304 mmol) of triethylamine was added thereto. After stirring for 3 hours at an internal temperature set to 20° C., 100 g of chloroform was added thereto, the mixture was subjected to liquid separation with water, and then the chloroform layer was concentrated. The obtained concentrate was added to 100 mL of methanol, and 16.4 g (41.8 mmol) of a tetrabutyl ammonium trifluoromethylsulfonate salt was added thereto. The mixture was subjected to liquid separation with 200 mL of ethyl acetate and 100 mL of water, and the ethyl acetate layer was concentrated to obtain 18.0 g of a monomer X.

The monomer X (8.2 g), methacrylic acid (0.46 g), dodecyl mercaptan (0.255 g), and propylene glycol 1-monomethyl ether 2-acetate (hereinafter also referred to as "PGMEA") (23.3 g) were put into a three-neck flask, and the solution was heated at 80° C. in a nitrogen atmosphere. To this solution, a mixed solution of the monomer X (8.2 g), methacrylic acid (1.075 g), dodecyl mercaptan (0.255 g), dimethyl 2,2'-azobis(isobutyrate) [product name: V601, manufactured by Wako Pure Chemical Industries, Ltd.] (0.58 g), and PGMEA (23.3 g) was added dropwise for 3 hours. Thereafter, the mixture was stirred for 4 hours, then warmed to 90° C., heated and stirred for 2 hours, and then left to be cooled to obtain a PGMEA solution of an intermediate (MD-1). After cooling, the solution was added dropwise to a mixed solvent of methanol/ion exchange water=100 mL/10 mL to perform reprecipitation. The solution was dried by air-blowing at 40° C. for 2 days to obtain 7.9 g of a dye multimer (xanthene 1).

The weight-average molecular weight (Mw) of the dye multimer (xanthene 1) confirmed by GPC measurement was 7,700. Further, the acid value as measured by titration using a 0.1 N aqueous sodium hydroxide solution was 37 mgKOH/g.

<Synthesis of Xanthenes 2 to 4>

The same procedure was carried out as in Synthesis Example 1 except that the counter anion in the monomer X in Synthesis Example 1 was changed to those described in the following tables, and dye multimers (xanthenes 2 to 4) were synthesized.

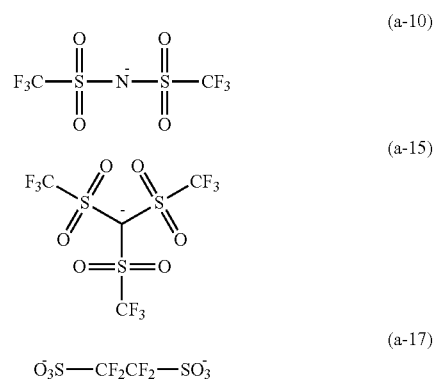

<Synthesis of Xanthene 5>

The following monomers (55% by mole of xanthene monomers and 45% by mole of methacrylic acid) were copolymerized to synthesize a xanthene 5.

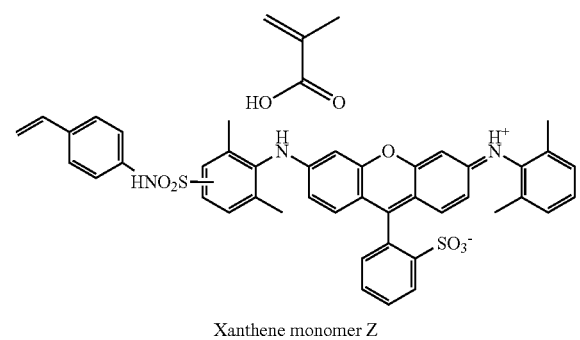

Xanthene monomer Z 27.4 g (41.8 mmol) of C. I. Acid Red 289 was dissolved in 125 g of chloroform, and then 9.6 g (62.6 mmol) of phosphorus oxychloride was added dropwise thereto while cooling in an ice bath. Then, the mixture was heated at an external temperature of 65° C. for 3 hours. After cooling to 20° C., 9.0 g (75.2 mmol) of 4-aminostyrene was added to the mixture while cooling in an ice bath, and 30.8 g (304 mmol) of triethylamine was added thereto. After stirring for 3 hours at an internal temperature set to 20° C., 100 g of chloroform was added thereto, the mixture was subjected to liquid separation with water, and then the chloroform layer was concentrated to obtain 15.0 g of a monomer Z. Further, 10.0 g of the monomer Z2 was obtained from the aqueous layer.

The monomer Z (8.2 g), methacrylic acid (0.46 g), dodecyl mercaptan (0.255 g), and PGMEA (23.3 g) were put into a three-neck flask, and the solution was heated at 80° C. in a nitrogen atmosphere. To this solution, a mixed solution of the monomer Z (8.2 g), methacrylic acid (1.075 g), dodecyl mercaptan (0.255 g), dimethyl 2,2'-azobis(isobutyrate) [product name: V601, manufactured by Wako Pure Chemical Industries, Ltd.] (0.58 g), and PGMEA (23.3 g) was added dropwise for 4 hours. Thereafter, the mixture was stirred for 4 hours, then warmed to 93° C., heated and stirred for 2 hours, and then left to be cooled to obtain a PGMEA solution of an intermediate (MD-1). After cooling, the solution was added dropwise to a mixed solvent of methanol/ion exchange water=100 mL/10 mL to perform reprecipitation. The solution was dried by air-blowing at 40° C. for 2 days to obtain 7.4 g of a dye multimer (xanthene 5).

The weight-average molecular weight (Mw) of the dye multimer (xanthene 5) confirmed by GPC measurement was 6,500. Further, the acid value as measured by titration using a 0.1 N aqueous sodium hydroxide solution was 38 mgKOH/g.

<Synthesis of Xanthene 6>

61% by mole of a xanthene monomer Y and 39% by mole of methacrylic acid

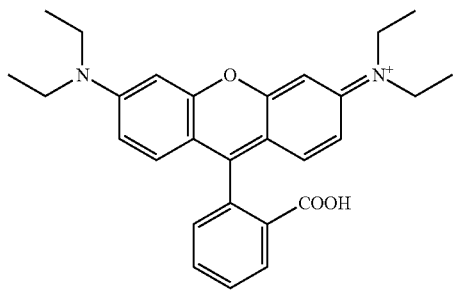

Xanthene monomer Y 20.0 g (41.8 mmol) of Rhodamine B and 24.3 g (41.8 mmol) of a potassium salt of the following polymerizable anion were salt-exchanged in 200 ml of methanol, 1 L of water was added thereto, and the mixture was extracted with 500 ml of chloroform and concentrated to obtain 25 g of a monomer Y.

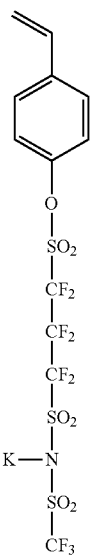

Potassium salt
of polymerizable
anion A

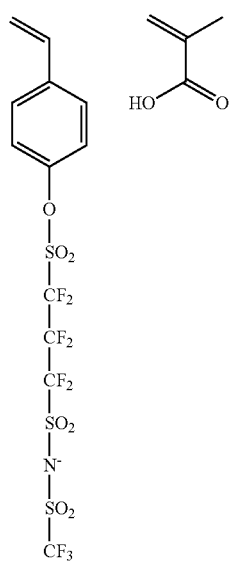

The monomer Y (8.2 g), methacrylic acid (0.46 g), dodecyl mercaptan (0.255 g), and PGMEA (23.3 g) were put into a three-neck flask, and the solution was heated at 80° C. in a nitrogen atmosphere. To this solution, a mixed solution of the monomer Y (8.2 g), methacrylic acid (1.075 g), dodecyl mercaptan (0.255 g), dimethyl 2,2'-azobis(isobutyrate) [product name: V601, manufactured by Wako Pure Chemical Industries, Ltd.] (0.58 g), and PGMEA (23.3 g) was added dropwise for 5 hours. Thereafter, the mixture was stirred for 5 hours, then warmed to 93° C., heated and stirred for 2 hours, and then left to be cooled to obtain a PGMEA solution of an intermediate (MD-1). After cooling, the solution was added dropwise to a mixed solvent of methanol/ion exchange water=100 mL/10 mL to perform reprecipitation. The solution was dried by air-blowing at 40° C. for 2 days to obtain 4.8 g of a dye multimer (xanthene 6).

The weight-average molecular weight (Mw) of the dye multimer (xanthene 6) confirmed by GPC measurement was 6,900.

<Synthesis of Xanthene 7>

The following monomers (a xanthene monomer Z2 (51% by mole) and methacrylic acid (49% by mole)) were copolymerized to synthesize a xanthene 7.

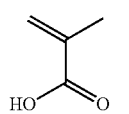
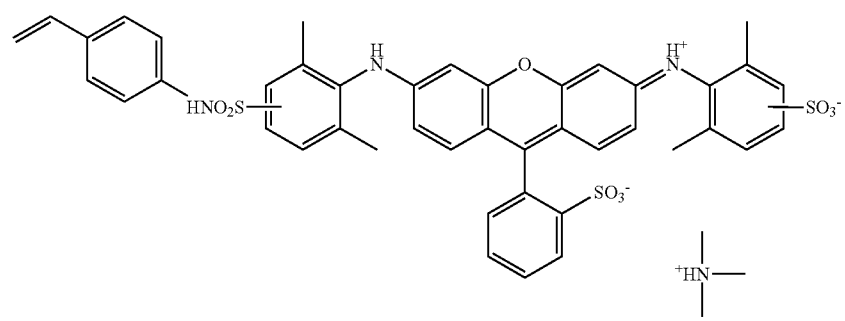

Xanthene monomer Z2

The monomer Z2 (8.2 g) obtained in Synthesis of Xanthene 5, methacrylic acid (0.46 g), dodecyl mercaptan (0.255 g), and propylene glycol 1-monomethyl ether 2-acetate (hereinafter also referred to as "PGMEA") (23.3 g) were put into a three-neck flask, and the solution was heated at 80° C. in a nitrogen atmosphere. To this solution, a mixed solution of the monomer Z2 (8.2 g), methacrylic acid (1.075 g), dodecyl mercaptan (0.255 g), dimethyl 2,2'-azobis(isobutyrate) [product name: V601, manufactured by Wako Pure Chemical Industries, Ltd.] (0.58 g), and PGMEA (23.3 g) was added dropwise for 3 hours. Thereafter, the mixture was stirred for 4 hours, then warmed to 90° C., heated and stirred for 2 hours, and then left to be cooled to obtain a PGMEA solution of an intermediate (MD-1). After cooling, the solution was added dropwise to a mixed solvent of methanol/ion exchange water=100 mL/10 mL to perform reprecipitation. The solution was dried by air-blowing at 40° C. for 2 days to obtain 7.8 g of a dye multimer (xanthene 7).

The weight-average molecular weight (Mw) of the dye multimer (xanthene 7) confirmed by GPC measurement was 8,200. Further, the acid value as measured by titration using a 0.1 N aqueous sodium hydroxide solution was 38 mgKOH/g.

<Synthesis of Xanthene 8>

(Copolymer of the Following Monomers)

According to the method for producing a salt-forming compound (A-1) described in paragraph "0165" of JP2011-242752A, a dye multimer (xanthene 8) was obtained. The weight-average molecular weight (Mw) of the dye multimer (xanthene 7) confirmed by GPC measurement was 8,300.

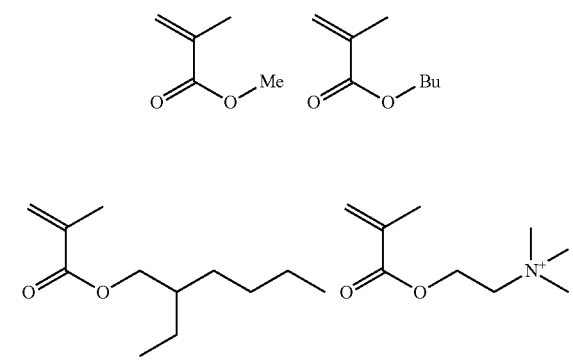

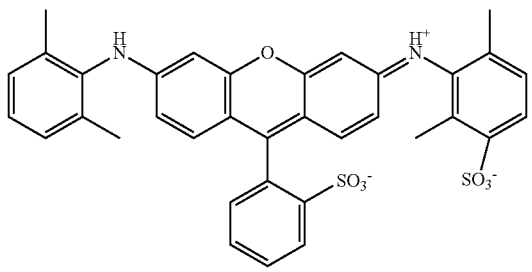

Preparation of Colored Composition

Preparation of Blue Pigment Dispersion

A blue pigment dispersion 1 was prepared in the following manner.

A mixed solution consisting of 10.0 parts of C. I. Pigment Blue 15:6 (blue pigment, average particle size of 55 nm), 3.0 parts of Disperbyk111 as a pigment dispersant, 70.0 parts of PGMEA, and 17.0 parts of cyclohexanone was mixed and dispersed for 3 hours by a beads mill (zirconia beads having a diameter of 0.3 mm) to prepare a pigment dispersion. Thereafter, the pigment dispersion was further subjected to a dispersion treatment at a flow rate of 500 g/min under a pressure of 2,000 kg/cm³ by using a high-pressure dispersing machine equipped with a depressurizing mechanism, NANO-3000-10 (manufactured by Nihon B.E.E Co., Ltd.). This dispersion treatment was repeated 10 times to obtain a blue pigment dispersion 1 (a dispersion of C. I. Pigment Blue 15:6, pigment concentration of 10% by mass) used in the colored compositions of Examples or Comparative Examples.

Preparation of Example 0

The following respective components were mixed, dispersed, and dissolved to obtain a colored composition of Example 0.

Furthermore, before preparing Example 0, toluene and the moisture in the system were removed by distillation of the solvent used and a desiccant, and the dye and the pigment were cleaned with distilled water and dried repeatedly to remove Na and K ions in the system. Materials such as the other monomers were purified before their use to remove impurities (toluene, Na and K ions, and the like), and then preparation was carried out.

| | |
|---|---|
| Blue pigment dispersion 1 above | 390.0 parts |
| Alkali-soluble resin 1 (a copolymer of 55% by mole of benzyl methacrylate and 45% by mole of methacrylic acid, weight-average molecular weight of 10,000, hereinafter referred to as "B1") | 2.8 parts |
| Alkali-soluble resin 2 (the following resin, weight-average molecular weight of 11,000, hereinafter referred to as "B2") | 0.7 parts |

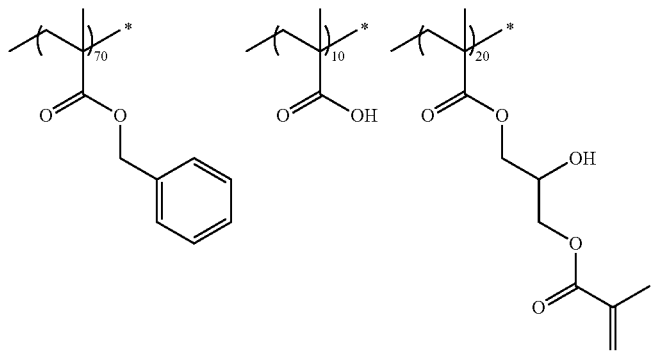

| | |
|---|---|
| Curable compound (hexafunctional monomer having the following structure, hereinafter referred to as "m1") | 10.0 parts |

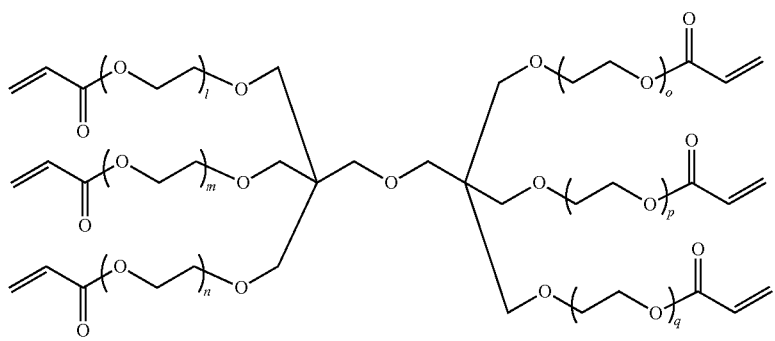

$l + m + n + o + p + q \approx 12$

| | |
|---|---|
| Photopolymerization initiator (the following structure, described in JP2011-158654A, hereinafter referred to as "I-1") | 7.5 parts |

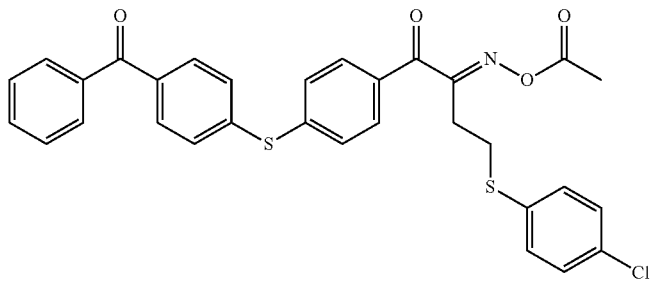 [SMILES: CC(=O)O/N=C(\CCSc1ccc(Cl)cc1)C(=O)c1ccc(Sc2ccc(C(=O)c3ccccc3)cc2)cc1]

| | |
|---|---|
| Dye multimer (xanthene 1) | 20.0 parts in terms of a solid content |
| Fluorine-based surfactant (manufactured by DIC Corporation, F-475) | 0.2 parts |
| PGMEA | 273 parts |

The concentrations of the following components in the composition of Example 0 were measured, and the results are shown below.
Content of water: 0.001% by mass or less
Concentration of toluene: 0.005 ppm or less
Concentration of Na ions: 0.005 ppm or less
Concentration of K ions: 0.005 ppm or less The content of water was measured in accordance with known methods by a Karl Fischer method. Specifically, the amount of moisture of the materials to be measured using a Karl Fischer moisture meter (KF-06 manufactured by Mitsubishi Chemical Holdings Corporation) and the content of water was measured with [moisture amount/mass of the materials to be measured×100].

With respect to the concentration of toluene, a calibration curve was produced by means of gas chromatography according to a known method, and then toluene was quantified. In the present application, the respective materials of the composition were vacuum-dried, and after confirming the content of toluene was 0.005 ppm or less, toluene was further added during the preparation of the composition, thereby preparing a composition having a different concentration of toluene.

Water, toluene, an Na ion source (specifically (NaCl)), and a K ion source (specifically (KCl)) were added to the composition of Example 0 to manufacture samples of Examples 1 to 6.

Furthermore, in the same manner as in Example 0 except that the dye multimer, the curable compound (monomer), and the photopolymerization initiator were changed to those as in the following table, compositions of Examples 7 to 95 and Comparative Examples 1 to 16 were manufactured.

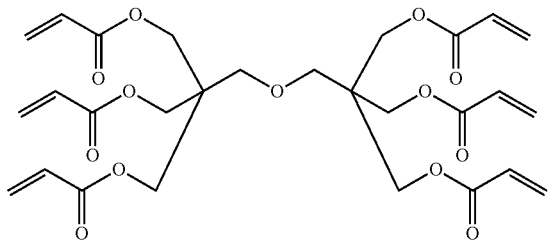

Curable compound (monomer (m-2))

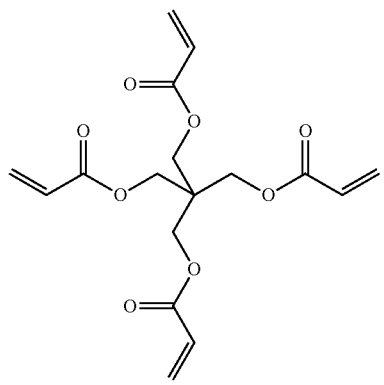

Curable compound (monomer (m-3))

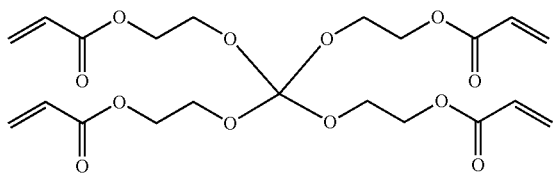

Curable compound (monomer (m-4))

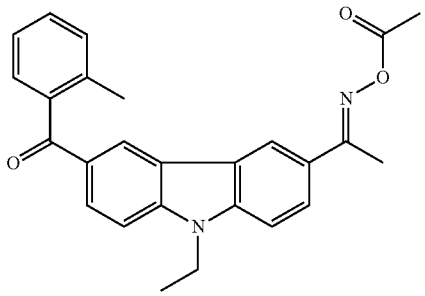

Photopolymerization initiator (I-2, OXE-02 manufactured by BASF)

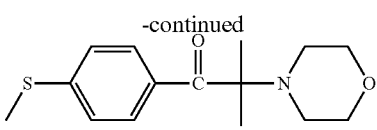

Photopolymerization initiator (I-3, Irgacure 907 manufactured by BASF)

<Evaluation of Stability after Elapse of Long Period of Time>

The initial viscosity (Vi) of the compositions obtained in Examples and Comparative Examples was measured, and repeated at temperatures varying from 5° C. to 25° C., each for 12 hours, in a closed container, and placed for 100 days. Further, the viscosity by the elapse of time (Vd) was measured. The value of |Vi−Vd|/Vi×100% was calculated, with which evaluation was carried out. Grade 3 or higher in accordance with evaluation criteria is preferable for practical use. The results are shown in the following table.

6: A change rate in viscosity is 0.5% or less (particularly good)
5: A change rate in viscosity is higher than 0.5% and 3% or less (good)
4: A change rate in viscosity is higher than 3% and 7% or less (slightly good)
3: A change rate in viscosity is higher than 7% and 8% or less (within an acceptable range)
2: A change rate in viscosity is higher than 8 and 12% or less (beyond the acceptable range)
1: A change rate in viscosity is higher than 12% (beyond the acceptable range)

Manufacture of Color Filter Using Colored Composition

<Pattern Formation>

Each of the colored compositions of Examples and Comparative Examples, which had been prepared as above, was applied onto a glass substrate to form a colored composition layer (coating film). Then, a heating treatment (pre-baking) was carried out for 120 seconds by using a hot plate at 100° C. such that the dry film thickness of the coating film became 0.6 μm.

<Long-Term Light Fastness under Low Oxygen Concentration>

Film products (patterns) obtained in Examples and Comparative Examples were covered with glass covers and were repeatedly subjected to light-on for 12 hours and light-off for 12 hours at an illuminance of 1,000 lux to perform irradiation for 2,000 hours in total by using SX75F manufactured by Suga Test Instruments Co., Ltd., which is a light fastness tester with a xenon lamp light source (in the low-oxygen state by cut-off of oxygen supply), thereby carrying out a light fastness test.

The color difference (ΔE*ab value) before and after the irradiation was measured by MCPD-2000 manufactured by Otsuka Electronics Co., Ltd., and evaluated. Grade 3 or higher in accordance with evaluation criteria is preferable for practical use. The results are shown in the following table.

6: 0.5% or less (particularly good)
5: Higher than 0.5% and 1% or less (good)
4: Higher than 1% and 2% or less (slightly good)
3: Higher than 2% and 3% or less (within an acceptable range)
2: Higher than 3% and 5% or less (beyond the acceptable range)
1: Higher than 5% (beyond the acceptable range)

<Evaluation of Defects after Elapse of Long Period of Time (Evaluation of Increase Rate in Impurities)>

The radiation-sensitive composition obtained above was applied onto a silicon wafer such that the film thickness after coating became 0.6 µm, and then heated on a hot plate at 100° C. for 2 minutes, thereby obtain a the colored composition layer.

With respect to the substrate having the colored composition layer formed thereon, the number of impurities having a size of 1.0 µm or more was counted by using a defect inspector, ComPLUS (manufactured by Applied Materials, Inc.).

The evaluation was carried out on each of the colored composition layers which had been placed at room temperature of 23° C. for one month and the colored composition layers immediately after the preparation thereof, and the increase rate in impurities was evaluated in accordance with the following evaluation criteria.

In addition, the increase rate in impurities was calculated as (number of impurities which had been placed at room temperature of 23° C. for one month/number of impurities immediately after the preparation). Grade 3 or higher in accordance with evaluation criteria is preferable for practical use. The results are shown in Tables.

(Evaluation Criteria)
6: Less than 1.1
5: 1.1 or more and less than 1.3
4: 1.3 or more and less than 1.5
3: 1.5 or more and less than 2.0
2: 2.0 or more and less than 3.0
1: 3.0 or more <Evaluation after Being Placed for Extended Long Period of Time>

(Manufacture of Undercoat Layer-Attached Silicon Wafer)

A resist CT-4000L solution (manufactured by FUJIFILM Electronic Materials Co., Ltd.; Transparent undercoat material) was applied onto a silicon wafer using a spin coater such that the film thickness became 0.1 µm, and heated and dried at 220° C. for 1 hour to form an undercoat layer, thereby obtaining an undercoat layer-attached silicon wafer.

(Manufacture of Colored Pattern)

The colored compositions of Examples and Comparative Examples were applied onto the undercoat layer-attached silicon wafer by a spin coating method such that the film thickness after coating became 0.6 µm, and then heated on a hot plate at 90° C. for 2 minutes to obtain a colored composition layer.

Next, the obtained colored composition layer was exposed through a mask with a 3.0-µm island pattern at 300 mJ/cm$^2$ through a mask by using an i-ray stepper exposure device FPA-3000i5+ (manufactured by CANON Inc.). Subsequently, the colored composition layer after exposure was subjected to paddle development at 23° C. for 60 seconds by using a 2.0% aqueous tetramethylammonium hydroxide (TMAH) solution, followed by rinsing with a spin shower and further cleaning with pure water, to obtain a colored pattern.

The line width of the obtained colored pattern was observed by using a length measuring SEM (trade name: S-7800H, manufactured by Hitachi High-Technologies Corporation). The differences between the maximum values and the minimum values of the line width within one pixel in the case where the extended time for the layer to be placed was 96 hours were measured at arbitrary ten points in the wafer, and an average value thereof was determined. Further, in the case where the extended time for the layer to be placed was 0 hour, the average value was <0.02 µm in any of Examples and Comparative Examples.

Grade 3 or higher in accordance with evaluation criteria is preferable for practical use. The results are shown in Tables.

(Evaluation Criteria)
6: Less than 0.02 (Best)
5: 0.02 µm or more and less than 0.04 µm (good)
4: 0.04 µm or more and less than 0.06 µm (slightly good)
3: 0.06 µm or more and less than 0.10 µm (within an acceptable range)
2: 0.10 µm or more and less than 0.20 µm (beyond the acceptable range)
1: 0.20 µm or more (beyond the acceptable range)

<Defect Evaluation after Humid Resistance Test (Evaluation of Increase Rate in Impurities)>

The compositions of Examples and Comparative Examples were applied onto a silicon wafer such that the film thickness after coating became 0.6 µm, and heated on a hot plate at 100° C. for 2 minutes to obtain a colored composition layer. Thereafter, the entire surface was exposed with i-rays through an exposure dose of 1,000 mJ/cm$^2$, and further heated at 200° C./10 minutes on a hot plate to obtain an initial sample.

The previous sample was subjected to humid resistance for 916 hours under the conditions of 60° C. and a humidity of 95% to obtain a sample after the humid resistance test.

With respect to each of the samples, the number of impurities having a size of 1.0 µm or more was counted by using a defect inspector, ComPLUS (manufactured by Applied Materials, Inc.). The increase rate in impurities was evaluated in accordance with the following evaluation criteria.

In addition, the increase rate in impurities was calculated as (number of impurities of the sample after the humid resistance test/number of impurities of the initial sample). Grade 3 or higher in accordance with evaluation criteria is preferable for practical use. The results are shown in Tables.

(Evaluation Criteria)
6: Less than 1.1
5: 1.1 or more and less than 1.3
4: 1.3 or more and less than 1.5
3: 1.5 or more and less than 2.0
2: 2.0 or more and less than 3.0
1: 3.0 or more <Long-Term Thermal Cycling Test>

The increase rates in coating impurities after storing the compositions of Examples and Comparative Examples under the following temperature conditions were evaluated.
Temperature condition (1): 30° C. 168 hr
Temperature condition (2): 23° C. 168 hr
Temperature condition (3): 5° C. 168 hr The coating impurities were evaluated after repeating the storage of the compositions once under the temperature condition (1), the temperature condition (2), and the temperature condition (3) in this order.

<Evaluation of Coating Impurities>

The colored composition was applied onto a silicon wafer such that the film thickness after coating became 0.6 µm, and then heated on a hot plate at 90° C. for 2 minutes to obtain a colored composition layer.

With respect to the substrate having the colored composition layer formed thereon, the number of impurities having a size of 2.0 µm or more was counted by using a defect inspector, ComPLUS (manufactured by Applied Materials, Inc.).

In addition, the increase rate in the impurities was calculated by (number of impurities after the thermal cycling test/number of impurities immediately after preparation), and evaluated in accordance with the following grades.

(Evaluation Criteria)

6: Less than 1.1 (best)

5: 1.1 or more and less than 1.3 (good)

4: 1.3 or more and less than 1.5 (slightly good)

3: 1.5 or more and less than 2.0 (within an acceptable range)

2: 2.0 or more and less than 4.0 (beyond the acceptable range)

1: 4.0 or more (beyond the acceptable range)

US 9,442,231 B2

TABLE 3

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 1 | Xanthene 1 | a-1 | B1/B2 | m-1 | I-1 | 0.1 | 0.01 | 0.01 | 0.03 | 3 | 4 | 3 | 3 | 3 | 6 |
| Example 2 | Xanthene 1 | a-1 | B1/B2 | m-1 | I-1 | 0.5 | 0.01 | 0.01 | 0.03 | 4 | 4 | 3 | 3 | 3 | 6 |
| Example 3 | Xanthene 1 | a-1 | B1/B2 | m-1 | I-1 | 1 | 0.01 | 0.01 | 0.03 | 4 | 4 | 3 | 3 | 3 | 6 |
| Example 4 | Xanthene 1 | a-1 | B1/B2 | m-1 | I-1 | 1.5 | 0.01 | 0.01 | 0.03 | 5 | 4 | 3 | 3 | 3 | 6 |
| Example 5 | Xanthene 1 | a-1 | B1/B2 | m-1 | I-1 | 2 | 0.01 | 0.01 | 0.03 | 4 | 4 | 3 | 3 | 3 | 6 |
| Example 6 | Xanthene 1 | a-1 | B1/B2 | m-1 | I-1 | 3 | 0.01 | 0.01 | 0.03 | 3 | 3 | 3 | 3 | 3 | 6 |
| Example 7 | Xanthene 2 | a-15 | B1/B2 | m-1 | I-1 | 0.1 | 0.01 | 0.01 | 0.03 | 3 | 4 | 3 | 3 | 3 | 6 |
| Example 8 | Xanthene 2 | a-15 | B1/B2 | m-1 | I-1 | 0.5 | 0.01 | 0.01 | 0.03 | 4 | 3 | 3 | 3 | 3 | 6 |
| Example 9 | Xanthene 2 | a-15 | B1/B2 | m-1 | I-1 | 1 | 0.01 | 0.01 | 0.03 | 4 | 3 | 3 | 3 | 3 | 6 |
| Example 10 | Xanthene 2 | a-15 | B1/B2 | m-1 | I-1 | 1.5 | 0.01 | 0.01 | 0.03 | 5 | 3 | 3 | 3 | 3 | 6 |
| Example 11 | Xanthene 2 | a-15 | B1/B2 | m-1 | I-1 | 2 | 0.01 | 0.01 | 0.03 | 4 | 3 | 3 | 3 | 3 | 6 |
| Example 12 | Xanthene 2 | a-15 | B1/B2 | m-1 | I-1 | 3 | 0.01 | 0.01 | 0.03 | 3 | 3 | 3 | 3 | 3 | 6 |
| Example 13 | Xanthene 3 | a-10 | B1/B2 | m-1 | I-1 | 0.1 | 0.01 | 0.01 | 0.03 | 3 | 5 | 3 | 3 | 3 | 6 |
| Example 14 | Xanthene 3 | a-10 | B1/B2 | m-1 | I-1 | 0.5 | 0.01 | 0.01 | 0.03 | 4 | 5 | 3 | 3 | 3 | 6 |
| Example 15 | Xanthene 3 | a-10 | B1/B2 | m-1 | I-1 | 1 | 0.01 | 0.01 | 0.03 | 4 | 5 | 3 | 3 | 3 | 6 |
| Example 16 | Xanthene 3 | a-10 | B1/B2 | m-1 | I-1 | 1.5 | 0.01 | 0.01 | 0.03 | 5 | 5 | 3 | 3 | 3 | 6 |
| Example 17 | Xanthene 3 | a-10 | B1/B2 | m-1 | I-1 | 2 | 0.01 | 0.01 | 0.03 | 4 | 5 | 3 | 3 | 3 | 6 |
| Example 18 | Xanthene 3 | a-10 | B1/B2 | m-1 | I-1 | 3 | 0.01 | 0.01 | 0.03 | 3 | 3 | 3 | 3 | 3 | 6 |
| Example 19 | Xanthene 4 | a-17 | B1/B2 | m-1 | I-1 | 0.1 | 0.01 | 0.01 | 0.03 | 3 | 3 | 3 | 3 | 3 | 6 |
| Example 20 | Xanthene 4 | a-17 | B1/B2 | m-1 | I-1 | 0.5 | 0.01 | 0.01 | 0.03 | 4 | 3 | 3 | 3 | 3 | 6 |
| Example 21 | Xanthene 4 | a-17 | B1/B2 | m-1 | I-1 | 1 | 0.01 | 0.01 | 0.03 | 4 | 3 | 3 | 3 | 3 | 6 |
| Example 22 | Xanthene 4 | a-17 | B1/B2 | m-1 | I-1 | 1.5 | 0.01 | 0.01 | 0.03 | 5 | 3 | 3 | 3 | 3 | 6 |
| Example 23 | Xanthene 4 | a-17 | B1/B2 | m-1 | I-1 | 2 | 0.01 | 0.01 | 0.03 | 4 | 3 | 3 | 3 | 3 | 6 |

TABLE 3-continued

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 24 | Xanthene 4 | a-17 | B1/B2 | m-1 | I-1 | 3 | 0.01 | 0.01 | 0.03 | 3 | 3 | 3 | 3 | 3 | 6 |
| Example 25 | Xanthene 5 | Within molecule | B1/B2 | m-1 | I-1 | 0.1 | 0.01 | 0.01 | 0.03 | 3 | 6 | 3 | 3 | 3 | 6 |
| Example 26 | Xanthene 5 | Within molecule | B1/B2 | m-1 | I-1 | 0.5 | 0.01 | 0.01 | 0.03 | 4 | 6 | 3 | 3 | 3 | 6 |
| Example 27 | Xanthene 5 | Within molecule | B1/B2 | m-1 | I-1 | 1 | 0.01 | 0.01 | 0.03 | 5 | 6 | 3 | 3 | 3 | 6 |
| Example 28 | Xanthene 5 | Within molecule | B1/B2 | m-1 | I-1 | 1.5 | 0.01 | 0.01 | 0.03 | 5 | 6 | 3 | 3 | 3 | 6 |
| Example 29 | Xanthene 5 | Within molecule | B1/B2 | m-1 | I-1 | 2 | 0.01 | 0.01 | 0.03 | 4 | 6 | 3 | 3 | 3 | 6 |
| Example 30 | Xanthene 5 | Within molecule | B1/B2 | m-1 | I-1 | 3 | 0.01 | 0.01 | 0.03 | 3 | 3 | 3 | 3 | 3 | 6 |
| Example 31 | Xanthene 6 | Anionic polymer | B1/B2 | m-1 | I-1 | 0.1 | 0.01 | 0.01 | 0.03 | 3 | 3 | 3 | 3 | 3 | 6 |
| Example 32 | Xanthene 6 | Anionic polymer | B1/B2 | m-1 | I-1 | 0.5 | 0.01 | 0.01 | 0.03 | 4 | 3 | 3 | 3 | 3 | 6 |
| Example 33 | Xanthene 6 | Anionic polymer | B1/B2 | m-1 | I-1 | 1 | 0.01 | 0.01 | 0.03 | 4 | 3 | 3 | 3 | 3 | 6 |
| Example 34 | Xanthene 6 | Anionic polymer | B1/B2 | m-1 | I-1 | 1.5 | 0.01 | 0.01 | 0.03 | 5 | 3 | 3 | 3 | 3 | 6 |
| Example 35 | Xanthene 6 | Anionic polymer | B1/B2 | m-1 | I-1 | 2 | 0.01 | 0.01 | 0.03 | 4 | 3 | 3 | 3 | 3 | 6 |
| Example 36 | Xanthene 6 | Anionic polymer | B1/B2 | m-1 | I-1 | 3 | 0.01 | 0.01 | 0.03 | 3 | 3 | 3 | 3 | 3 | 6 |
| Example 37 | Xanthene 7 | Anionic polymer for xanthene | B1/B2 | m-1 | I-1 | 0.1 | 0.01 | 0.01 | 0.03 | 3 | 3 | 3 | 3 | 3 | 6 |
| Example 38 | Xanthene 7 | Anionic polymer for xanthene | B1/B2 | m-1 | I-1 | 0.5 | | 0.01 | 0.03 | 4 | 3 | 3 | 3 | 3 | 6 |
| Example 39 | Xanthene 7 | Anionic polymer for xanthene | B1/B2 | m-1 | | 1 | 0.01 | 0.01 | 0.03 | 4 | 3 | 3 | 3 | 3 | 6 |

TABLE 3-continued

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 40 | Xanthene 7 | Anionic polymer for xanthene | B1/B2 | m-1 | I-1 | 1.5 | 0.01 | 0.01 | 0.03 | 5 | 3 | 3 | 3 | 3 | 6 |

TABLE 4

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 41 | Xanthene 7 | Anionic polymer for xanthene | B1/B2 | m-1 | I-1 | 2 | 0.01 | 0.01 | 0.03 | 4 | 3 | 3 | 3 | 3 | 6 |
| Example 42 | Xanthene 7 | Anionic polymer for xanthene | B1/B2 | m-1 | I-1 | 3 | 0.01 | 0.01 | 0.03 | 3 | 3 | 3 | 3 | 3 | 6 |
| Example 43 | Xanthene 8 | Cationic polymer | B1/B2 | m-1 | I-1 | 0.1 | 0.01 | 0.01 | 0.03 | 3 | 3 | 3 | 3 | 3 | 6 |
| Example 44 | Xanthene 8 | Cationic polymer | B1/B2 | m-1 | I-1 | 0.5 | 0.01 | 0.01 | 0.03 | 4 | 3 | 3 | 3 | 3 | 6 |
| Example 45 | Xanthene 8 | Cationic polymer | B1/B2 | m-1 | I-1 | 1 | 0.01 | 0.01 | 0.03 | 4 | 3 | 3 | 3 | 3 | 6 |
| Example 46 | Xanthene 8 | Cationic polymer | B1/B2 | m-1 | I-1 | 1.5 | 0.01 | 0.01 | 0.03 | 5 | 3 | 3 | 3 | 3 | 6 |
| Example 47 | Xanthene 8 | Cationic polymer | B1/B2 | m-1 | I-1 | 2 | 0.01 | 0.01 | 0.03 | 4 | 3 | 3 | 3 | 3 | 6 |
| Example 48 | Xanthene 8 | Cationic polymer | B1/B2 | m-1 | I-1 | 3 | 0.01 | 0.01 | 0.03 | 3 | 3 | 3 | 3 | 3 | 6 |
| Example 49 | Xanthene 3 | a-10 | B1/B2 | m-1 | I-1 | 0.5 | 1 | 0.01 | 0.03 | 4 | 5 | 3 | 3 | 4 | 6 |
| Example 50 | Xanthene 3 | a-10 | B1/B2 | m-1 | I-1 | 0.5 | 5 | 0.01 | 0.03 | 4 | 5 | 3 | 3 | 5 | 6 |
| Example 51 | Xanthene 3 | a-10 | B1/B2 | m-1 | I-1 | 0.5 | 8 | 0.01 | 0.03 | 4 | 5 | 3 | 3 | 6 | 6 |
| Example 52 | Xanthene 3 | a-10 | B1/B2 | m-1 | I-1 | 0.5 | 10 | 0.01 | 0.03 | 4 | 5 | 3 | 3 | 5 | 6 |
| Example 53 | Xanthene 3 | a-10 | B1/B2 | m-1 | I-1 | 0.5 | 13 | 0.01 | 0.03 | 4 | 5 | 3 | 3 | 4 | 6 |
| Example 54 | Xanthene 3 | a-10 | B1/B2 | m-1 | I-1 | 0.5 | 0.01 | 1 | 0.03 | 4 | 5 | 4 | 3 | 3 | 6 |
| Example 55 | Xanthene 3 | a-10 | B1/B2 | m-1 | I-1 | 0.5 | 0.01 | 4 | 0.03 | 4 | 5 | 5 | 3 | 3 | 6 |
| Example 56 | Xanthene 3 | a-10 | B1/B2 | m-1 | I-1 | 0.5 | 0.01 | 7 | 0.03 | 4 | 5 | 6 | 3 | 3 | 6 |
| Example 57 | Xanthene 3 | a-10 | B1/B2 | m-1 | I-1 | 0.5 | 0.01 | 9 | 0.03 | 4 | 5 | 5 | 3 | 3 | 6 |

TABLE 4-continued

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 58 | Xanthene 3 | a-10 | B1/B2 | m-1 | I-1 | 0.5 | 0.01 | 11 | 0.03 | 4 | 5 | 4 | 3 | 3 | 6 |
| Example 59 | Xanthene 3 | a-10 | B1/B2 | m-1 | I-1 | 0.5 | 0.01 | 0.01 | 2 | 4 | 5 | 4 | 3 | 3 | 6 |
| Example 60 | Xanthene 3 | a-10 | B1/B2 | m-1 | I-1 | 0.5 | 0.01 | 0.01 | 4 | 4 | 5 | 5 | 3 | 3 | 6 |
| Example 61 | Xanthene 3 | a-10 | B1/B2 | m-1 | I-1 | 0.5 | 0.01 | 0.01 | 7 | 4 | 5 | 6 | 3 | 3 | 6 |
| Example 62 | Xanthene 3 | a-10 | B1/B2 | m-1 | I-1 | 0.5 | 0.01 | 0.01 | 9 | 4 | 5 | 5 | 3 | 3 | 6 |
| Example 63 | Xanthene 3 | a-10 | B1/B2 | m-1 | I-1 | 0.5 | 0.01 | 0.01 | 11 | 4 | 5 | 4 | 3 | 3 | 6 |
| Example 64 | Xanthene 5 | Within molecule | B1/B2 | m-1 | I-1 | 0.5 | 1 | 0.01 | 0.03 | 4 | 6 | 3 | 3 | 4 | 6 |
| Example 65 | Xanthene 5 | Within molecule | B1/B2 | m-1 | I-1 | 0.5 | 5 | 0.01 | 0.03 | 4 | 6 | 3 | 3 | 5 | 6 |
| Example 66 | Xanthene 5 | Within molecule | B1/B2 | m-1 | I-1 | 0.5 | 8 | 0.01 | 0.03 | 4 | 6 | 3 | 3 | 6 | 6 |
| Example 67 | Xanthene 5 | Within molecule | B1/B2 | m-1 | I-1 | 0.5 | 10 | 0.01 | 0.03 | 4 | 6 | 3 | 3 | 5 | 6 |
| Example 68 | Xanthene 5 | Within molecule | B1/B2 | m-1 | I-1 | 0.5 | 13 | 0.01 | 0.03 | 4 | 6 | 3 | 3 | 4 | 6 |
| Example 69 | Xanthene 5 | Within molecule | B1/B2 | m-1 | I-1 | 0.5 | 0.01 | 1 | 0.03 | 4 | 6 | 4 | 3 | 3 | 6 |
| Example 70 | Xanthene 5 | Within molecule | B1/B2 | m-1 | I-1 | 0.5 | 0.01 | 4 | 0.03 | 4 | 6 | 5 | 3 | 3 | 6 |
| Example 71 | Xanthene 5 | Within molecule | B1/B2 | m-1 | I-1 | 0.5 | 0.01 | 7 | 0.03 | 4 | 6 | 6 | 3 | 3 | 6 |
| Example 72 | Xanthene 5 | Within molecule | B1/B2 | m-1 | I-1 | 0.5 | 0.01 | 9 | 0.03 | 4 | 6 | 5 | 3 | 3 | 6 |
| Example 73 | Xanthene 5 | Within molecule | B1/B2 | m-1 | I-1 | 0.5 | 0.01 | 11 | 0.03 | 4 | 6 | 4 | 3 | 3 | 6 |
| Example 74 | Xanthene 5 | Within molecule | B1/B2 | m-1 | I-1 | 0.5 | 0.01 | 0.01 | 2 | 4 | 6 | 4 | 3 | 3 | 6 |
| Example 75 | Xanthene 5 | Within molecule | B1/B2 | m-1 | I-1 | 0.5 | 0.01 | 0.01 | 4 | 4 | 6 | 5 | 3 | 3 | 6 |
| Example 76 | Xanthene 5 | Within molecule | B1/B2 | m-1 | I-1 | 0.5 | 0.01 | 0.01 | 7 | 4 | 6 | 6 | 3 | 3 | 6 |
| Example 77 | Xanthene 5 | Within molecule | B1/B2 | m-1 | I-1 | 0.5 | 0.01 | 0.01 | 9 | 4 | 6 | 5 | 3 | 3 | 6 |

TABLE 4-continued

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Example 78 | Xanthene 5 | Within molecule | B1/B2 | m-1 | I-1 | 0.5 | 0.01 | 0.01 | 11 | 4 | 6 | 4 | 3 | 3 | 6 |
| Example 79 | Xanthene 5 | Within molecule | B1/B2 | m-1 | I-1 | 0.5 | 8 | 7 | 7 | | | | | | 6 |
| Example 80 | Xanthene 5 | Within molecule | B1 alone | m-1 | I-1 | 0.5 | 8 | 7 | 7 | | | | | | 5 |
| Example 81 | Xanthene 5 | Within molecule | B2 alone | m-1 | I-1 | 0.5 | 8 | 7 | 7 | | | | | | 5 |
| Example 82 | Xanthene 5 | Within molecule | B1/B2 | m-1 | I-2 | 0.5 | 8 | 7 | 7 | | | | | | 5 |
| Example 83 | Xanthene 5 | Within molecule | B1/B2 | m-1 | I-3 | 0.5 | 8 | 7 | 7 | | | | | | 4 |
| Example 84 | Xanthene 5 | Within molecule | B1/B2 | m-2 | I-1 | 0.5 | 8 | 7 | 7 | | | | | | 5 |
| Example 85 | Xanthene 5 | Within molecule | B1/B2 | m-3 | I-1 | 0.5 | 8 | 7 | 7 | | | | | | 4 |
| Example 86 | Xanthene 5 | Within molecule | B1/B2 | m-4 | I-1 | 0.5 | 8 | 7 | 7 | | | | | | 3 |
| Example 87 | Xanthene 5 | a-10 | B1/B2 | m-1 | I-1 | 1.5 | 8 | 7 | 7 | 5 | 5 | 6 | 6 | 6 | 6 |
| Example 88 | Xanthene 3 | a-10 | B1/B2 | m-1 | I-1 | 1 | 8 | 7 | 7 | 4 | 5 | 6 | 6 | 6 | 6 |
| Example 89 | Xanthene 3 | a-10 | B1/B2 | m-1 | I-1 | 2 | 8 | 7 | 7 | 4 | 5 | 6 | 6 | 6 | 6 |
| Example 90 | Xanthene 3 | a-10 | B1/B2 | m-1 | I-1 | 1.5 | 5 | 7 | 7 | 5 | 5 | 6 | 6 | 5 | 6 |
| Example 91 | Xanthene 3 | a-10 | B1/B2 | m-1 | I-1 | 1.5 | 10 | 7 | 7 | 5 | 5 | 6 | 6 | 5 | 6 |
| Example 92 | Xanthene 3 | a-10 | B1/B2 | m-1 | I-1 | 1.5 | 8 | 4 | 7 | 5 | 5 | 5 | 6 | 6 | 6 |
| Example 93 | Xanthene 3 | a-10 | B1/B2 | m-1 | I-1 | 1.5 | 8 | 9 | 7 | 5 | 5 | 5 | 6 | 6 | 6 |
| Example 94 | Xanthene 3 | a-10 | B1/B2 | m-1 | I-1 | 1.5 | 8 | 7 | 4 | 5 | 5 | 5 | 6 | 6 | 6 |
| Example 95 | Xanthene 3 | a-10 | B1/B2 | m-1 | I-1 | 1.5 | 8 | 7 | 9 | 5 | 5 | 5 | 6 | 6 | 6 |

TABLE 5

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Comparative Example 1 | Xanthene 1 | a-1 | B1/B2 | m-1 | I-1 | 0.008 | 0.01 | 0.01 | 0.03 | 2 | 4 | 3 | 3 | 3 | 6 |
| Comparative Example 2 | Xanthene 1 | a-1 | B1/B2 | m-1 | I-1 | 3.2 | 0.01 | 0.01 | 0.03 | 1 | 4 | 3 | 3 | 3 | 6 |
| Comparative Example 3 | Xanthene 2 | a-15 | B1/B2 | m-1 | I-1 | 0.008 | 0.01 | 0.01 | 0.03 | 2 | 3 | 3 | 3 | 3 | 6 |
| Comparative Example 4 | Xanthene 2 | a-15 | B1/B2 | m-1 | I-1 | 3.2 | 0.01 | 0.01 | 0.03 | 1 | 3 | 3 | 3 | 3 | 6 |
| Comparative Example 5 | Xanthene 3 | a-10 | B1/B2 | m-1 | I-1 | 0.008 | 0.01 | 0.01 | 0.03 | 2 | 5 | 3 | 3 | 3 | 6 |
| Comparative Example 6 | Xanthene 3 | a-10 | B1/B2 | m-1 | I-1 | 3.2 | 0.01 | 0.01 | 0.03 | 1 | 5 | 3 | 3 | 3 | 6 |
| Comparative Example 7 | Xanthene 4 | a-17 | B1/B2 | m-1 | I-1 | 0.008 | 0.01 | 0.01 | 0.03 | 2 | 3 | 3 | 3 | 3 | 6 |
| Comparative Example 8 | Xanthene 4 | a-17 | B1/B2 | m-1 | I-1 | 3.2 | 0.01 | 0.01 | 0.03 | 1 | 3 | 3 | 3 | 3 | 6 |
| Comparative Example 9 | Xanthene 5 | Within molecule | B1/B2 | m-1 | I-1 | 0.008 | 0.01 | 0.01 | 0.03 | 2 | 6 | 3 | 3 | 3 | 6 |
| Comparative Example 10 | Xanthene 5 | Within molecule | B1/B2 | m-1 | I-1 | 3.2 | 0.01 | 0.01 | 0.03 | 2 | 6 | 3 | 3 | 3 | 6 |
| Comparative Example 11 | Xanthene 6 | Anionic polymer | B1/B2 | m-1 | I-1 | 0.008 | 0.01 | 0.01 | 0.03 | 2 | 3 | 3 | 3 | 3 | 6 |
| Comparative Example 12 | Xanthene 6 | Anionic polymer | B1/B2 | m-1 | I-1 | 3.2 | 0.01 | 0.01 | 0.03 | 2 | 3 | 3 | 3 | 3 | 6 |
| Comparative Example 13 | Xanthene 7 | Anionic polymer for xanthene | B1/B2 | m-1 | I-1 | 0.008 | 0.01 | 0.01 | 0.03 | 2 | 3 | 3 | 3 | 3 | 6 |
| Comparative Example 14 | Xanthene 7 | Anionic polymer for xanthene | B1/B2 | m-1 | I-1 | 3.2 | 0.01 | 0.01 | 0.03 | 2 | 3 | 3 | 3 | 3 | 6 |
| Comparative Example 15 | Xanthene 8 | Cationic polymer | B1/B2 | m-1 | I-1 | 0.008 | 0.01 | 0.01 | 0.03 | 2 | 3 | 3 | 3 | 3 | 6 |

TABLE 5-continued

| | Dye multimer | Anionic moiety or cationic moiety | Alkali-soluble resin | Curable compound | Photopolymerization initiator | Content (% by mass) of water | Concentration (ppm) of toluene in composition | Concentration (ppm) of Na ions in composition | Concentration (ppm) of K ions in composition | (1) Light fastness when placed under environment having low oxygen concentration for long period of time | (2) Stability after elapse of long period of time | (3) Defects after elapse of long period of time | (4) Long-term humid resistance | (5) Being placed for extended long period of time | (6) Long-term thermal cycling |
|---|---|---|---|---|---|---|---|---|---|---|---|---|---|---|---|
| Comparative Example 16 | Xanthene 8 | Cationic polymer | B1/B2 | m-1 | I-1 | 3.2 | 0.01 | 0.01 | 0.03 | 2 | 3 | 3 | 3 | 3 | 6 |

As shown in Tables above, it could be seen that good light fastness can be maintained even when placed under an environment having a low oxygen concentration for a long period of time by the content of water in the colored composition of 0.01% by mass to 3.0% by mass.

It could also be seen that it is more difficult to generate impurities in the case where placed under an environment having a low temperature for a long period of time by at least one of the concentration of the sodium ion and the concentration of the potassium ion in the colored composition of 0.001 ppm to 11 ppm.

It could also be seen that the uniformity of the line width of the colored pattern can be maintained better even when placed for an extended long period of time by the concentration of toluene in the colored composition of 0.01 ppm to 13 ppm.

It could also be seen that in Examples 79 to 86, the results of any other evaluations than the evaluation of the long-term thermal cycling test are good.

What is claimed is:

1. A colored composition comprising a dye multimer (A) and a solvent (B), wherein
    the dye multimer (A) has a partial structure derived from a xanthene dye having a cationic moiety, and also has an anionic moiety, and
    the content of water in the colored composition is 0.01% by mass to 3.0% by mass.

2. The colored composition according to claim 1, wherein the concentration of toluene in the colored composition is 0.01 ppm to 13 ppm.

3. The colored composition according to claim 1, wherein at least one of the concentration of the sodium ion and the concentration of the potassium ion in the colored composition is 0.001 ppm to 11 ppm.

4. The colored composition according to claim 1, wherein the anionic moiety is a weakly nucleophilic anionic moiety.

5. The colored composition according to claim 1, further comprising a phthalocyanine pigment.

6. The colored composition according to claim 1, further comprising a photopolymerization initiator.

7. The colored composition according to claim 1, further comprising a curable compound.

8. The colored composition according to claim 1, which is used for forming a colored layer of a color filter.

9. A cured film fanned by curing the colored composition according to claim 1.

10. A color filter having the cured film according to claim 9.

11. A solid-state image sensor comprising the color filter according to claim 10.

12. An image display device comprising the color filter according to claim 10.

13. A method for producing a color filter, comprising:
    applying the colored composition according to claim 1 onto a support to form a colored composition layer;
    patternwise exposing the colored composition layer; and
    removing an unexposed area by development to form a colored pattern.

14. A method for producing a color filter, comprising:
    applying the colored composition according to claim 1 onto a support to form a colored composition layer, followed by curing, to form a colored layer;
    forming a photoresist layer on the colored layer;
    patterning the photoresist layer by exposure and development to obtain a resist pattern; and
    dry-etching the colored layer using the resist pattern as an etching mask.

* * * * *